United States Patent
Morishita

(10) Patent No.: US 6,519,191 B1
(45) Date of Patent: Feb. 11, 2003

(54) SEMICONDUCTOR INTEGRATED CIRCUIT DEVICE HAVING AN INTERNAL VOLTAGE GENERATION CIRCUIT LAYOUT EASILY ADAPTABLE TO CHANGE IN SPECIFICATION

(75) Inventor: Fukashi Morishita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/696,011

(22) Filed: Oct. 26, 2000

(30) Foreign Application Priority Data

Oct. 28, 1999 (JP) ............................................ 11-306572

(51) Int. Cl.$^7$ ................................................ G11C 7/00
(52) U.S. Cl. ........................... 365/189.09; 365/189.11; 365/226; 365/230.03
(58) Field of Search .................... 365/189.09, 189.11, 365/226, 230.03, 189.01, 230.01

(56) References Cited

U.S. PATENT DOCUMENTS

| | | | | |
|---|---|---|---|---|
| 5,075,572 A | * | 12/1991 | Poteet et al. | 327/536 |
| 5,943,285 A | * | 8/1999 | Kohno | 365/230.03 |
| 5,969,981 A | * | 10/1999 | Kono | 365/145 |
| 6,288,967 B2 | * | 9/2001 | Fujisawa et al. | 365/226 |

FOREIGN PATENT DOCUMENTS

| | | |
|---|---|---|
| JP | 8-204161 | 8/1996 |
| JP | 11-96766 | 4/1999 |

* cited by examiner

*Primary Examiner*—Hoai Ho
(74) *Attorney, Agent, or Firm*—McDermott, Will & Emery

(57) ABSTRACT

An active down converting supplying a large current consumed when a memory array is active, and a Vpp pump for generating a boosted voltage are configured into active units as cells. A required number of active units are provided depending on the array structure and the operation conditions. A power supply circuit can be redesigned and/or rearranged within a short period for adaptation to change in internal structure for the memory array.

20 Claims, 28 Drawing Sheets

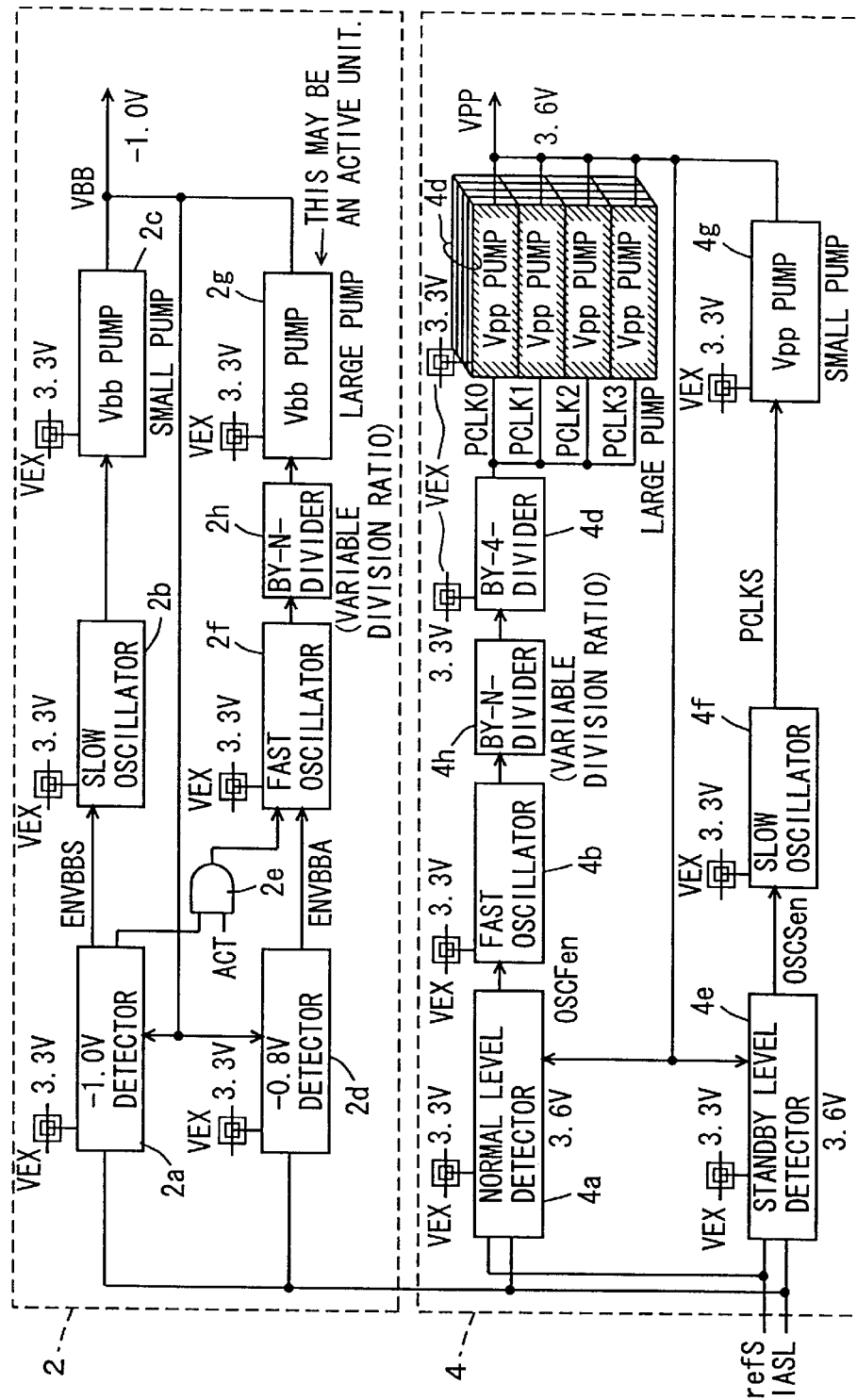
F I G. 30

(i): NORMAL CHARACTERISTICS (ii): CHARACTERISTICS WITH 1/32 ARRAY (iii): NECESSARY CHARACTERISTICS WHEN Vbb WELL IS USED AS POWER SUPPLY (iv): CHARACTERISTICS WITH 1/32 ARRAY UNDER CONDITIONS OF (iii)

(v): CHARACTERISTICS WITH 1/32 ARRAY AND DIVIDED-BY-32 PUMP UNDER CONDITIONS OF (iii)

SEMICONDUCTOR INTEGRATED CIRCUIT DEVICE HAVING AN INTERNAL VOLTAGE GENERATION CIRCUIT LAYOUT EASILY ADAPTABLE TO CHANGE IN SPECIFICATION

BACKGROUND OF THE INVENTION

1. Field of the Invention

The present invention relates to a semiconductor integrated circuit device, and particularly to a layout of an internal voltage generating circuit for generating an internal voltage utilized in the semiconductor integrated circuit device. More particularly, the invention relates to the structure of the internal voltage generating circuit suitable to a power supply for a Dynamic Random Access Memory (DRAM) included in a logic-merged memory, in which a semiconductor memory such as a DRAM and a logic are integrated on a single chip.

2. Description of the Background Art

FIG. 47 schematically shows a chip layout of a conventional semiconductor integrated circuit device. In FIG. 47, a semiconductor integrated circuit device 900 includes pads 902 arranged on a periphery of a chip, a DRAM macro 903, and first, second and third merged circuits 905, 907 and 909 arranged in a region surrounded by pads 902. Each of these first to third merged circuits 905, 907 and 909 is formed of, e.g., a logic performing predetermined processing, a Static Random Access Memory (SRAM), a flash memory or the like.

In semiconductor integrated circuit device 900, a hierarchical design method is used. DRAM macro 903, and first to third merged circuits 905, 907 and 909 are designed as macros, respectively, and these macros are arranged on the chip.

DRAM macro 903 has a storage capacity of 32 Mbits, and the input/output data bits are 256 bits (256 I/Os).

With advance of the semiconductor technology, it is now possible to form a logic and a DRAM on a single chip. The DRAM and the logic formed on the same ship are connected merely via internal interconnection lines of small load. Therefore, a data transfer rate between the logic and the DRAM can be made high. Further, the internal interconnection pitch is not affected by a pitch of pads 902, and the internal data bus can have a large bit width so that the band width of data transfer can be increased.

In semiconductor integrated circuit device 900 shown, e.g., in FIG. 47 referred to as a "logic-merged DRAM" hereinafter, the contents of processing to be performed by a logic (e.g., first merged circuit 905) changes depending on the application, an therefore the memory capacity required by this logic (e.g., first merged circuit 905) changes. Accordingly, it is necessary to develop a core chip serving as a base, and memories (DRAM macros 903) having storage capacities according to the individual applications must be developed based on the core chip within a short time period.

For implementing the memory arrays having different storage capacities within a short time period, the following approach is most effective: the layouts of the repetition circuits such as the memory cells and associated direct control circuit (array circuit), in which the circuits of the same configuration are repeatedly arranged, such as sense amplifier and address decode circuit, are individually cellulated in advance, and respective cells are arranged in accordance with a practically required storage capacity. Particularly, in the recent years, a CAD (Computer Aided Design) tool such as a module generator, which can automatically perform such arrangement, has been developed. Further, as for other control circuits in the DRAM macro, it is now possible to perform automatic layout and interconnection in accordance with a floor plan similarly to usual logics, so that the layout period can be shortened with less persons.

In DRAMs, internal voltages at various voltage levels are used.

FIG. 48 schematically shows a structure of a circuit generating an internal voltage included in DRAM macro 903. In FIG. 48, internal voltage generating circuitry (power supply circuit) for the DRAM includes an internal power supply circuit 912 for producing an array power supply voltage VCCS from external power supply voltage VEX, an intermediate voltage generating circuit 914 receiving array power supply voltage VCCS to produce intermediate voltages VCP and VBL, and a pump voltage generating circuit 916 receiving external power supply voltage VEX from external power supply node 910, for performing, e.g., a charge pump operation to produce a boosted voltage VPP and a negative substrate bias voltage VBB.

FIG. 49 shows a structure of an array of the DRAM. In FIG. 49, the memory array of the DRAM includes memory cells MC arranged in rows and columns, word lines WL arranged for the respective memory cell rows. Bit line pairs BL and /BL are arranged corresponding to the columns of memory cells MC, respectively. Memory cell MC includes a capacitor MQ for storing information, and an access transistor MT for connecting memory capacitor MQ to bit line BL (or /BL) in response to the potential on word line WL.

Bit line pair BL and /BL is provided with a bit line equalize circuit BEQ for precharging bit lines BL and /BL to intermediate voltage VBL level when made active, and a sense amplifier circuit SA for transmitting array power supply voltage VCCS onto bit line at a higher potential of paired bit lines BL and /BL when made active.

Word line WL is driven to boosted potential VPP level when selected. Substrate bias voltage VBB is applied to a back gate of access transistor MT. Intermediate voltage VCP is applied to one electrode (cell plate electrode) of memory cell capacitor MQ.

As shown in FIGS. 48 and 49, a power supply interconnection line of a large width for supplying an array power supply voltage as well as voltage transmission lines of relatively large widths for transmitting internal voltages VCP, VBL, VPP and VBB are disposed in a portion for generating internal voltages for the DRAM. In the memory array of DRAM, signal lines are set to various voltage levels.

Internal power supply circuit 912, intermediate voltage generating circuit 914 and pump voltage generating circuit 916 produce voltages at required levels in accordance with a reference voltage or a reference current. These reference voltage and reference current are always consumed after power-on. For reducing the power consumption, the circuit producing the reference voltage as well as the circuits supplied with the reference voltage are configured to consume a sufficiently small current, and the current drive capabilities of these reference current supply circuit and reference voltage generating circuit are sufficiently reduced. Therefore, the signal lines transmitting the reference current and the reference voltage are driven by small driving capabilities, and therefore are susceptible to noises applied from other signal lines or the substrate.

For verifying the layout of the above internal voltage generating circuitry, EDA tools such as layout reference check (DRC: Design Rule Check) usually performed and match verification (LVS: Layout Versus Schematic) between schema (logical description of layout) and layout are employed, but stable operations are insufficiently ensured in many cases. Under present circumstances, therefore, it is required to perform, by a skilled engineer, a minute and precise layout work with sufficient measures taken against noises and sufficient margins. In such a power supply circuit (internal voltage generating circuitry) layout, it is necessary to review or reconsider the power supply interconnections as well as the layout for achieving a sufficient immunity against noises and an optimum current supply capability when a floor plan changes in accordance with a storage capacity of the memory. This complicates the design, and impedes reduction in layout period.

For flexible conformance with various storage capacities, a method of utilizing a module structure is proposed by T. Watanabe et al., in "A Modular Architecture for a 6.4-Gbyte/s, 8-Mb DRAM-Integrated Media Chip", IEEE Journal of Solid State circuits, Vol. 32, No. 5, pp. 635–641, May 1997. Watanabe et al. handle an expandable bank, a main amplifier for data reading and a voltage generator as one macro. According to the structure of Watanabe et al., the voltage generator has a fixed structure independent of a storage capacity of the memory, and consideration is not given to change in the power supply circuit structure associated with change in I/O structure, refresh period and page size. In the case of utilizing the above macro, therefore, it is necessary to determine the current supply capability of the voltage generator based on the expected maximum current consumption of the macro. If the storage capacity is small, the voltage generator having the current drive capability exceeding the necessary capability may be used, leading to a problem that an unnecessarily large current is consumed.

A floor layout method in which a storage capacity is expandable is disclosed by T. Yabe et al., in "A Configurable DRAM Macro Design for 2112 Derivative Organizations, to be Synthesized Using a Memory Generator", ISSCC 98 Digest, pp. 72–73, February, 1988. Yabe et al. have disclosed an arrangement plan of power supply circuitry in the DRAM macro. However, one voltage generator is arranged for each reference array of 1 Mbit for supplying a necessary current to the corresponding 1-Mbit array. However, in each of the case where one bank has a storage capacity of 1 Mbit and the case where one bank has a storage capacity of 8 Mbit, the same number of word lines are activated in one bank so that the same amount of current is consumed in the array. In the case where one bank has 8-Mbit storage capacity, the voltage generators having the current supply capability which is eight times greater than the required current supply capability is used, because the voltage generator is provided for each block of 1 Mbits according to the structure of Yabe et al. This results in a large loss of area.

SUMMARY OF THE INVENTION

An object of the invention is to provide a semiconductor integrated circuit device including an internal voltage generating circuit (internal power supply circuit) easily adaptable to change in structure and/or operation condition.

Another object of the invention is to provide a logic-merged memory with an internal voltage generating circuit easily adaptable to change in storage capacity and/or operation condition.

Still another object of the invention is to provide a structure and an arrangement structure of layout of a power supply circuit which allow easy and short time re-design/rearrangement of a power supply related circuitry conventionally difficult in re-designing in a short period with the optimum layout area and the optimum capability.

Briefly, according to a semiconductor integrated circuit device of the invention, for an internal power supply circuit generating an internal voltage used by an internal circuit, a circuit required to supply a large amount of current when the internal circuit operates is formed into a cell with reference (basic) capability as an active unit. The active units of a required number are arranged depending on a magnitude of the current consumption of the internal circuit.

More specifically, the semiconductor integrated circuit device according to the invention includes an internal circuit for implementing a predetermined function, and a power supply circuit having a capability of supplying to the internal circuit a current consumed by the internal circuit when the internal circuit is active, and supplying a predetermined voltage to the internal circuit. The power supply circuit includes active units of a number corresponding to the current consumption capability of the internal circuit, and the active unit has a layout to have a predetermined current supply capability, is formed into a cell, and generates the predetermined voltage.

The internal voltage generating circuit having the reference capability is formed into a cell as an active unit and capability of the predetermined voltage generating circuit can be optimized by arranging the active units of the required number depending on the consumed current amount of the internal circuit. Further, the area loss does not occur.

It is merely necessary to arrange the cellulated active units, and re-design and re-arrangement of the predetermined voltage generating circuit (power supply circuit) can be performed easily within a short time period without requiring entire redesigning of the predetermined voltage generating circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 schematically shows a structure of a main portion of a power supply circuit according to a second embodiment of the invention;

DESCRIPTION OF THE PREFERRED EMBODIMENTS

First Embodiment

Figure 1:
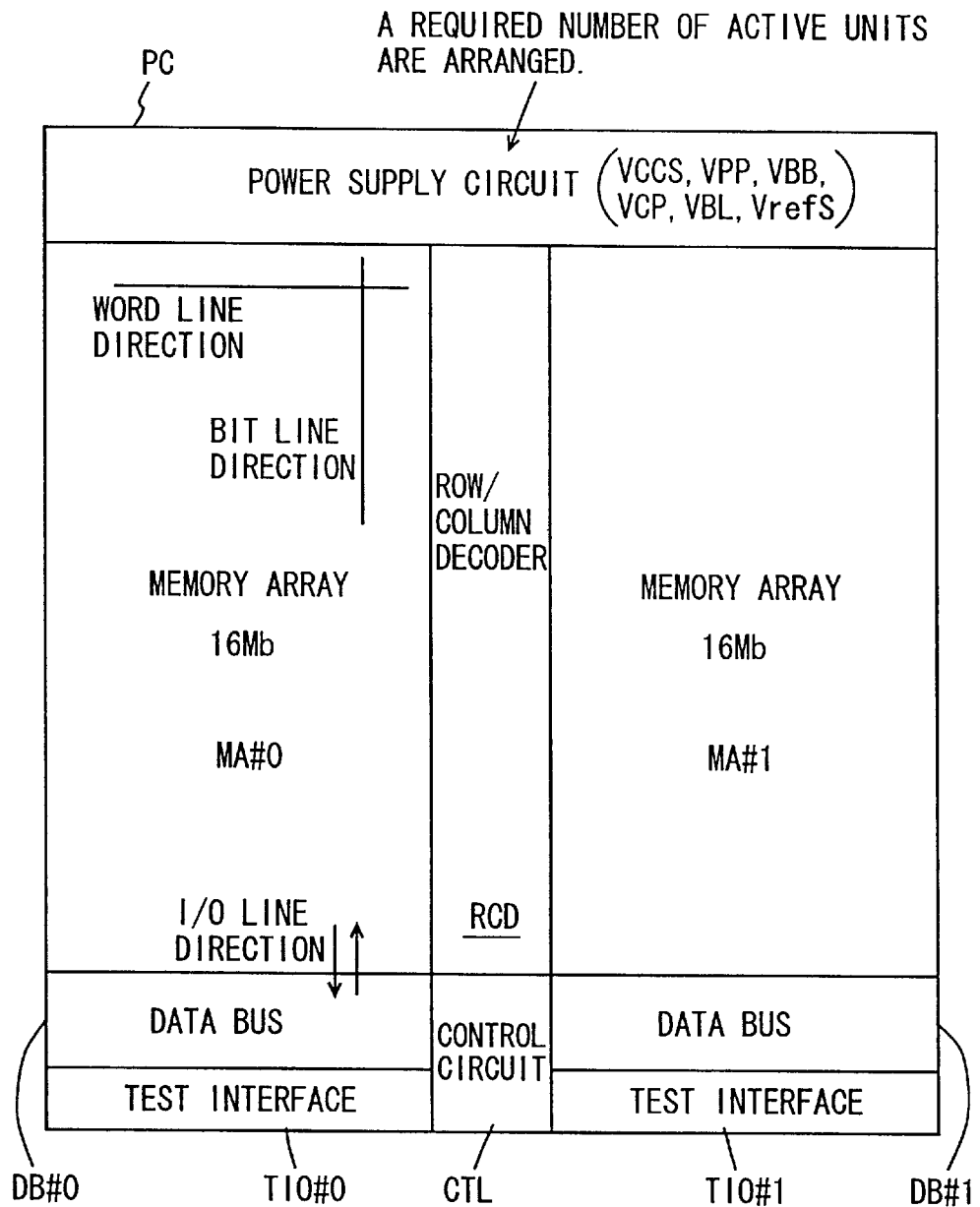
FIG. 1 schematically shows a whole structure of a DRAM macro according to a first embodiment of the invention.

FIG. 1 schematically shows a structure of a DRAM macro according to the invention. In FIG. 1, a DRAM macro includes memory arrays MA#0 and MA#1 each having a storage capacity of 16 Mbits, a row/column decoder RCD arranged in a regions between memory arrays MA#0 and MA#1 for selecting memory cell rows and memory cell columns in memory arrays MA#0 and MA#1, data buses DB#0 and DB#1 for transmitting data to and from the selected columns in memory arrays MA#0 and MA#1, test interfaces TIO#0 and TIO#1 receiving test address signals and test data, and a power supply circuit PC for supplying necessary voltages to memory arrays MA#0 and MA#1, row/column decoder RCD and a control circuit CTL controlling various kinds of operation.

Test interfaces TIO#0 and TIO#1 are provided for the purpose of performing a test on the DRAM macro alone even on a chip in the case where a logic-merged memory is formed on the chip, and the DRAM is accessed via the logic circuit.

Data buses DB#0 and DB#1 are provided with preamplifiers for data reading, write drivers for data writing, data transfer circuits and others.

In each of memory arrays MA#0 and MA#1, memory cells are arranged in rows and columns. A power supply circuit PC is arranged on one side, in the bit line direction (I/O line direction), of memory arrays MA#0 and MA#1. Power supply circuit PC includes a negative voltage generating circuit for generating a negative voltage VBB used in the memory array, an array voltage generating circuit for generating an array voltage VCCS defining H-level data in memory cells, a reference voltage generating circuit for generating a reference voltage used for generating the array voltage, an intermediate voltage generating circuit generating intermediate voltages (it line precharge voltage VBL and cell plate voltage VCP) used upon holding data, and a boosted voltage generating circuit generating a word line driving boosted voltage VPP required for writing H-level data into the memory cells.

Power supply circuit PC may be configured to supply internal voltage VCCP, which is used in control circuit CTL, by down-converting the external power supply voltage. In this case, a negative voltage VBB is supplied as a substrate bias voltage to substrate regions (P-wells) for arranging memory cells in memory arrays MA#0 and MA#1. The P-wells in the substrate regions of power supply circuit PC and control circuit CTL are fixed to the level of ground voltage GND, to ensure fast operation.

An internal structure of power supply circuit PC is changed depending on the storage capacities and operation conditions (e.g., refresh period) of memory arrays MA#0 and MA#1. Power supply circuit PC includes units each laid out to have predetermined basic capabilities as cells for generating respective voltages. When the memory cell select operation is performed in memory arrays MA#0 and MA#1, large currents are used for some kinds of voltages. More specifically, array voltage VCCS is consumed to a large extent due to charge/discharge of the bit lines during the sense amplifier operation, and boosted voltage VPP is used to a large extent during the word line selection. The layout particularly for these voltages is designed to have a basic capability and cellulated as the active unit in advance. A necessary number of active units are arranged in power supply circuit PC.

In general, the consumed current of boosted voltage VPP and array voltage VCCS depend on the number of word lines activated simultaneously and the number of sense amplifiers activated correspondingly. When changes occur in storage capacity of the array, band structure, I/O structure, page size (i.e., the number of memory cell data latched by sense amplifiers in one activated operation of the row-related circuits) and the refresh cycle (i.e., the cycle required for simultaneously activating a plurality of word lines and activating all the word lines for refreshing), changes necessarily occur in amounts of the currents consumed in these voltages. In the prior art, these changes in structure require restructuring of the floor plan of the power supply circuit, e.g., through the power supply line and cell arrangements, and therefore increase a time required for chip restructuring. However, these changes in structure occur only to a limited extent and only by integer times in many cases. For example, the page size changes n times (n: natural number) or 1/n times (generally, n=1, 2or 4 at most).

Accordingly, changes in current consumption take regular discrete values so that efficient arrangement of the power supply related circuits can be achieved. Thus, the layout is prepared in advance as a unit circuit (cell: active unit) serving as the base, and a plurality of such unit circuits may be combined to form an active unit group required for the chip, and the currents optimum for the respective structures are supplied.

Figure 2:
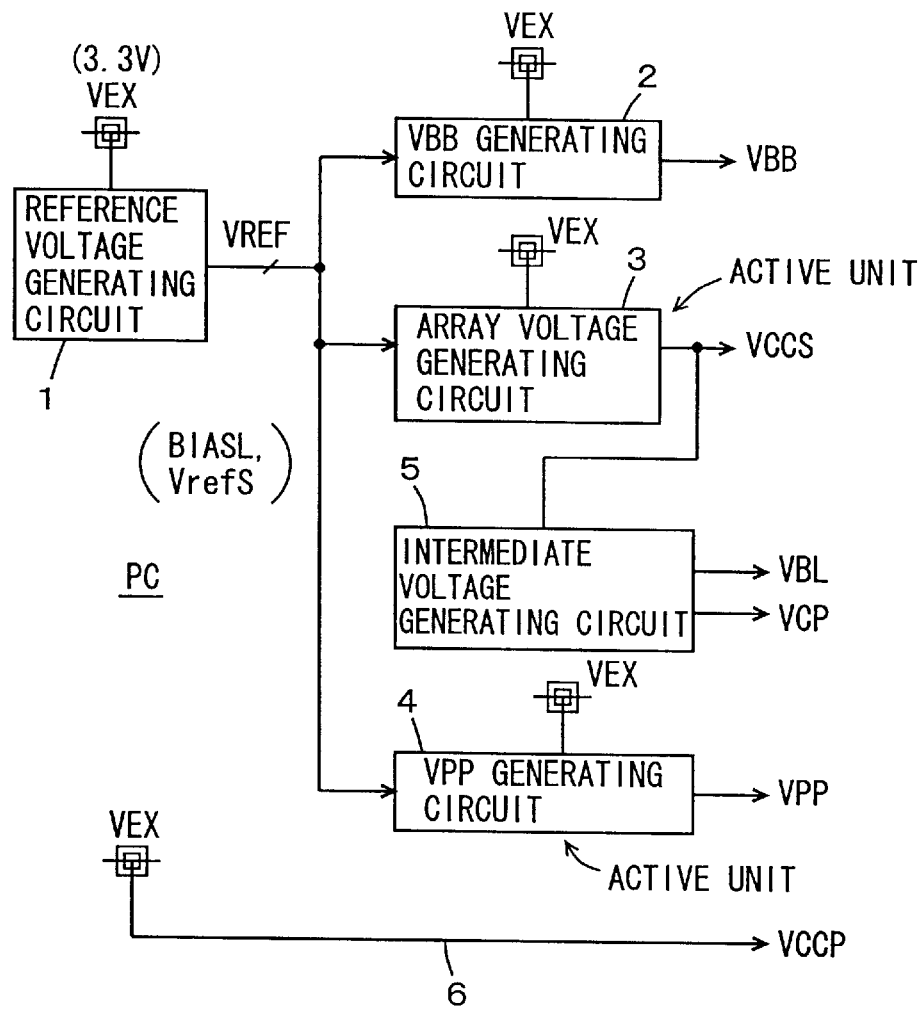
FIG. 2 schematically shows a structure of a power supply circuit shown in FIG. 1.

FIG. 2 schematically shows a structure of power supply circuit PC shown in FIG. 1. In FIG. 2, power supply circuit PC includes a reference voltage generating circuit 1 for generating, from external power supply voltage VEX, a reference voltage VREF (BIASL, VrefS) independent of external power supply voltage VEX, a VBB generating circuit 2 using external power supply voltage as one operation power supply voltages for generating a negative voltage VBB at a predetermined voltage level (−1.0 V) in accordance with reference voltage VREF supplied from reference voltage generating circuit 1, an array voltage generating circuit 3 for producing an array voltage VCCS at a voltage level (2.0 V) determined by reference voltage VREF from external power supply voltage VEX in accordance with reference voltage VREF, a VPP generating circuit 4 receiving external power supply voltage VEX as one operation power supply voltage, for generating boosted potential VPP at a predetermined voltage level (3.6 V) in accordance with reference voltage VREF, an intermediate voltage generating circuit 5 for producing intermediate voltages VBL and VCP at a predetermined intermediate voltage (VCCS/2) level in accordance with array voltage VCCS, and a peripheral circuit power supply line 6 for transmitting external power supply voltage VEX as power supply voltage VCCP for peripheral circuitry.

Negative voltage VBB supplied from VBB generating circuit 2 is applied, as a bias voltage, to P-wells (substrate regions) on which memory arrays MA#0 and MA#1 shown in FIG. 1 are formed. Array voltage VCCS supplied from array voltage generating circuit 3 is used by sense amplifier circuits (not shown) for sensing and amplifying the memory cell data of memory arrays MA#0 and MA#1 shown in FIG. 1. Boosted voltage VPP supplied from VPP generating circuit 4 is transmitted onto a selected word line via a row decoder included in row/column decoder RCD shown in FIG. 1.

Intermediate voltages VBL and VCP supplied from intermediate voltage generating circuit 5 are utilized as a voltage for precharging the bit lines and a cell plate voltage of the memory cell capacitor.

Peripheral power supply voltage VCCP on peripheral circuit power supply line 6 is supplied, as one operation power supply voltage, to control circuit CTL and row/column decoder RCD shown in FIG. 1 and others.

Reference voltage generating circuit 1 generates a signal having a current value made as small as possible, e.g., 1 $\mu$A for reducing power consumption during standby. Reference voltage VREF generated by reference voltage generating circuit 1 is merely supplied, as a comparison reference voltage or a bias voltage, to a gate of a MOS transistor (insulated gate field effect transistor) in each of VBB generating circuit 2, array voltage generating circuit 3 and VPP generating circuit 4. A large current drive capability is not required, and the current value of the signal line transmitting reference voltage VREF is extremely small, and therefore is most sensitive to noises. In view of stability of the whole operation of the power supply circuit, it is not desirable to change the relative internal arrangement and on-chip positions of the components (MOS transistors) of the reference voltage generating circuit 1 generating such noise-sensitive signals, because such change may impede a noise immunity.

Array voltage VCCS supplied from array voltage generating circuit 3 is consumed during the bit line charging and discharging operation (sense operation) of memory arrays MA#0 and MA#1, and boosted voltage VPP supplied from VPP generating circuit 4 is consumed during the word line selecting operation. Accordingly, the current supply capabilities required in array voltage generating circuit 3 and VPP generating circuit 4 depend on the storage capacity or operation conditions. The portions generating these voltages are formed into active unit, have a fixed layout as a unit cell having a basic capability. The signals supplied to the active unit are all activating signals for activating the active unit, except for a part of reference voltages.

Each of array voltage generating circuit 3 and VPP generating circuit 4 consumes external power supply voltage VEX as one operation power supply voltage. The pump circuit itself for generating boosted voltage VPP as well as a circuit (VDC) itself comparing the reference voltage (VrefS) with array power supply voltage VCCS for controlling an array voltage level in array voltage generating circuit 3 are driven with sufficiently large currents, and have high stability against noises. In view of these factors, the active unit that is required to supply a large current when the memory array is active, is arranged separately from other power supply control circuits, so that the internal voltage generating circuit included in internal power supply circuit may be arranged optimumly in accordance with change in array structure of the DRAM.

Negative voltage VBB supplied from VBB generating circuit 2 is utilized for supplying a bias voltage to the substrate region (P-well) of the memory array, and intermediate voltages VBL and VCP supplied from intermediate voltage generating circuit 5 are utilized for supplying a bit line precharge voltage and a cell plate voltage of the memory cell capacitor. These voltages VBB, VBL and VCP are smaller in power consumption than array voltage VCCS and boosted voltage VPP. Since VBB generating circuit 2 and intermediate voltage generating circuit 5 are not required to have large current supply capabilities, their layout sizes are made small. Further, a stabilizing capacitor of a large capacitance value occurs parasitically on each voltage node in these circuits, and the potential change during operation of the circuitry is small (e.g., PN junction between the well and the substrate in the substrate region of the memory array has an extremely large capacitance). Therefore, the layouts of these circuits are standardized such that, in any array structure, VBB generating circuit 2 and intermediate voltage generating circuit 5 can have current supply capabilities satisfying the capabilities required for the maximum current consumption of the array. Even in this case, the area hardly increases, and reduction in stability, which may be caused by reduction in storage capacity of the memory array, hardly occurs because the stabilizing capacitance parasitically associated with each voltage node is inherently large, and no problem is caused.

In the structure of power supply circuit PC shown in FIG. 2, external power supply voltage VEX is transmitted via peripheral circuit power supply line 6 as peripheral power supply voltage VCCP. However, an internal voltage generating circuit (including active unit) having a structure similar to array voltage generating circuit 3 may be used for supplying peripheral power supply voltage VCCP.

Figure 3:
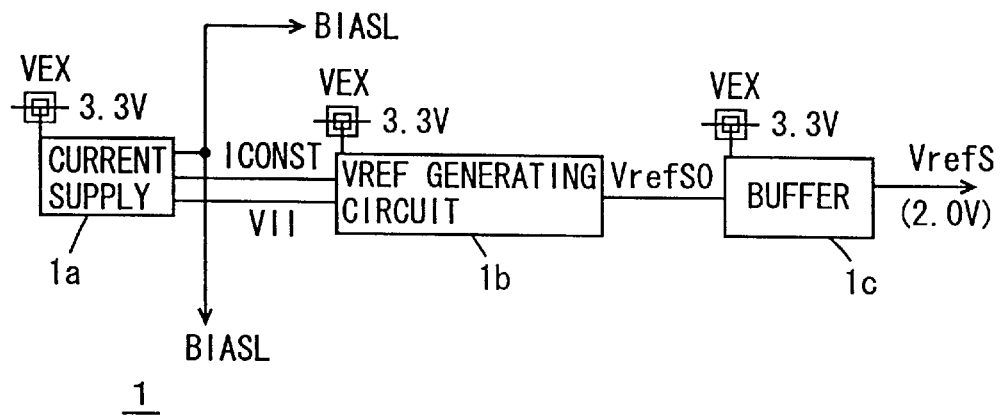
FIG. 3 schematically shows a structure of a reference voltage generating circuit shown in FIG. 2.

FIG. 3 schematically shows a structure of reference voltage generating circuit 1 shown in FIG. 2. In FIG. 3, reference voltage generating circuit 1 includes a current source 1a receiving external power supply voltage VEX, e.g., of 3.3 V, to generate a constant current for generating bias voltages BIASL and ICONST from the constant current, and to filter external power supply voltage VEX for producing a power supply voltage VII at the level of external power supply voltage VEX. Reference voltage generating circuit 1 further includes a Vref generating circuit 1b for generating a reference voltage VrefS0 in accordance with bias voltage ICONST and constant power supply voltage VII supplied from current supply 1a, and a buffer 1c receiving external power supply voltage VEX as one operation power supply voltage to buffer reference voltage VrefS0 of a high impedance from Vref generating circuit 1b for producing a reference voltage VrefS of, e.g., 2.0 V. Buffer 1c has a relatively large current driving capability, and produces reference voltage VrefS capable of driving the gate capacitance of each internal voltage generating circuit in accordance with reference voltage VrefS0 of the high impedance.

Figure 4:
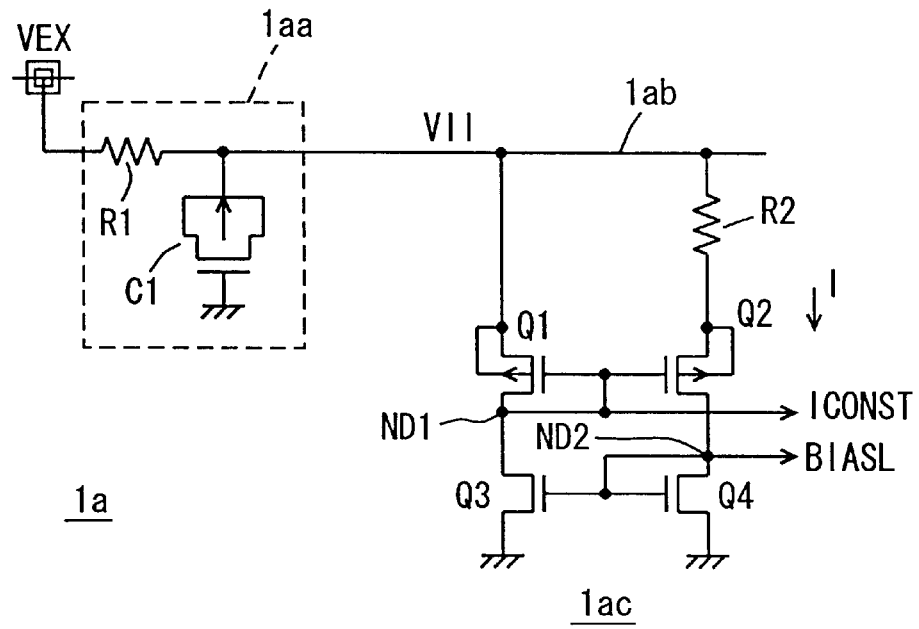
FIG. 4 shows by way of example a structure of a current supply shown in FIG. 3.

FIG. 4 shows by way of example the structure of current source 1a shown in FIG. 3. In FIG. 4, current source 1a includes a low-pass filter 1aa for filtering external power supply voltage VEX to produce stable power supply voltage VII on a power supply line 1ab, and a constant current circuit 1ac receiving power supply voltage VII on power supply line 1ab as one operation power supply voltage, to produce bias voltages ICONST and BIASL at the constant voltage level.

Low-pass filter 1aa includes a resistance element R1 coupled to an external power supply node, and an MOS capacitor C1 coupled to power supply line 1ab. MOS capacitor C1 is formed of a P-channel MOS transistor. In low-pass filter 1aa, resistance element R1 and MOS capacitor C1 effect filtering on external power supply voltage VEX for removing high-frequency noise components, and stable power supply voltage VII is produced from low-pass filter 1aa.

Constant current circuit 1ac includes a P-channel MOS transistor Q1 connected between a node ND1 and power supply line 1ab and having a gate connected to node ND1, an N-channel MOS transistor Q3 connected between node ND1 and the ground node and having a gate connected to a node ND2, a resistance element R2 of a high resistance coupled to power supply line 1ab, a P-channel MOS transistor Q2 connected between resistance element R2 and node ND2 and having a gate connected to node ND1, and an N-channel MOS transistor Q4 connected between node ND2 and the ground node and having a gate connected to node ND2.

Bias voltage ICONST for current restriction is outputted from node ND1, and bias voltage BIASL is outputted from node ND2.

MOS transistor Q2 has a ratio of a channel width to a channel length set about ten times as large as that of MOS transistor Q1. Accordingly, MOS transistor Q2 has a current drive capability sufficiently larger than MOS transistor Q1. MOS transistors Q3 and Q4 have the same current supply capabilities, and form a current mirror circuit.

P-channel MOS transistors Q1 and Q2 cause current flows corresponding to gate-source voltages VFS, respectively. MOS transistors Q3 and Q4 form a current mirror circuit so that currents of the same magnitude flow through MOS transistors Q3 and Q4. Accordingly, gate-source voltages VGS of MOS transistors Q1 and Q2 are different from each other. Thus, an absolute value VGS1 of the gate-source voltage of MOS transistor Q1 is larger than an absolute value VGS2 of the gate-source voltage of MOS transistor Q2. This difference in source voltage between MOS transistors Q1 and Q2 is caused by resistance element R2. Accordingly, a current I flowing through resistance element R2 can be expressed by the following equation:

$$I=(VGS1-VGS2)/R2$$

Resistance element R2 has a high resistance, and a current I flowing through constant current source 1ac has a small current value, e.g., of about 0.4 μA. Accordingly, bias voltages ICONST and BIASL are driven by a minute current, and therefore become sensitive to noises so that the positions in the power supply circuit are fixed.

Figure 5:
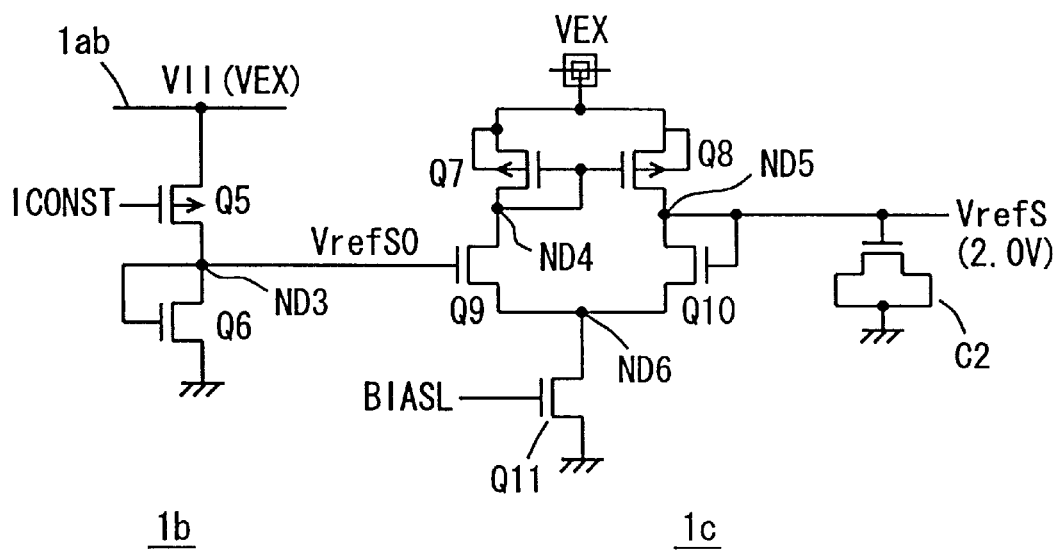
FIG. 5 shows structures of a reference voltage generating circuit and a buffer shown in FIG. 3.

FIG. 5 shows by way of example structures of Vref generating circuit 1b and buffer 1c shown in FIG. 3. In FIG. 5, Vref generating circuit 1b includes a P-channel MOS transistor Q5 connected between power supply line 1ab and a node ND3 and having a gate receiving bias voltage ICONST, and an N-channel MOS transistor Q6 connected between node ND3 and the ground node and having a gate connected to node ND3. MOS transistor Q5 forms a current mirror circuit together with MOS transistor Q1 of the constant current generating circuit shown in FIG. 4. Therefore, if MOS transistors Q1 and Q5 have the same size, current I flows through MOS transistor Q5. MOS transistor Q6 operates in a resistance mode, and converts current I supplied from MOS transistor Q5 into a voltage for producing reference voltage VrefS0. MOS transistor Q6 has an extremely high resistance value. MOS transistor Q5 supplies a minute current, and has a high channel resistance. Accordingly, reference voltage VrefS0 is a voltage of a high-impedance. This reference voltage VrefS0 of the high-impedance is buffered by buffer 1c to produce reference voltage VrefS supplied to the internal voltage generating circuits.

Buffer 1c includes a P-channel MOS transistor Q7 connected between the external power supply node and a node ND4 and having a gate connected to node ND4, a P-channel MOS transistor Q8 connected between the external power supply node and a node ND5 and having a gate connected to node ND4, an N-channel MOS transistor Q9 connected between nodes ND4 and ND6 and having a gate connected to node ND3, an N-channel MOS transistor Q10 connected between nodes ND5 and ND6 and having a gate connected to node ND5, and an N-channel MOS transistor Q11 connected between a node ND6 and the ground node and having a gate receiving bias voltage BIASL. The output node (node ND5) of buffer 1c is connected to MOS capacitor C2 for stabilizing reference voltage.

MOS transistor Q11 forms a current mirror circuit together with MOS transistor Q4 in constant current circuit 1ac shown in FIG. 4, and current I flows through MOS transistor Q11 provided that MOS transistors Q4 and Q11 have the same sizes. MOS transistors Q9 and Q10 form a differential stage for comparing reference voltages VrefS0 and VrefS. MOS transistors Q7 and Q8 form a current mirror circuit, and supply currents of the same magnitude if they have the same size. MOS transistor Q10 has a gate and a drain connected together, and functions as a current to voltage converting element for producing reference voltage VrefS by converting the current flowing through MOS transistors Q8 and 10 into voltage.

In buffer 1c, if reference voltage VrefS0 exceeds reference voltage VrefS, the current flowing through MOS transistor Q9 becomes greater than the current flowing through MOS transistor Q10 so that the voltage level on node ND5 rises (the current mirror circuit of MOS transistors Q7 and 8 supplies the currents of the same magnitude to MOS transistors Q9 and Q10). If reference voltage VrefS is higher than reference voltage VrefS0, the current flowing through MOS transistor Q9 becomes smaller than the current flowing through MOS transistor Q10 so that the current flowing through MOS transistor Q10 decreases, and the voltage level of reference voltage VrefS supplied from node ND5 lowers. Therefore, reference voltage VrefS is maintained at the same voltage level as reference voltage VrefS0. Reference voltage VrefS is stably maintained by a stabilizing capacitance C2.

By utilizing this buffer 1c, reference voltage VrefS is stably transmitted to the internal voltage generating circuits shown in FIG. 2 with a relatively large current supply capability. Even in the case of using buffer 1c, however, the current flowing through buffer 1c is small and equal to about 0.8 μA (MOS transistor Q11 has a ratio of channel width to a channel length set nearly two times larger than that of MOS transistor Q4). Therefore, reference voltage VrefS is also sensitive to noises, and circuits and signal lines transmitting reference voltage VrefS are fixedly arranged in advance (i.e., determined in advance in accordance with the maximum capacity of the memory array) independently of the structure of the memory array.

In FIG. 5, Vref generating circuit 1b may be supplied with external power supply voltage VEX instead of voltage VII. Bias voltage BIASL may be applied to a gate of MOS transistor Q6.

Figure 6A:
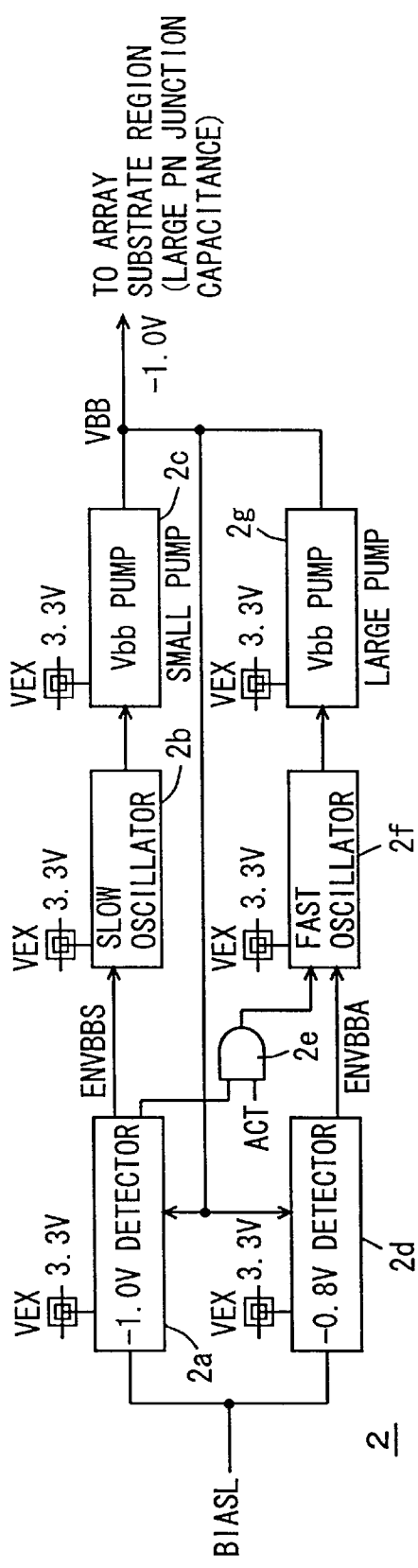
FIG. 6A shows a structure of a VBB generating circuit shown in FIG. 2.

FIG. 6A schematically shows a structure of VBB generating circuit 2 shown in FIG. 2. In FIG. 6, VBB generating circuit 2 includes a −1.0V detector 2a receiving external power supply voltage VEX as one operation power supply voltage for detecting the voltage level of negative voltage VBB based on bias voltage BIASL supplied from reference voltage generating circuit 1, a slow oscillator 2b selectively performing oscillation in accordance with an level detection signal ENVBSS received from −1.0 V detector 2a, a Vbb pump 2c performing a charge pump operation to produce negative voltage VBB in accordance with an oscillation signal from slow oscillator 2b, a −0.8V detector 2d for detecting the voltage level of negative voltage VBB based on bias voltage BIASL, an AND circuit 2e receiving an array activating signal ACT and the detection signal from −1.0V detector 2a, a fast oscillator 2f selectively performing oscillation in accordance with the output signal from AND circuit 2e and level detection signal ENVBBA of −0.8V detector 2d, and a Vbb pump 2g performing a charge pump operation to produce negative voltage VBB in accordance with an oscillation signal from fast oscillator 2f. In VBB generating circuit 2, external power supply voltage VEX is supplied to each circuit as one operation power supply voltage.

−1.0V detector 2a detects whether negative voltage VBB reaches the level of −1.0 V or not. −0.8V detector 2d detects whether negative voltage VBB reaches the level of −0.8 V. Array activating signal ACT is driven to the active state when a row access command is applied to instruct row selection in memory arrays MA#0 and MA#1 shown in FIG. 1 for driving a row to the selected state. While array activating signal ACT is active, circuits (e.g., row decoder, sense amplifier and others) related to the row selection in the DRAM macro are kept active.

Negative voltage VBB supplied from VBB generating circuit 2 is supplied to substrate regions (P-wells) of memory arrays MA#0 and MA#1 as described before. The P-well has a large area, and the junction capacitance has a large capacitance value so that large changes in potential do not occur during operation of the circuits, and the current consumption is small in contrast to the array voltage and the boosted voltage. Therefore, the components of VBB generating circuit 2 have reduced layout sizes.

When the substrate current flows in a circuit operation, the voltage level of negative voltage VBB may change. When array activating signal ACT is active, the output signal of AND circuit 2e is enabled to cause fast oscillator 2f to oscillate when negative voltage VBB reaches or exceeds the voltage level of −0.8 V. Thereby, Vbb pump 2g having a large charge supply capability operates to lower negative voltage VBB to or below a predetermined voltage level.

During standby, the substrate current does not flow, and negative voltage VBB is consumed merely due to a substrate leak current. Accordingly, Vbb pump 2c having a small charge supply capability is driven by the oscillation signal from slow oscillator 2b, to produce negative voltage VBB. The charge supply capability of Vbb pump 2c is proportional to a product of the capacitance value of the charge pump capacitor and the frequency of the oscillator. By utilizing slow and fast oscillators 2b and 2f, the charge supply capability of VBB generating circuit is changed for the standby and for the active state of the array. Detectors 2a and 2b detect different voltage levels, respectively. This is for the purpose of preventing such a situation that the substrate bias becomes unnecessarily deep due to an undershoot in the operation of Vbb pump 2g.

Figure 6B:
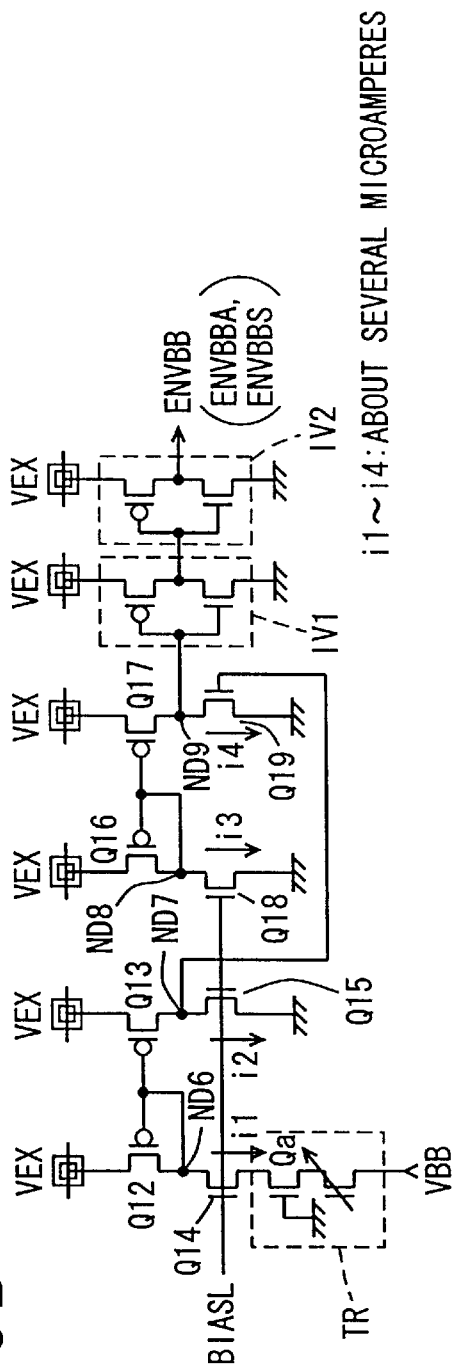
FIG. 6B shows by way of example a structure of a detector shown in FIG. 6A.

FIG. 6B shows by way of example the structures of −1.0V detector 2a and −0.8V detector 2d shown in FIG. 6A. These level detectors 2a and 2d have the same structure except for their voltage detection levels. FIG. 6B shows the structure of only one of the level detectors.

In FIG. 6B, the level detector includes a P-channel MOS transistor Q12 connected between the external power supply node and a node ND6 and having a gate connected to node ND6, an N-channel MOS transistor Q14 having a drain coupled to node ND6, a trimmable level detecting element TR connected between MOS transistor Q14 and the supply node of negative voltage VBB, a P-channel MOS transistor Q13 connected between the external power supply node and a node ND7 and having a gate connected to node ND6, and an N-channel MOS transistor Q15 connected between node ND7 and the ground node and having a gate receiving bias voltage BIASL. Trimmable level detecting element TR includes an N-channel MOS transistor Qa having a grounded gate to operate in a resistance mode, and an N-channel MOS transistor having a trimmable threshold voltage. By changing the threshold voltage of this trimmable MOS transistor, the voltage detection level of the level detector can be adjusted. The trimmable MOS transistor includes diode-connected N-channel MOS transistors, and has the number of the diodes changed (threshold voltage Vth is lowered when turned on diodes are reduced in number).

The level detector further includes a P-channel MOS transistor Q16 connected between the external power supply node and a node ND8 and having a gate connected to node ND8, an N-channel MOS transistor Q18 connected between node ND8 and the ground node and having a gate receiving bias voltage BIASL, a P-channel MOS transistor Q17 connected between the external power supply node and a node ND9 and having a gate connected to node ND8, an N-channel MOS transistor Q19 connected between node ND9 and the ground node and having a gate connected to node ND7, and cascaded two CMOS inverter circuits IV1 and IV2 for converting the voltage on node ND9 into the signal at the CMOS level with external power supply voltage VEX being one operation power supply voltage.

By applying bias voltage BIASL to MOS transistors Q14, Q15 and Q18, these MOS transistors Q14, Q15 and Q18 operate as constant current sources, and current values of currents i1, i2 and i3 are restricted to, e.g., a few microamperes. The response characteristics of the level detector depend on current values i1–i4. Then, operation of the level detector shown in FIG. 6B will be briefly described.

MOS transistors Q12 and Q13 form a current mirror circuit, and MOS transistors Q16 and Q17 form a current mirror circuit. In trimmable level detection element TR, the gate of MOS transistor Qa is connected to the ground node, and a programmed number of diode-connected MOS transistors with a trimmed threshold voltage are connected between MOS transistor Qa and the negative voltage supply node. MOS transistor Qa is turned on when a source potential lowers to or below the threshold voltage thereof. The source voltage of MOS transistor Qa depends on negative voltage VBB and the programmable elements (MOS transistors each having a programmed threshold voltage), and is equal to (VBB+VTH) where VTH is a sum of the threshold voltages of the programmable elements.

When negative voltage VBB is at the level equal to or lower than the predetermined voltage level, MOS transistor Qa is off, and does not flow current i1 therethrough, and node ND7 is held at the ground voltage level by MOS transistor Q15. In MOS transistor Q18, constant current i3 determined by bias voltage BIASL flows. When node ND7 is at the ground voltage level, MOS transistor Q19 is off, and node ND9 is at H-level so that pump enable signals ENVBB (ENVBBA, ENVBBS) from inverter circuits IV1 and IV2 attain the active state at H-level.

When negative voltage VBB is at the level not exceeding the predetermined voltage level, MOS transistor Qa in trimmable level detection element TR is on, and a current flows through MOS transistors Q12 and Q14 so that the voltage level on node ND7 rises. When the voltage level on node ND7 exceeds bias voltage BIASL, current i4 lowers the voltage level on node ND9, and the voltage drop on node ND9 is amplified by inverter circuits IV1 and IV2 so that pump enable signal ENVBB attains L-level of the ground voltage level, and the pump operation stops. Thereby, negative voltage VBB is held at the constant voltage level of −1.0 V.

As shown in FIG. 6B, currents i1–i4 in the level detector are substantially equal to a few microamperes, and satisfy the specification value (e.g., 200 μA) of the standby current. The response characteristics of this level detector become slow if currents i1–i4 are reduced. However, owing to the large parasitic capacitance of the substrate region, rapid changes in negative voltage VBB do not occur, and negative voltage VBB can be supplied sufficiently stably.

Oscillators 2b and 2f shown in FIG. 6A is formed of ring oscillators, respectively. Vbb pumps 2c and 2g are formed of charge pump circuits using capacitors.

Figure 7:
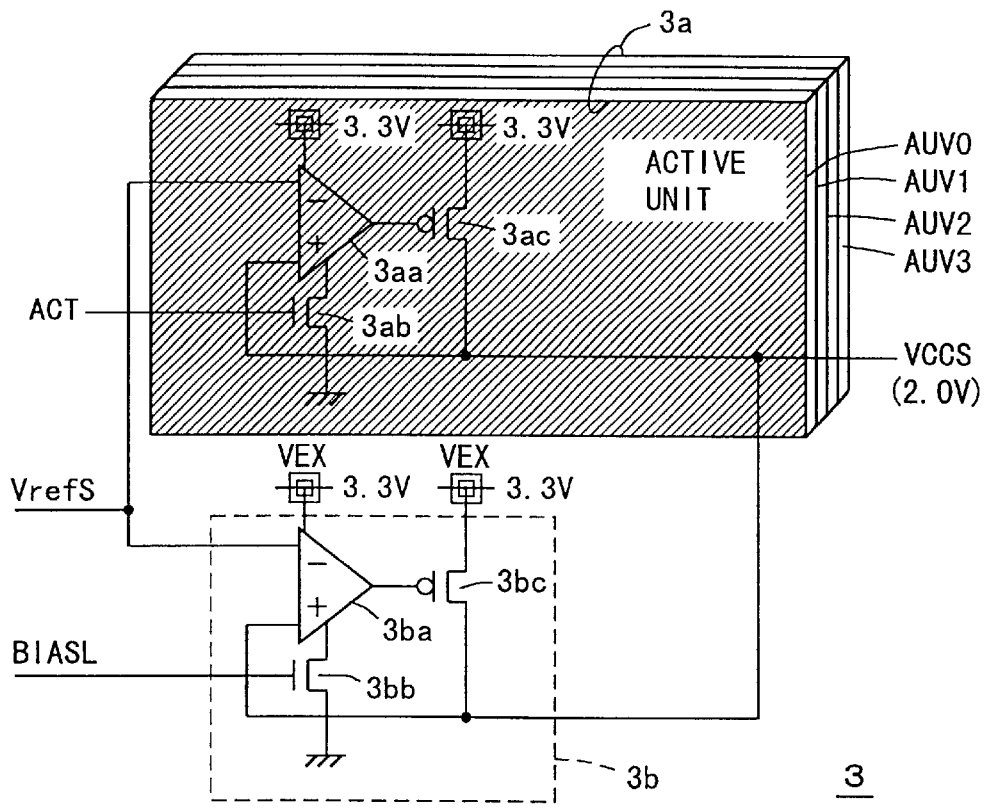
FIG. 7 schematically shows a structure of an array voltage generating circuit shown in FIG. 2.

FIG. 7 schematically shows a structure of an array voltage generating circuit 3 shown in FIG. 2. In FIG. 7, array voltage generating circuit 3 includes an active down converter 3a operating when array activating signal ACT is active, to produce array voltage VCCS by down-converting external power supply voltage VEX, and a standby down converter 3b always operating to produce array voltage VCCS by down-converting the external power supply voltage.

Active down converter 3a includes four active units AUV0–AUV3 having the same current supply capabilities. These active units AUV0–AUV3 have the same structures and the same layouts. Each of active units AUV0–AUV3 includes a comparator 3aa for comparing reference voltage VrefS with array voltage VCCS, a current source transistor 3ab turned on to activate comparator circuit 3aa when array activating signal ACT is active, and a current drive transistor 3ac formed of a P-channel MOS transistor for supplying a current to the array power supply line from the external power supply node in accordance with the output signal of comparator 3aa. In active down converter 3a, each of active units AUV0–AUV3 has a current supply capability equal to ¼ times the current supply capability required when the memory has the maximum storage capacity of 32 Mbits.

Standby down converter 3b includes a comparator 3ba for comparing reference voltage VrefS with array voltage VCCS, a current source transistor 3bb receiving bias voltage BIASL on its gate, to determine the operation current of comparator 3ba, and a current drive transistor 3bc for supplying a current from the external power supply node to the array power supply line in accordance with the output signal of comparator 3ba. Standby down converter 3b always operates, and bias voltage BIASL restricts the operation current of comparator 3ba for satisfying the specification value of the standby current. Current drive transistor 3bc likewise has a small current driving capability. Standby down converter 3b consumes a small current, and has the components thereof, i.e., MOS transistors small in size and thus requires a small layout area. Therefore, standby down converter 3b has a capability of compensating for a leak current when the memory has the maximum storage capacity.

When the array is active, the amount of consumed current varies to a large extent depending the number of the selected word lines and others. Therefore, active down converter 3a is formed of active units AUV0–AUV3, and the number of these active units is adjusted in accordance with the required amount of current consumption.

Figure 8:
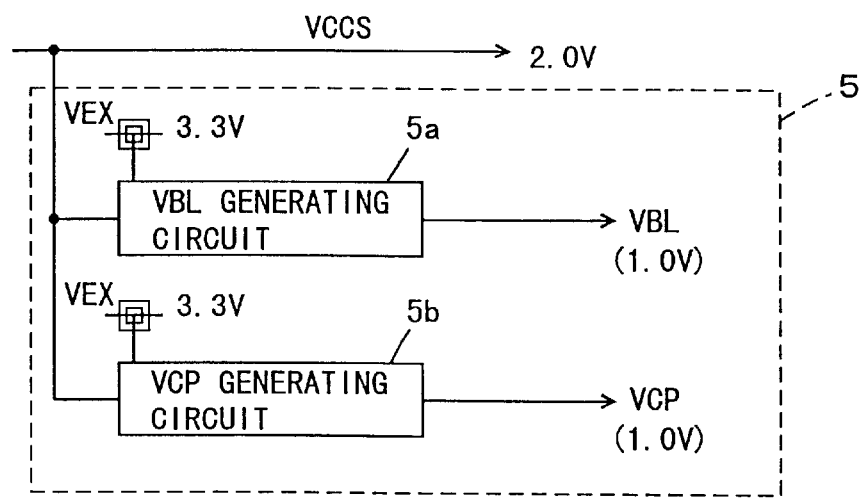
FIG. 8 schematically shows a structure of an intermediate voltage generating circuit shown in FIG. 2.

FIG. 8 schematically shows a structure of an intermediate voltage generating circuit 5 shown in FIG. 2. In FIG. 8, intermediate voltage generating circuit 5 includes a VBL generating circuit 5a receiving array voltage VCCS and external power supply voltage VEX, to produce bit line precharge voltage VBL at the voltage level of VCCS/2, and a VCP generating circuit 5b receiving array voltage VCCS and external power supply voltage VEX, to produce cell plate voltage VCP at the voltage level of VCC/2.

In VBB and VCP generating circuits 5a and 5b an intermediate voltage is generated based on array voltage VCCS, and the current is supplied from the external power supply node to the output node by MOS transistors operating in a source follower mode in accordance with this intermediate voltage, to produce intermediate voltages VBL and VCP at the necessary level (intermediate voltage level).

As described before, the bit line precharge voltage and the cell plate voltage require only small current consumptions. For example, cell plate voltage VCP is merely supplied to the cell plates of memory cell capacitors only for compensation for leak current. VBL generating circuit 5a is required to compensate for the leak current of the bit line during standby. In transition from the active cycle to the standby cycle, charged and discharged bit lines are short-circuited by the sense amplifier circuits so that the bit lines change into the intermediate voltage level. In the above operation, therefore, only a small current consumption is caused in bit line precharge voltage VBL. Accordingly, VBL and VCP generating circuits and 5b have small layout sizes, and increase in area hardly occurs even if the design is made in accordance with the possible maximum current consumption. Even when the storage capacity of the memory array decreases, and the array size decreases due to reduction in storage capacity, the stability of voltages VBL and VCP decreases only to an extremely small extent because a large stabilizing capacitance is inherently present owing to the gate capacitances of the bit line precharge/equalize transistor and a large parasitic capacitance by the cell plate electrode of the memory capacitors. Accordingly, the intermediate voltage generating circuit 5 is designed in accordance with the specification of the maximum current consumption.

Figure 9A:
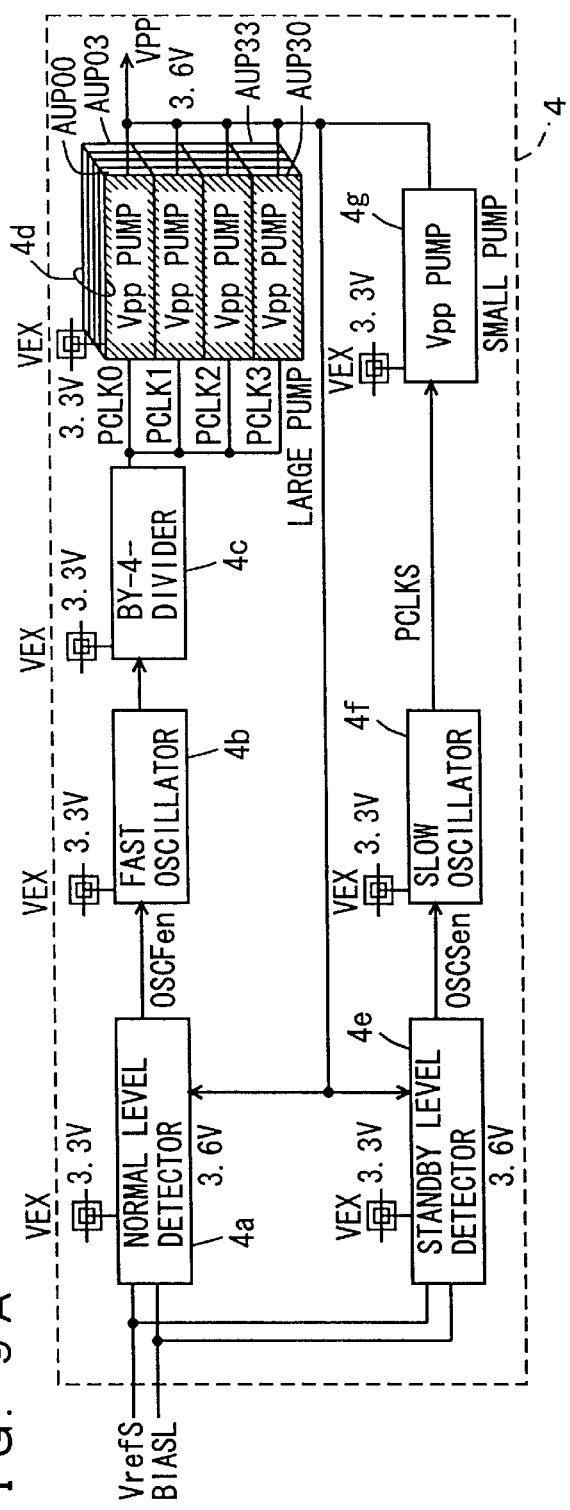
FIG. 9A shows a structure of a VPP generating circuit shown in FIG. 2.

FIG. 9A schematically shows a structure of a VPP generating circuit 4 shown in FIG. 2. In FIG. 9A, VPP generating circuit 4 includes a normal level detector 4a receiving reference voltage VrefS, bias voltage BIASL and external power supply voltage VEX, to detect the level of boosted voltage VPP, a fast oscillator 4b selectively performing oscillation in accordance with an output signal OSCFen of normal level detector 4a, a quad-divider (by-4-divider) 4c for dividing the frequency of the output signal of fast oscillator 4b by a factor of 4, and a Vpp pump circuit 4d for performing a charge pump operation to produce boosted voltage VPP in accordance with output signals PCLK0–PCLK3 of quad-divider 4c.

Vpp pump circuit 4d includes Vpp pumps provided corresponding to output signals PCLK0–PCLK3 of quad-divider 4c. Four Vpp pumps are provided corresponding to each of frequency-divided signals PCLK0–PCLK3. Thus, Vpp pump circuit 4d includes 16 Vpp pumps, which are disposed as active units AUP00–AUP33. Each of active units AUP00–AUP33 'has a current drive capability equal to $1/16$ times the maximum current driving capability required in the DRAM macro.

VPP generating circuit 4 further includes a standby level detector 4e receiving sense reference voltage VrefS, bias voltage BIASL and external power supply voltage VEX, to detect the level of boosted voltage VPP, a slow oscillator 4f performing slow oscillation in accordance with an output signal OSCSen of standby level detector 4e, and a Vpp pump 4g performing a charge pump operation to produce boosted voltage VPP in accordance with output signal PCLKS of slow oscillator 4f.

Each of standby level detector 4e, slow oscillator 4f and Vpp pump 4g receives external power supply voltage VEX as one operation power supply voltage. Standby level detector 4e, slow oscillator 4f and Vpp pump 4g are merely required to compensate for lowering of boosted voltage VPP caused by a leak current during standby, and therefore are configured to have small current supply capabilities. Accordingly, the layout of these circuits is determined in accordance with the possible maximum required current.

Figure 9B:
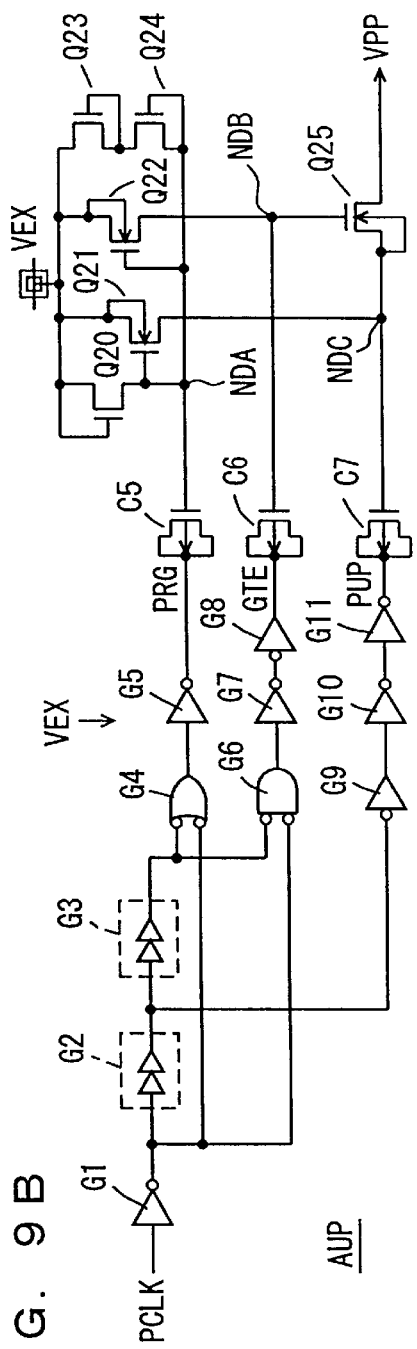
FIG. 9B shows by way of example a structure of a Vpp pump shown in FIG. 9A.

FIG. 9B shows an example of a structure of Vpp pump shown in FIG. 9A. In FIG. 9B, the Vpp pump (active unit AUP) includes an inverter circuit G1 receiving frequency-divided signal PCLK from the quad-divider, a delay buffer circuit G2 for delaying the output signal of inverter G1 by a predetermined time, a delay buffer circuit G3 for delaying the output signal of delay buffer circuit G2 by a predetermined time, an NAND circuit G4 receiving the output signals of inverter circuit G1 and delay buffer circuit G3, an inverter circuit G5 receiving the output signal of NAND circuit G4, to produce precharge signal PRG, a capacitor C5 performing a charge pump operation in accordance with precharge signal PRG, an NOR circuit G6 receiving the output signals of inverter circuit G1 and delay buffer circuit G3, an inverter circuit G7 receiving the output signal of NOR circuit G6, an inverter circuit G8 receiving the output signal of inverter circuit G7 to produce a gate signal GTE, a capacitor C6 performing a charge pump operation in accordance with a gate signal from inverter circuit G8, an inverter circuit G9 receiving the output signal of delay buffer circuit G2, an inverter circuit G10 receiving the output signal of inverter circuit G9, an inverter circuit G11 receiving the output signal of inverter circuit G10, to produce a pump signal PUP, and a capacitor C7 performing a charge pump operation in accordance with pump signal PUP. The Vpp pump utilizes external power supply voltage VEX as one operation power supply voltage, and therefore precharge signal PRG, gate signal GTE and pump signal PUP have the amplitudes equal to external power supply voltage VEX.

The Vpp pump (active unit AUP) further includes a diode-connected N-channel MOS transistor Q20 connected between the external power supply node and a node NDA, an N-channel MOS transistor Q21 connected between the external power supply node and a node NDC and having a gate connected to node NDA, an N-channel MOS transistor Q22 connected between a node NDB and the external power supply node and having a gate connected to node NDA, diode-connected MOS transistors Q23 and Q24 connected between the external power supply node and node NDA, to clamp the maximum voltage level on node NDA at the level of a sum of (external power supply voltage VEX) and (2×Vth), and an N-channel MOS transistor Q25 turned on in accordance with the signal voltage on node NDB, to supply charges from node NDC to the output node for producing boosted voltage VPP. Nodes NDA, NDB and NDC are connected to capacitors C5, C6 and C7, respectively.

Figure 10:
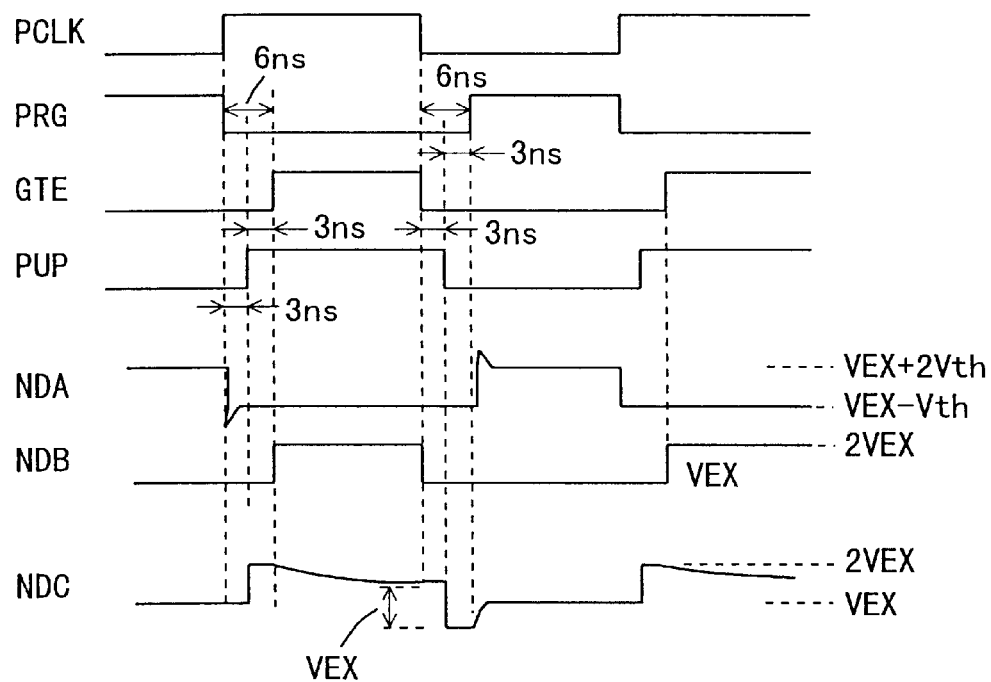
FIG. 10 is a signal waveform diagram showing an operation of a Vbb pump shown in FIG. 9A.

Operation of the Vpp pump shown in FIG. 9B will now be described with reference to a signal waveform diagram of FIG. 10. Delay buffer circuits G2 and G3 change precharge signal PRG, gate signal GTE and pump signal PUP with phases shifted from each other. More specifically, when frequency-divided signal PCLK rises to H-level, the output signal of inverter circuit G1 attains L-level, and precharge signal PRG lowers to L-level. Precharge signal PRG returns to H-level when both the output signals of delay buffer circuit G3 and inverter circuit G1 attain H-level. The delay time of each of delay buffer circuits G2 and G3 is set, e.g., to 3 ns.

Gate signal GTE rises to H-level when both the output signals of inverter circuit G1 and delay buffer circuit G3 attain L-level. When the output signal of inverter circuit G1 attains H-level, gate signal GTE falls to L-level. Accordingly, gate signal GTE rises to H-level with a delay of delay buffer circuits G2 and G3 from the rising of frequency-divided signal PCLK. In the above description, a delay time of inverter circuit G1 is ignored.

Pump signal PUP changes in accordance with the output signal of delay buffer circuit G2. Therefore, pump signal PUP is activated after precharge signal PRG attains L-level to complete the precharge operation. Responsively, the voltage level on node NDC rises. Thereafter, gate signal GTE rises to H-level so that MOS transistor Q25 is turned on to supply charges to the output node.

Node NDA is held at the voltage level of (VEX+2·Vth) by MOS transistors Q23 and Q24 when precharge signal PRG is at H-level, where all MOS transistors Q20–Q25 have the equal threshold voltage of Vth. When node NDA is at the voltage level of (VEX+2·Vth), MOS transistors Q21 and Q22 are turned on so that nodes NDC and NDB are precharged to the level of external power supply voltage VEX.

When precharge signal PRG lowers to L-level, the voltage level on node NDA lowers from the precharge voltage level, and then is clamped at the voltage level of (VEX−Vth) by MOS transistor Q20. In this state, MOS transistors Q21 and Q22 are turned off, and the operation of precharging nodes NDC and NDB is completed. When pump signal PUP rises to H-level, the voltage level on node NDC rises from external power supply voltage VEX to 2·VEX. At this time, node NDB is still at the level of external power supply voltage VEX, and MOS transistor is off.

Then, gate signal GTE rises to H-level, and node NDB rises to the voltage level of 2·VEX so that MOS transistor Q25 is turned on to supply charges from node NDC to the output node. The voltage level on node NDC lowers in accordance with the voltage level of boosted voltage VPP.

When gate signal GTE falls to L-level, the voltage level on node NDB lowers to the level of external power supply voltage VEX. Responsively, MOS transistor Q25 is turned off to stop the charge supplying operation. Then, pump signal PUP falls to L-level, and the voltage level on node NDC lowers by the level of external power supply voltage VEX. At this time, node NDA is at the voltage level of (VEX−Vth), and the precharge operation is not performed.

Then, precharge signal PRG rises to H-level, and node NDA rises to the level of (voltage VEX+2·Vth) again so that nodes NDB and NDC are precharged to the level of external power supply voltage VEX.

By activating precharge signal PRG, gate signal GTE and pump signal PUP with their phases shifted from each other, it is possible to prevent flowing of charges from nodes NDB and/or NDC to external power supply node VEX, and the charge pump operation can be executed efficiently.

Delay times by the delay buffers must be set for shifting the phases of precharge signal PRG, gate signal GTE and pump signal PUP from each other, and therefore fast operation of the Vpp pump may be impossible.

A certain time periods are required for charging and discharging capacitors C5–C7. Accordingly, if the charge pump operation of the Vpp pump were performed in accordance with a fast clock signal, the pumping efficiency would conversely lower due to a through-current (flow-out of charges). Accordingly, frequency-divided signals PCLK0–PLCK3 are produced by quad-divider 4c, and the charge pump operations are executed with their phases shifted by 90 degrees from each other in accordance with relatively slow frequency-divided signals PCLK so that the charge pump operations can be executed efficiently.

Figure 11:
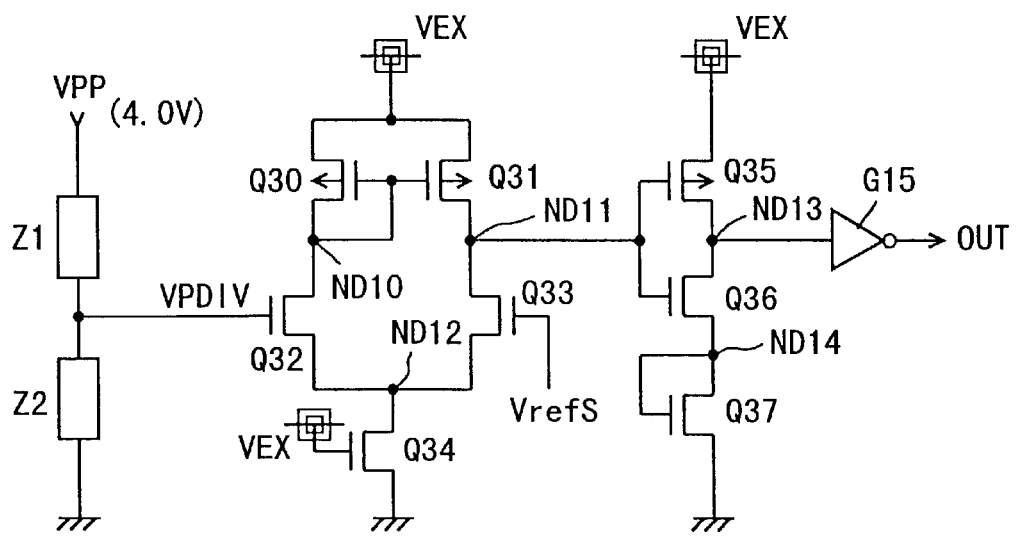
FIG. 11 shows by way of example a structure of a level detector shown in FIGS. 6A and 9A.

FIG. 11 shows by way of example a structure of level detectors 4a and 4e shown in FIG. 9A. In FIG. 11, each of level detectors 4a and 4e includes impedance elements Z1 and Z2 forming a voltage divider for voltage-dividing boosted voltage VPP to produce a divided voltage VPDIV, a P-channel MOS transistor Q30 connected between the external power supply node and a node ND10 and having a gate connected to a node ND10, a P-channel MOS transistor Q31 connected between the external power supply node and a nod ND11 and having a gate connected to node ND10, an N-channel MOS transistor Q32 connected between nodes ND10 and ND12 and having a gate receiving divided voltage VPDIV, an N-channel MOS transistor Q33 connected between nodes ND11 and ND12 and having a gate receiving reference voltage VrefS, and an N-channel MOS transistor Q34 connected between node ND12 and the ground node and having a gate receiving external power supply voltage VEX.

Array voltage VCCS is, e.g., 2.0 V and reference voltage VrefS is also 2.0 V. Boosted voltage VPP is, e.g., 4.0 V. Impedance elements Z1 and Z2 voltage-divide boosted voltage VPP by a division factor of 2 to produce divided voltage VPDIV at the level of VPP/2.

MOS transistor Q34 is a current source transistor, and flows a large operation current because it receives external power supply voltage VEX on the gate, and reference voltage VrefS is compared with divided voltage VPDIV at a high speed.

Each of level detectors 4a and 4e further has a P-channel MOS transistor Q35 connected between the external power supply node and a node ND13 and having a gate connected to node ND11, an N-channel MOS transistor Q36 connected between nodes ND11 and ND14 and having a gate connected to node ND11, an N-channel MOS transistor Q37 connected between node ND14 and the ground node and having a gate connected to node ND14, and an inverter circuit G15 inverting the signal on node ND13 to produce a level detection signal OUT.

MOS transistor Q37 has a small current driving capability, and reduces operation currents of MOS transistors Q35 and Q36.

According to the structures of level detectors 4a and 4e shown in FIG. 11, when divided voltage VPDIV is higher than reference voltage VrefS, the voltage level on node ND11 becomes high, and a signal at the low level is outputted from node ND13. The signal at low level from node ND13 is amplified and inverted by inverter circuit G15 to produce level detection signal OUT at H-level (CMOS level).

When divided voltage VPDIV is lower than reference voltage VrefS, the voltage on node ND11 lowers, and the voltage level on node ND13 rises. Thereby, level detection signal OUT from inverter circuit G15 attains L-level.

The reason why the differential amplifier is used to detect the voltage level of the boosted voltage is as follows.

Boosted voltage VPP must be transmitted onto a selected word line. If boosted voltage VPP lowers, it is impossible to rapidly drive the selected word line to the selected state, and further, an error may occur in decoding operation of the decode circuit. For rapidly compensating for lowering of boosted voltage VPP, the level detector shown in FIG. 11 is used to detect the voltage level lowering of boosted voltage VPP. Usually, a decouple capacitance provided for boosted voltage VPP has a capacitance value of about 8 nF for 32 Mbits. The current consumption in boosted voltage VPP is large and equal to about 20 mA when operation is performed in synchronization with the clock signal at 166 MHz. Therefore, when boosted voltage VPP lowers, it is necessary to immediately detect this level lowering to drive the VPP pump circuit. Meanwhile, the current consumption in negative voltage VBB is extremely small and equal to, e.g., tens of microamperes because it is required only to hold a bias voltage of the P-well forming the substrate region under the memory array at a constant level. Therefore, negative voltage VBB does not change in a short time so that the response characters for negative voltage is made slow as compared with the response characteristics of the level detector for the boosted voltage VPP.

Figure 12:
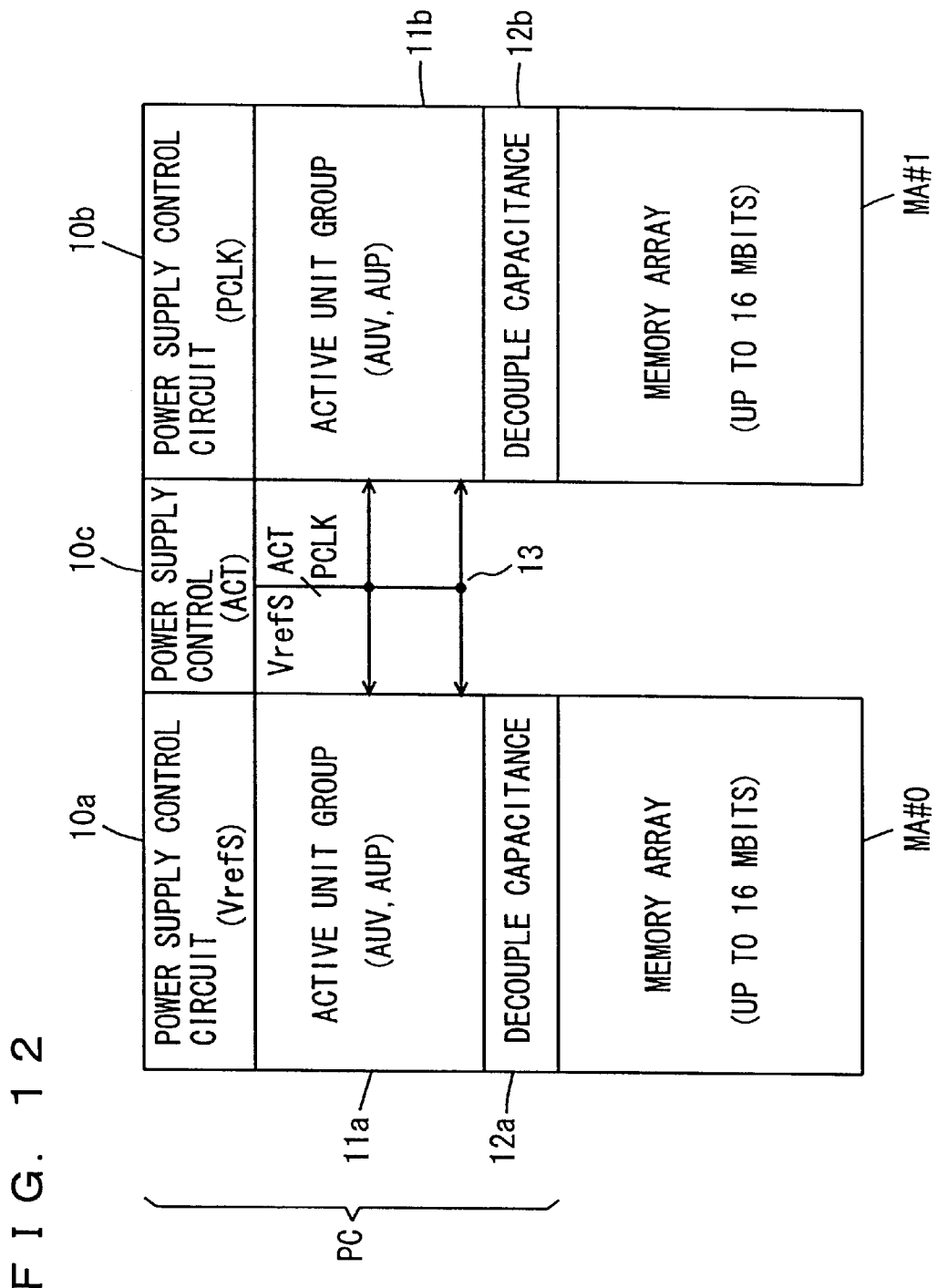
FIG. 12 schematically shows a structure of a power supply circuit of the DRAM macro according to the first embodiment of the invention.

In the power supply circuit which has been described with reference to FIGS. 3 to 11, the active down converter and the Vpp pump are cellulated as the active units. The control circuit for controlling the operation of the active unit is configured into cell with the layout accomplished. By arranging a required number of active units, re-designing of the power supply circuit can be efficiently performed FIG. 12 schematically shows a whole structure of a DRAM according to a first embodiment of the invention. In FIG. 12, the DRAM macro includes memory arrays MA#0 and MA#1 each having the storage capacity of up to 16 Mbits, power supply control circuits 10a and 10b arranged aligned to memory arrays MA#0 and MA#1, respectively, a power supply control circuit 10c arranged between power supply control circuits 10a and 10b, an active unit group 11a provided corresponding to memory array MA#0 for generating predetermined voltages (VPP and VCCS) in accordance with the reference voltage and the control signal from power supply control circuits 10a and 10b, an active unit group 11b provided corresponding to memory array MA#1 for generating predetermined voltages VPP and VCCS in accordance with the reference voltage and the control signal from power supply control circuits 10a and 10b, a decouple capacitance 12a arranged between active unit group 11a and memory array MA#0, and a decouple capacitance 12b arranged between memory array MA#1 and active unit group 11b.

Power supply control circuit 10a includes a reference voltage generating circuit for producing reference voltage VrefS used for generating array voltage VCCS. Power supply control circuit 10b includes a circuit for generating frequency-divided clock signal PCLK used for generating boosted voltage VPP. Power supply control circuit 10c includes a control circuit generating array activating signal ACT, an intermediate voltage generating circuit generating intermediate voltages VBL and VCP, and a standby down converter. The control signal from power supply control circuit 10c and the reference voltage are applied to active unit groups 11a and 11b via a signal line 13. Signal line 13 extends in the bit line direction between active unit groups 11a and 11b, and then extends in the row direction for active unit groups 11a and 11b.

Decouple capacitances 12a and 12b compensates for shortages of the decouple capacitance values when such shortage occur in the respective active units included in active unit groups 11a and 11b.

Each of active unit groups 11a and 11b includes active units AUP forming the Vpp pump and active units AUV forming the active down converter. The numbers of active units AUV and AUP included in active unit groups 11a and 11b are determined appropriately in accordance with the storage capacities or operation conditions of memory arrays MA#0 and MA#1.

Figure 13:
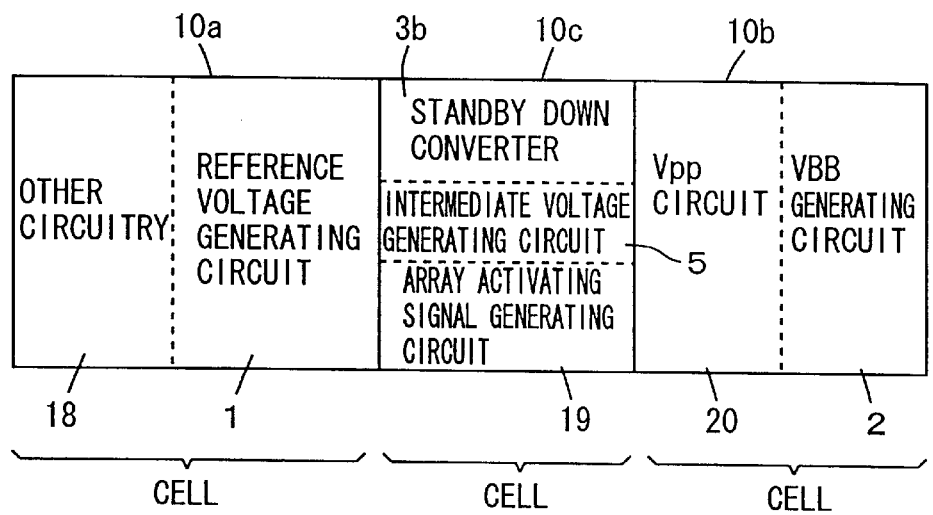
FIG. 13 schematically shows a structure of a power supply control circuit shown in FIG. 12.

FIG. 13 schematically shows structures of power supply control circuits 10a–10c shown in FIG. 12. In FIG. 13, power supply control circuit 10a includes a reference voltage generating circuit 1 generating reference voltage VrefS and other circuitry 18 including necessary control circuits and others. Reference voltage generating circuit 1 is arranged in a region near power supply control circuit 10c.

Power supply control circuit 10b includes VBB generating circuit 2 for generating negative voltage VBB, and Vpp circuit 20 including components except Vpp pump AUP forming the active unit. Vpp circuit 20 produces frequency-divided signals PCLK0–PCLK3. For minimizing the length of the signal line for the frequency-divided signal, Vpp circuit 20 is disposed in a region near power supply control circuit 10c. Power supply control circuit 10c includes standby down converter 3b, intermediate voltage generating circuit 5 for generating intermediate voltages VBL and VCP; and array activating signal generating circuit 19 for generating array activating signal ACT for activating the active down converter. By arranging array activating signal generating circuit 19 in power supply control circuit 10c, the signal lines for transmitting array activating signal ACT to the respective active units can be short, and the delay in signal transmission is reduced.

Each of power supply control circuits 10a–10c are configured into cell.

Figure 14:
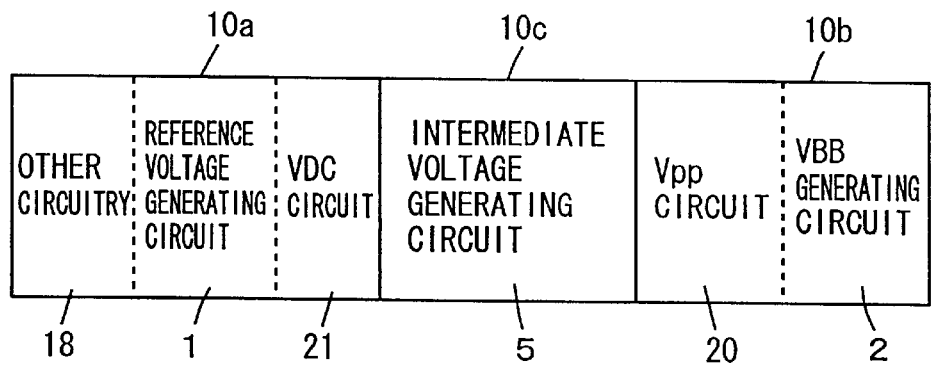
FIG. 14 schematically shows another example of the structure of the power supply control circuit shown in FIG. 12.

FIG. 14 shows another structure of power supply control circuits 10a–10c. In FIG. 14, power supply control circuit 10a includes a VDC circuit 21 arranged adjacent to reference voltage generating circuit 1. VDC circuit 21 is a circuit portion of array voltage generating circuit 3 except the active down converter, and includes standby down converter 3b and array activating signal generating circuit 19 shown in FIG. 13. Power supply control circuit 10b includes Vpp circuit 20 and VBB generating circuit 2, similarly to the structure shown in FIG. 13. Power supply control circuit 10c includes only intermediate voltage generating circuit 5. In the arrangement shown in FIG. 14, VDC circuit 21 is arranged in a region near power supply control circuit 10c so that the length of the signal interconnection line of array activating signal ACT extending from VDC circuit is reduced.

Reference voltage VrefS supplied from reference voltage generating circuit 1 is always at a constant voltage level, and requires only noise immunity. It is not necessary to give consideration to signal transmission delay of reference voltage VrefS. In power supply control circuit 10a, therefore, it is arranged between comparator circuit 18 and VDC circuit 21.

Figure 15:
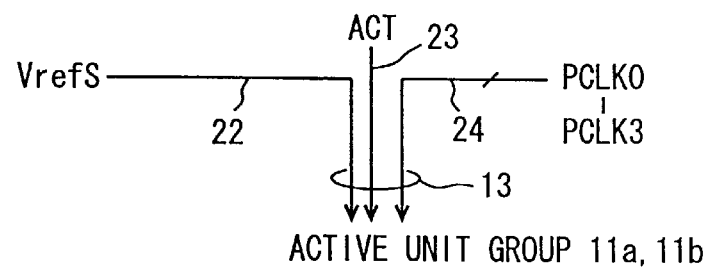
FIG. 15 schematically shows a structure of signal lines shown in FIG. 12.

FIG. 15 shows control signals and the voltage transmitted from power supply control circuits 10a–10c to the active unit groups. As shown in FIG. 15, active unit groups 11a and 11b are supplied with reference voltage VrefS from reference voltage generating circuit 1 via a reference voltage transmission line 22, and are also supplied with array activating signal ACT from VDC circuit 21 or array activating signal generating circuit 19 via a signal line 23. Further, frequency-divided signals PCLK0–PCLK3 are supplied from Vpp circuit 20 to active unit groups 11a and 11b via a signal line 24. It is necessary to minimize the signal propagation delay of array activating signal ACT and frequency-divided signals PCLK0–PCLK3. As shown in FIGS. 13 and 14, the circuits for generating these signals are arranged as close as possible to the region between memory arrays MA#0 and MA#1 so that the interconnection lengths of signal lines 23 and 24 included in signal line group 13 may be short.

Cellulation (cellularization) of each of power supply control circuits 10a–10c can achieve the following advantages in addition to easy layout design.

Figure 16A:
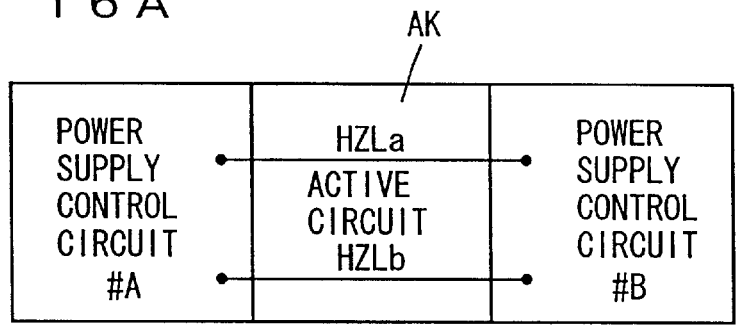
FIG. 16A and FIG. 16B show a problem of a conventional power supply circuit.

Description will now be given on a structure shown in FIG. 16A and, more specifically, a structure in which an active circuit AK performing fast operation is disposed between power supply control circuits #A and #B. High-impedance lines HZLa and HZLb are disposed between power supply control circuits #A and #B, extending over active circuit AK. High-impedance lines HZLa and HZLb are signal lines for transmitting, e.g., reference voltage VrefS and bias voltage BIASL, respectively. High-impedance lines HZLa and HZLb are susceptible to noises, and therefore must be protected against noises. In view of this noise protection, the layouts of power supply control circuits #A and #B are determined. In active circuit AK, circuit components are arranged to suppress an influence causing noises on the high-impedance lines.

Figure 16B:
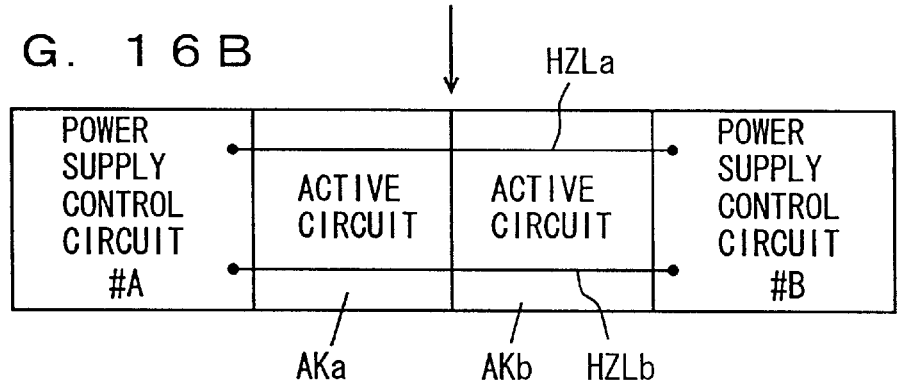

Now, description will be given on a structure, in which active circuits AKa and AKb are disposed between power supply control circuits #A and #B as shown in FIG. 16B. This structure corresponds to a structure for increasing the number of the active down converter in accordance with increase in storage capacity of the memory array, for example. In this case, power supply control circuits #A and #B are spaced by a long distance from each other, and accordingly high-impedance lines HZLa and HZLb have increased lengths. Therefore, high-impedance lines HZLa and HZLb are more susceptible to noises, and the stability of circuit operation of power supply control circuits #A and #B is liable to be impaired. For eliminating the instability of the circuit operation countermeasures against noises must be applied again for power supply control circuits #A and #B, which requires re-designing at much consumption in time and effort.

Figure 17A:
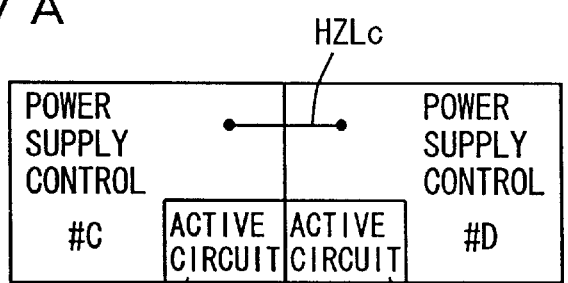
FIG. 17A and FIG. 17B illustrates a problem of the conventional power supply circuit.

Description will now be given on the structure shown in FIG. 17, in which active circuits AKc and AKd are disposed without overlapping with high-impedance line HZLc between power supply control circuits #C and #D. In this case, noise countermeasure for high-impedance line HZLc is effected in a region between power supply control circuits #C and #D. Even if active circuits AKc and AKd operate fast, they do not overlap with high-impedance line HZLc, so that the influence by them is sufficiently suppressed.

Figure 17B:
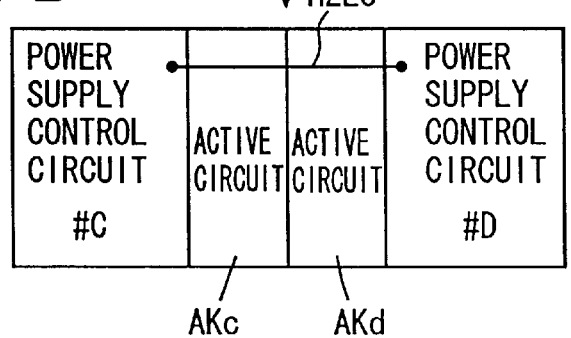

As shown in FIG. 17B, however, if the scales or sizes of active circuits AKc and AKd may increase e.g., due to change in array structure, and high-impedance line HZLc may overlap with active circuits AKc and AKd, new countermeasures against noises must be taken for high-impedance line HZLc. Since the sizes of active circuits AKc and AKd significantly change, changes occur in signal line interconnection from power supply control circuits #C and #D to active circuits AKc and AKd, so that the layout of power supply control circuits #C and #D must be changed.

By cellulating power supply control circuits 10a–10c as is done in the first embodiment, and by the arrangement to prevent overlapping of the active unit groups with the interconnection lines between the power supply control circuits, an influence by noises can be suppressed. Since no change occurs in relative positions between and within the power supply control circuits, the stability of the circuit operation can be ensured.

Figure 18:
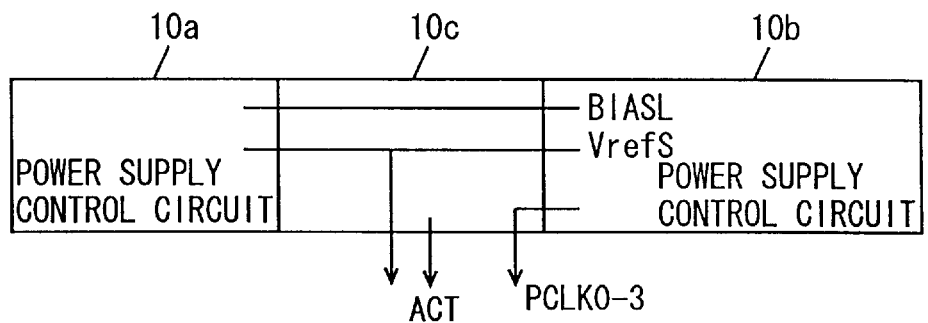
FIG. 18 shows an advantageous effect of the power supply circuit according to the invention.

As shown in FIG. 18, signal lines transmitting bias voltage BIASL and reference voltage VrefS are disposed between power supply control circuits 10a and 10b via power supply control circuit 10c. Power supply control circuit 10a supplies reference voltage VrefS to the active units, and power supply control circuit 10b supplies frequency-divided signals PCLK0–PCLK3 to the active units. Therefore, sufficient countermeasures against noises can be taken for bias voltages BIASL and VrefS, and power supply control circuits 10a–10c are configured into cells. Power supply control circuits 10a–10c are circuit portions which are not susceptible to change in array structure or the like. Therefore, the layout of each of power supply control circuits 10a–10c can always be fixed, and the power supply circuits in a cell form can be utilized even for another array structure, so that re-design and re-arrangement can be performed easily without impairing stability, e.g., against noises of power supply control circuits 10a–10c.

In the power supply circuit, the circuit in a cell form can be simply utilized for providing the power supply control circuit portion requiring particular consideration on noise protection upon designing the layout, in the power supply circuit. Therefore, the design process can be significantly simplified.

Figure 19:
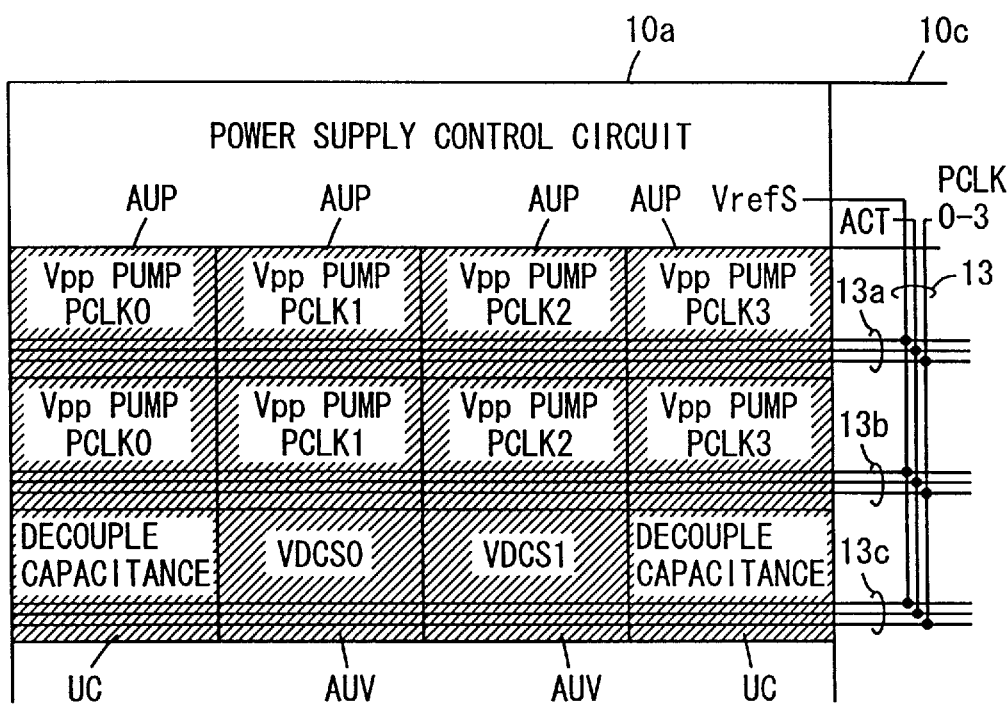
FIG. 19 shows by way of example a structure of an active unit group of the power supply circuit according to the first embodiment of the invention.

FIG. 19 schematically shows a layout of active unit group 11a shown in FIG. 12. In FIG. 19, active unit group 11a includes eight Vpp pumps. These Vpp pumps are all configured into cells forming active units AUP, respectively. The Vpp pumps aligned in the word line direction (horizontal direction in FIG. 19) perform the charge pump operation in accordance with different frequency-divided signals PCLK0–PCLK3, respectively. Active units AUP of the Vpp pumps aligned in the row direction are supplied with reference voltage VrefS, array activating signal ACT and frequency-divided clock signals PCLK0–PCLK3 via signal line groups 13a or 13b arranged in the same layout in each active unit AUP. Signal line groups 13a and 13b are coupled to control signal line group 13 extending in the column direction and disposed in a region under second power supply control circuit 10c.

Active unit group 11a further includes active units AUV forming active down converter VDCS0 and VDCS1, respectively, and capacitance units UC each formed of the decouple capacitance in the cell form. For active units AUV forming active down converter VDCS0 and VDCS1, respectively, there is arranged a signal line group 13c extending horizontally, similarly in active units AUP of the Vpp pumps. The signal line group is arranged for decouple capacitance unit UC, similarly to other active units AUP and AUV.

In active unit group 11a, all signal line groups 13a–13c extend in the row direction, and active units AUP and AUV as well as decouple capacitance units UC are all configured to transmit the reference voltage, frequency-divided signals and array activating signal in the same direction with the same layout. Thereby, the signal interconnection lines can be easily coupled in active unit group 11a even if active units AUP and AUV as well as capacitance units UC may be arranged in different manners.

In the structure shown in FIG. 19, active units AUP forming the Vpp pumps are aligned, and active units AUV forming active down converters VDCS (VDCS0, VDCS1) are aligned adjacent to another row. However, the active units AUP and/or AUV may be arranged adjacent to active units of a different kind in the vertical and/or horizontal directions. All the necessary signal lines extend in the same direction from the same position, and therefore the interconnection lines can be connected easily even if the units are arranged in different orders.

Active unit AUP is provided with a decouple capacitance (stabilizing capacitance) for stabilizing boosted voltage VPP produced by the Vpp pump. Active unit AUV forming the active down converter is likewise provided with the decouple capacitance. By arranging the decouple capacitances in the active units AUP and AUV, these active units AUP and AUV can have the same size (lengths in the longitudinal and lateral directions). In rearranging active unit group 11a, active units AUP and AUV formed into cells can be easily rearranged to implement the internal voltage generating circuit having the necessary capability. If the decouple capacitances formed in active units AUP and AUV do not have a sufficient capacitance value, decouple unit(s) UC formed into the cell may be used to add the decouple capacitances for providing the sufficient capacitance value. The decouple capacitance may be formed between the memory array and the active unit group 11a, as shown in FIG. 12.

Among the active units, the Vpp pump producing boosted voltage Vpp and active down converter VDCS producing array voltage VCCS are configured to have the same size, and this may superfacially result in a layout penalty. However, active units AUP and AUV are provided with the decouple capacitances for stabilizing the generated voltages, respectively, and resultantly, these active units AUP and AUV have the same size. Capacitance unit UC is arranged in the region which is not used by the active unit, and the layout of the decouple capacitance for the capacitance unit UC may be individually determined in accordance with the array structure.

Figure 20:
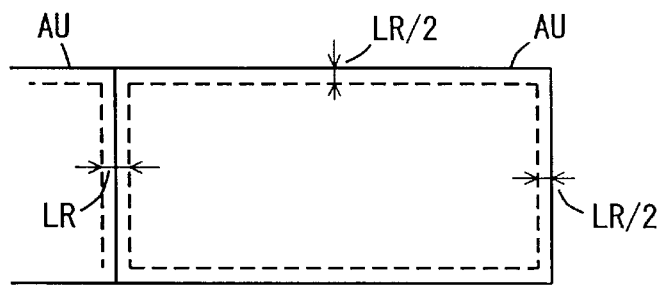
FIG. 20 shows a layout standard of the active unit shown in FIG. 19.

FIG. 20 represents conditions of interconnection arrangement in one active unit AU. Adjacent to the upper and lower sides and right and left of active unit AU, the power supply control circuits of active units the same kind or active units of different kind are arranged. In any one of such cases, the signal lines and elements are arranged in active unit AU in accordance with the layout standard. "Layout standard values" are intervals, line widths and others of the elements and interconnection lines, which must be kept in view of the process. For example, the interval is kept to half the layout standard value for arranging the elements and/or signal lines in active unit AU. When the active units AU are coupled as shown in FIG. 20, the element and/or interconnection line in the active unit AU are located in the position distant from the boundary region by half the layout standard value LR (i.e., LR/2). Therefore, the distance of LR satisfying the layout standard value is kept between the elements or interconnection lines in the adjacent active units AU. Accordingly, a situation which is disadvantageous from the viewpoint of process, or such a situation that the adjacent interconnections or elements are spaced by the line width or distance smaller than the allowable minimum line width when the active units AU are rearranged can be easily prevented.

Figure 21A:
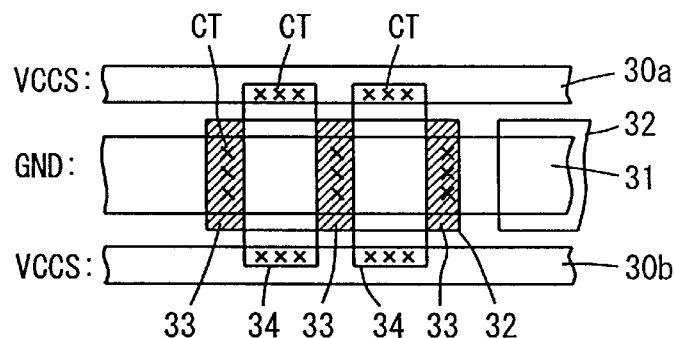
FIG. 21A schematically shows a structure of a decouple capacitance shown in FIG. 19.

FIG. 21A schematically shows a structure of the decouple capacitance. In FIG. 21A, array power supply lines 30a and 30b formed of a first level aluminum interconnection layer are arranged parallel to each other for transmitting array voltage VCCS, and a ground line 31 formed of the first level aluminum interconnection layer is arranged for transmitting ground voltage GND. A field region 32 overlaps ground line 31 in a plan view. Field region 32 is provided with gate electrode layers 34 and impurity regions (source/drain regions) 33 formed in a self-aligned manner. Gate electrode layer 34 is formed of, e.g., a first level polycrystalline silicon layer, and is coupled to array power supply lines 30a and 30b via contact holes CT. Impurity region 33 is coupled to ground line 31 via contact holes CT. A required number of MOS capacitors shown in FIG. 21A are repetitively aligned in the horizontal direction. Array power supply lines 30a and 30b are coupled to the power supply line and the ground line, respectively, which in turn are formed of a third level aluminum interconnection layer arranged above the active unit.

Figure 21B:
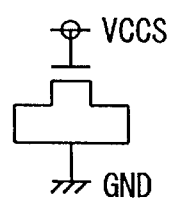
FIG. 21B is an electrically equivalent circuit diagram of the decouple capacitance shown in FIG. 21A.

FIG. 21B shows an electrically equivalent circuit of the decouple capacitance. The decouple capacitance is formed of an N-channel MOS transistor, as shown in FIG. 21B, and has a gate receiving array voltage VCCS as well as source/drain regions receiving ground voltage GND. By the above basic arrangement, the decouple capacitance of a required, magnitude can be arranged within cellulated capacitance unit UC. In active units AUP and AUV, MOS capacitors similar to that shown in FIG. 21A are arranged as the decouple capacitances.

Figure 22:
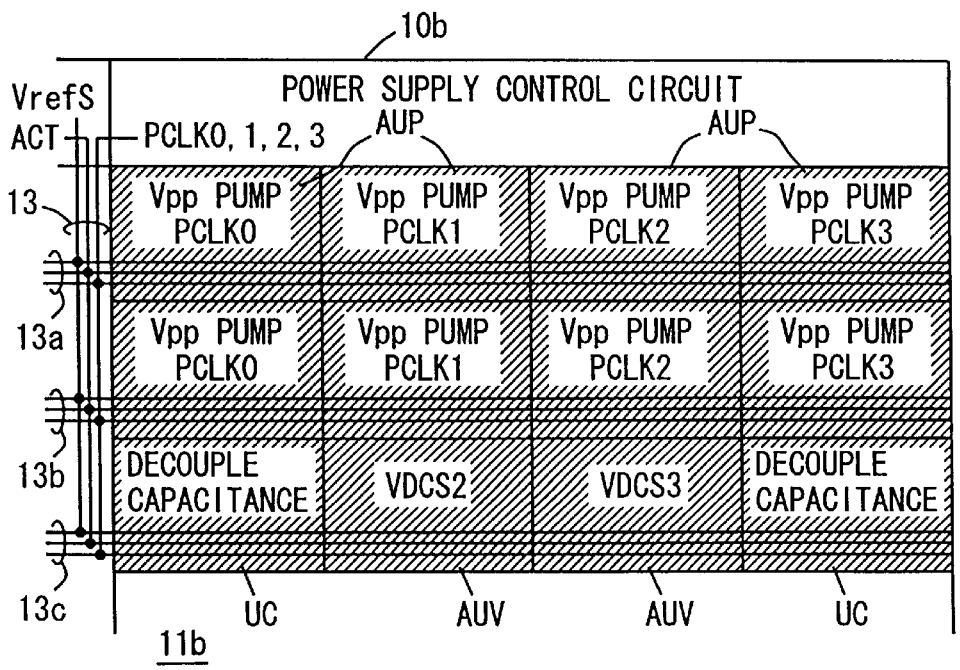
FIG. 22 schematically shows a structure of a portion of the power supply circuit according to the first embodiment of the invention.

FIG. 22 schematically shows a layout of active unit group 11b shown in FIG. 12. As shown in FIG. 22, active unit group 11b includes active units AUP forming Vpp pumps and aligned in a row adjacent to power supply control circuit 10b, and also active units AUV forming down converters VDCS generating array voltage VCCS when made active, and aligned in another row. Capacitance units UC forming the decouple capacitances, respectively, are arranged on the opposite sides of the active units AUV forming the active down converters. The active units in active unit groups 11b shown in FIG. 22 are arranged in the same manner as those in active unit group 11a shown in FIG. 19. Power control circuit 10b supplies frequency-divided signals PCLK0–PCLK3 onto signal line group 13. Array activating signal ACT and reference voltage VrefS supplied from power supply control circuit 10a and/or 10c via signal line group 13 are transmitted through signal lines extending over active units AUP and AUV in the row direction (horizontal direction in the figure). In active unit group 11b, therefore, the layout of active units AUP and AUV is the same as that of active units AUP and AUV shown in FIG. 19. Signal line group 13 is divided into signal line groups 13a, 13b and 13c extending in the row direction and corresponding to the respective rows of the active units. Signal line groups 13a, 13b and 13c are arranged over the active units.

Even in the case where the active unit group(s) are one or two in number, the layout of the active unit group(s) can be easily achieved.

In these active unit groups 11a and 11b, the signal line groups is laid out in each of active units AUP and AUV for the following reason.

Figure 23:
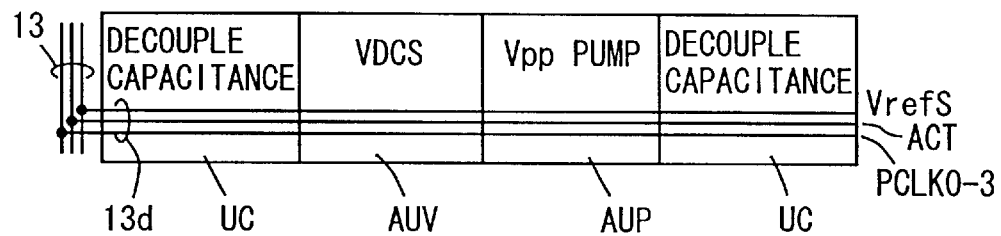
FIG. 23 schematically shows a layout of signal lines of an active unit in the first embodiment of the invention.

As shown in FIG. 23, different kinds of active units may be aligned in the row direction. FIG. 23 shows capacitance unit UC forming the decouple capacitance, active unit AUV forming active down converter VDCS, active unit AUP forming Vpp pump and capacitance unit UC forming the decouple capacitance, which are arranged aligned to each other. In this case, an interconnection group 13d is arranged to transmit entirely a signal group including reference voltage VrefS, array activating signal ACT and frequency-divided signals PCLK0–PLCK3, whereby rearrangement of the interconnection lines can be easily done by rearranging the cells without changing the layout of the necessary signal transmission lines even in the case where different kinds of active units are aligned as described above. Therefore, in each of the active unit and the capacitance unit, all the signal lines (interconnection lines) transmitting reference voltage VrefS, array activating signal ACT and frequency-divided signals PCLK0–PCLK3 are arranged in accordance with a predetermined layout to form a cell.

Figure 24:
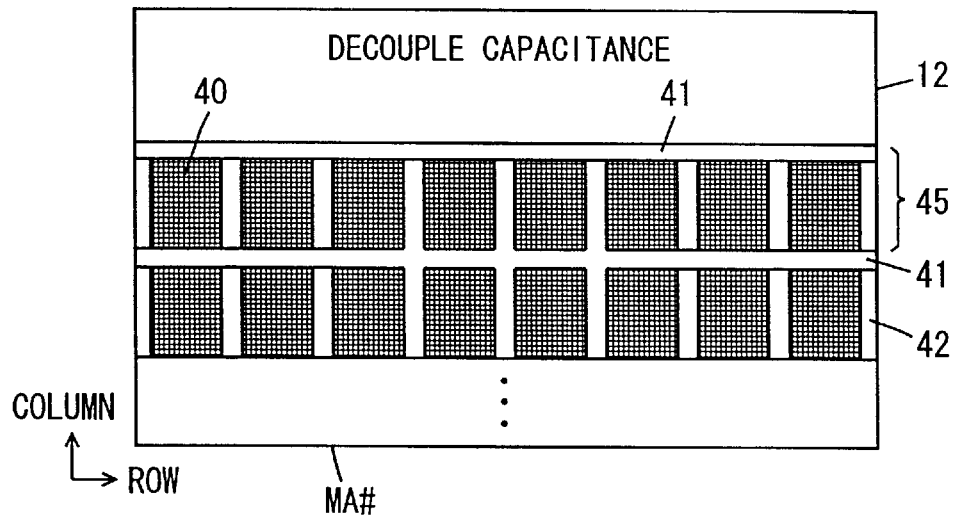
FIG. 24 schematically shows a structure of the memory array shown in FIG. 1.

FIG. 24 schematically shows structures of decouple capacitances 12a and 12b as well as memory arrays MA#0 and MA#1 shown in FIG. 12. Decouple capacitances 12a and 12b have the same structure, and memory arrays MA#0 and MA#1 have the same structure. Therefore, FIG. 24 shows only one decouple capacitance 12 and only one memory array MA#. In memory array MA#, basic arrays 40 each having a storage capacity, e.g., of 128 Kbits are arranged in rows and columns. A sub-word driver band 42 for driving a sub-word line to the selected state is arranged between basic arrays 40 adjacent to each other in the row direction. The word line in this structure has a hierarchical (divided) word line structure, which includes a main word line for transmitting a row select signal from a row decoder and a sub-word line for driving a corresponding memory cell row to the selected state in accordance with a signal on the main word line and a sub-decode signal.

A sense amplifier circuit is arranged between basic arrays adjacent to each other in the column direction. Sense amplifier circuits are arranged aligned in the row direction corresponding to the columns of the basic arrays, respectively. The sense amplifier circuits aligned in the row direction form one sense amplifier band 41. A sense amplifier band 41 and adjacent basic arrays 40 aligned in the row direction form one row block 45. Each row block 45 has a storage capacity of 1 Mbit. In memory array MA#, row blocks 45, of which number is determined corresponding to the storage capacity, are arranged in a repeated fashion. Up to 16 row blocks 45 can be arranged in memory array MA#.

Decouple capacitance 12 is arranged between active unit group and memory array MA#. The decouple capacitance has the structure similar to that shown in FIG. 21. Array power supply voltage VCCS and boosted voltage VPP generated from the active unit group are transmitted over the memory array via the third level aluminum interconnection layer. Therefore, internal voltage transmission lines extending from the active unit group can be connected to internal voltage transmission lines extending over memory array MA# in the region where decouple capacitance 12 is arranged. Accordingly, it is not necessary to provide a special interconnection connecting region.

Figure 25:
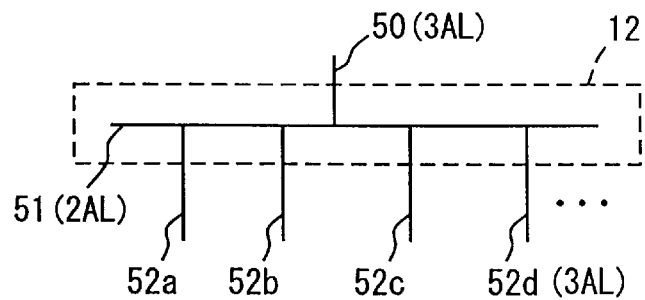
FIG. 25 schematically shows interconnection between power supply lines in a decouple capacitance arrangement region in the first embodiment of the invention.

In the region for arranging decouple capacitance 12, as shown in FIG. 25, a transmission line 50 transmitting the internal voltage from active unit AUP to active unit AUV is connected to a connection interconnection line 51. Connection interconnection line 51 is connected to internal voltage transmission lines 52a–52d, ... extending over the memory array. Voltage transmission lines 50 and 52a–52d are formed of the third level aluminum interconnection layer. Connection interconnection line 51 is formed of the second level aluminum interconnection line. The decouple capacitance is formed of the first and second level aluminum interconnection lines as shown in FIG. 21A. Thus, the connection interconnection line 51 is located above the electrode layer of the decouple capacitance. The region of forming decouple capacitance 12 can be efficiently utilized to provide connection of internal voltage transmission lines, whereby internal voltage transmission lines 52a–52d, ... can be arranged at a predetermined pitch over the memory array. Connection interconnection line 51 is connected to the electrode of the decouple capacitance.

Figure 26:
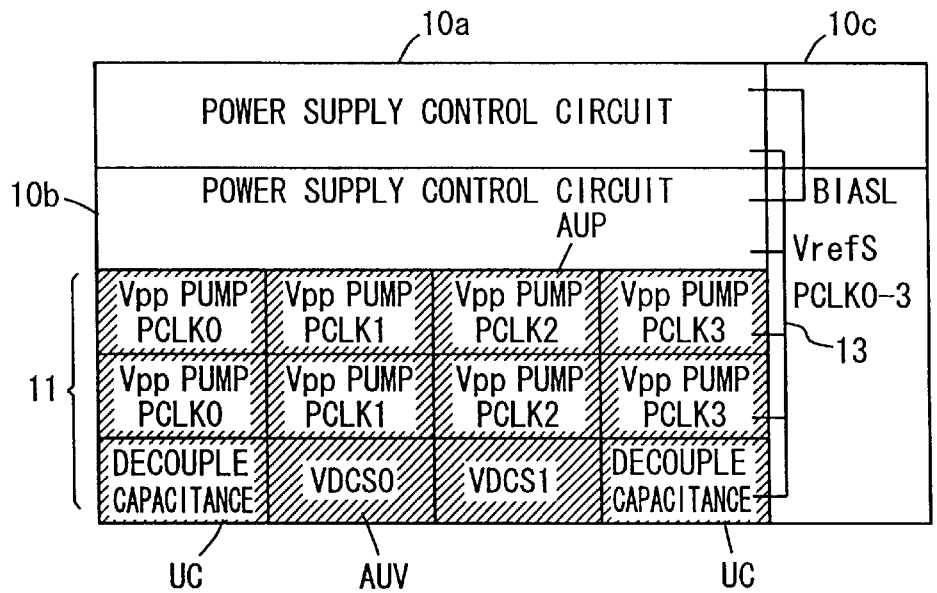
FIG. 26 schematically shows a structure a modification of the power supply circuit in the first embodiment of the invention.

FIG. 26 schematically shows another structure of the DRAM macro. In the case of utilizing already described the active unit group as shown in FIGS. 19 and 22, the DRAM macro has a storage capacity of 32 Mbits, and includes both memory arrays MA#0 and MA#1. In the structure shown in FIG. 26, the number of I/Os (I/O data bits) is equal to half the number of I/Os in the foregoing structures shown in FIGS. 12 and 19. In this case, only one of memory arrays MA#0 and MA#1 is utilized. Accordingly, the number of sense amplifiers (the number of pages) which are simultaneously driven is reduced by half. Thereby, only one of active unit groups is utilized. Active unit group 11 used includes active units AUP forming eight Vpp pumps, and active units AUV forming active array down converters VDCS0 and VDCS1. Capacitance units UC forming the decouple capacitances are arranged on the opposite sides of active units AUV, respectively. Power supply control circuits 10a and 10b are aligned in the column direction. Power supply control circuit 10c is arranged adjacent in the row direction to power supply control circuit 10a, similarly to the structure shown in FIG. 12. Power supply control circuit 10a supplies reference voltage VrefS and bias voltage BIASL to power supply control circuit 10b via signal lines. This structure shown in FIG. 2b differs from that shown in FIG. 12 only in the position and the internal layout of power supply control circuit 10b, and can be easily fitted to change in number of the I/Os.

Figure 27:
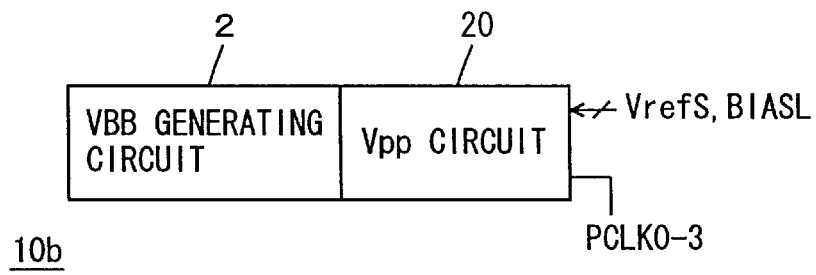
FIG. 27 schematically shows an internal structure of a power supply control circuit shown in FIG. 26.

FIG. 27 schematically shows an internal layout of power supply control circuit 10b shown in FIG. 26. Power supply control circuit 10b shown in FIG. 27 has such an internal layout that Vpp circuit 20 receives and internally transmits bias voltage BIASL and reference voltage Vrefs supplied from power supply control circuit 10a, which is a difference from the internal layouts shown in FIGS. 13 and 14. In power supply control circuit 10b shown in FIG. 27, the internal layout of power supply control circuit 10b shown in FIGS. 13 and 14 is folded back (mirror-symmetrically inverter (reflected)) with respect to an axis (Y axis) between power supply control circuit 10c and Vpp generating circuit 20. Accordingly, no change occurs in relative positional relationship among internal components, and the stability of the circuit operation is ensured.

Since mirror-symmetrical reflection operation is performed merely, and rearrangement of the internal components is not necessary so that the arrangement can be changed easily.

Figure 28:
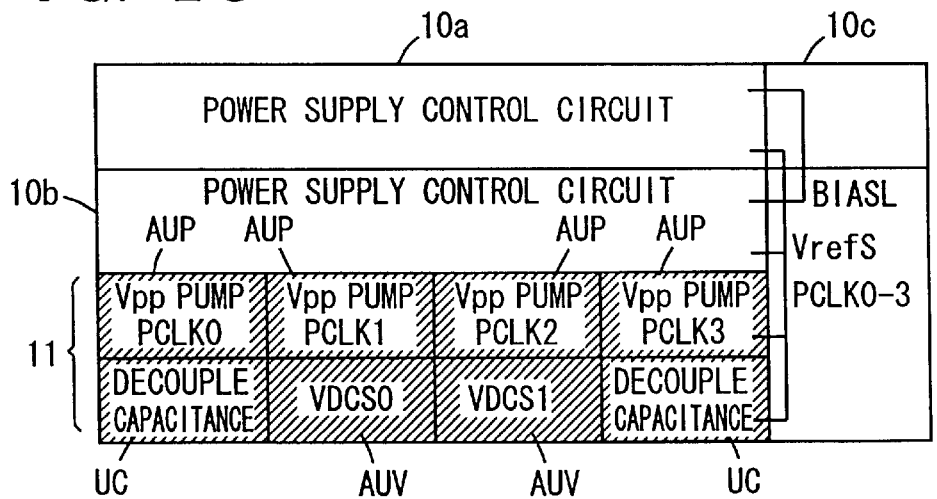
FIG. 28 schematically shows a structure of a modification of the power supply circuit in the first embodiment of the invention.

FIG. 28 shows still another example of the structure of the power supply circuit of the DRAM macro. In the DRAM macro shown in FIG. 28, the number of I/Os is reduced by half and the refresh cycle is increased twice as compared with the DRAM macros shown in FIGS. 12, 19 and 22.

Accordingly, the number of the word lines which are selected simultaneously is reduced by half. Thus, the current consumption caused in boosted voltage VPP in selection of word lines is reduced by half. Therefore, active unit group 11 includes four active units AUP forming Vpp pumps. Since the page size is reduced by half in accordance with reduction in the number of I/Os by half, two active units AUV forming active down converters VDCS0 and VDCS1 are arranged. Capacitance units UC forming the decouple capacitances are arranged on the opposite sides of active units AUV.

In the structure shown in FIG. 28, power supply control circuit 10b has the same internal layout as power supply control circuit 10b shown in FIG. 26. The difference is only that, in active unit group 11, the number of active units AUP forming the Vpp pumps is reduced by half, and this active unit groups 11 can be implemented by merely reducing the number of active units AUP. Thus, the structure of the power supply circuit can be easily changed adaptively to the change in array structure.

Figure 29:
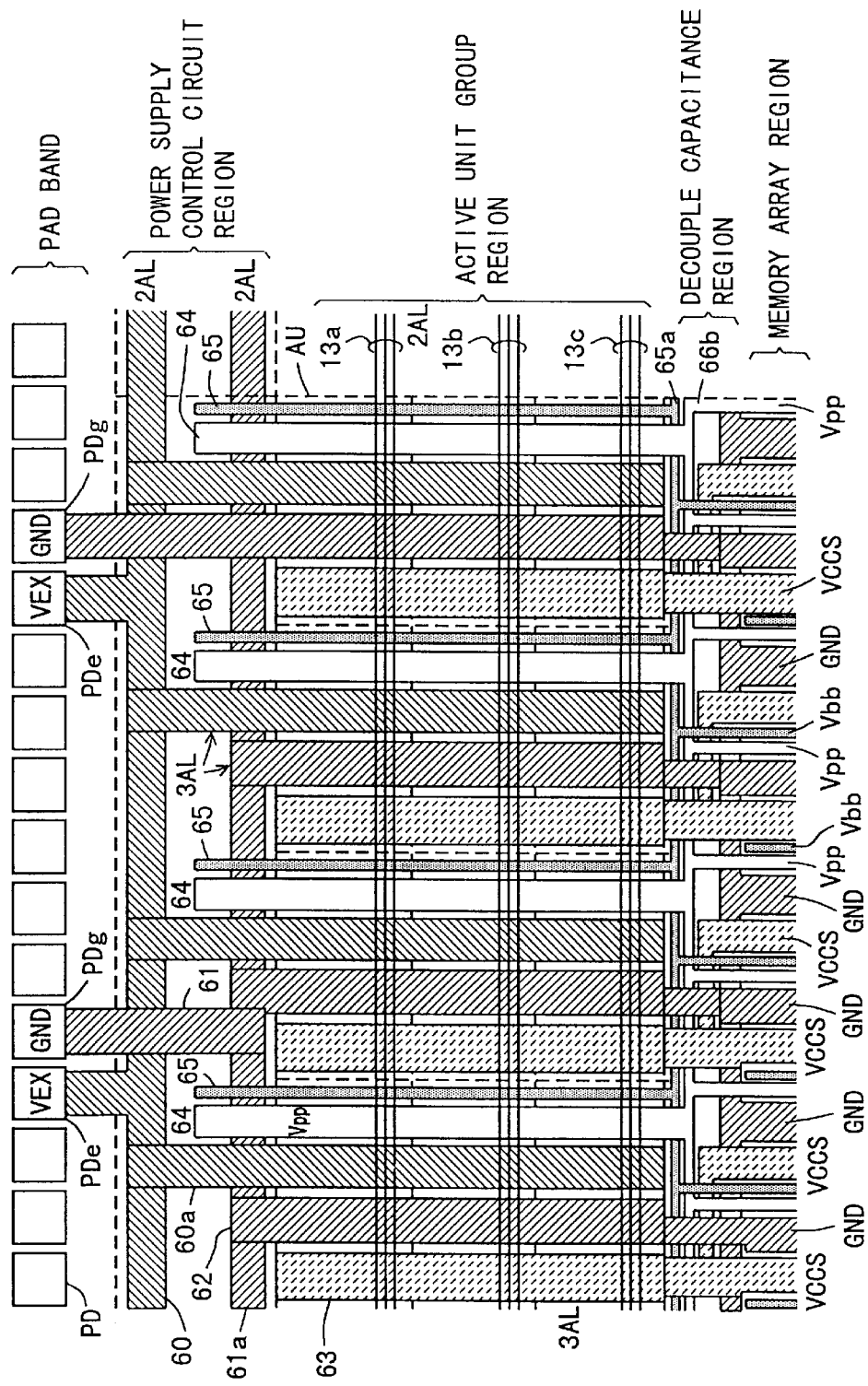
FIG. 29 schematically shows a layout of power supply lines of the power supply circuit in the first embodiment of the invention.

FIG. 29 schematically shows arrangement of the power supply lines for the active unit group. In FIG. 29, a pad band is formed of pads PD arranged aligned to each other. The pad band includes a power supply pad PDe receiving external power supply voltage VEX, and a ground pad PDg receiving ground voltage GND. Power supply pad PDe is connected to an external power supply line 60 formed of the second level aluminum interconnection layer via the third level aluminum interconnection line. External power supply line 60 extends horizontally in the figure over the region of the power supply control circuits. Ground pad PDg is connected to a ground line 61 formed at the third level aluminum interconnection layer, and is connected to an internal ground line 61a extending horizontally over the region of the power supply control circuits and formed of the second level aluminum interconnection layer. The internal ground line 61a is coupled to ground lines 62 extending longitudinally in the figure over the active regions formed of the third level aluminum interconnection layer.

External power supply line 60 is coupled to external power supply lines 60a, which in turn extend longitudinally over the active unit regions of the active unit group, and are arranged parallel to ground lines 62. An internal power supply line 63 is arranged adjacent to each ground line 62, and extends in the vertical direction for transmitting array voltage VCCS. Internal power supply line 63 is formed of the third level aluminum interconnection layer.

In the active unit group region, a negative voltage transmission line 65 made of the third level aluminum interconnection layer extends in the vertical direction in the figure (column direction) over each active unit for transmitting negative voltage VBB, and a boosted voltage transmission line 64 extends over each active unit for transmitting boosted voltage VPP. These negative voltage transmission line 65 and boosted voltage transmission line 64 are coupled, in the decouple capacitance region, to a negative voltage line 65a and a boosted voltage line 66b, respectively, which in turn extend in the horizontal direction and are formed of the second level aluminum interconnection layer. In the decouple capacitance region, a negative voltage line 65a and a boosted voltage line 66b are coupled to negative voltage line Vbb and boosted voltage line Vpp, which in turn are formed of the third level aluminum interconnection layer extending over the memory array region.

In the decouple capacitance region, ground line 62 and internal power supply line 63 are connected to the second level aluminum interconnection layer extending horizontally. This second level aluminum interconnection layer provides connections to array voltage line VCCS and ground line GND, which in turn are formed of the third level aluminum interconnection layer and transmit array power supply voltage VCCS and ground voltage GND to the memory array region, respectively.

In the memory array region, boosted voltage line Vpp, negative voltage line Vbb, ground line GND and array voltage line VCCS are formed of the third level aluminum interconnection layer, and extend in the column direction over the memory array region. In each sense amplifier band of the memory array region, array voltage line VCCS and ground line GND extend in the row direction for supplying the operation power supply voltages to the sense amplifiers in the sense amplifier band. Boosted voltage lines Vpp are provided corresponding to respective sub-word bands, and extend over the memory array region for transmitting boosted voltage Vpp to the main word line drivers and the sub-word line decoder/drivers included in the sub-word band. The sub-word line decoder produces a sub-decode signal for designating one among a set of a plurality of subword lines. Negative voltage line Vbb supplies negative voltage VBB to the well region (substrate region) in each memory array region. The manner of supplying the negative voltage via negative voltage line Vbb in the memory array is appropriately determined in accordance with the structure of the substrate region.

As shown in FIG. 29, signal line groups 13a–13c which are each formed of the second level aluminum interconnection layer and extends in the column direction, is arranged for active units AU (AUV and AUP) and the capacitance units for transmitting frequency-divided signals PCLK0–PCLK3, reference voltage VrefS and array activating signal ACT.

In the vertical direction, negative voltage transmission line transmitting negative voltage VBB, a boosted voltage transmission line for transmitting boosted voltage VPP, a ground line transmitting ground voltage GND an external power supply line transmitting the external power supply voltage and an internal power line transmitting array voltage VCCS are arranged in the same layout in each active unit AU. In the active units arranged aligned in the column direction (vertical direction in the figure), the respective power supply lines are interconnected via segments of the same power supply interconnections lines. Thereby, the layout of the power supply lines can be the same in the respective active units AU.

By arranging the power supply control circuit region neighboring to the pad band, the interconnection resistances of external power supply line 60 and ground line 61 are reduced. By arranging the power supply circuit near the pad band, the interconnection resistance is reduced, and the voltage at a desired level can be stably supplied to an embedded DRAM with a large current consumption.

The lines for negative voltage VBB and boosted voltage VPP extend from the power supply control circuit region, because negative voltage VBB and boosted voltage VPP are produced by the operation of the pump circuit of small pump capacitance for standby in the power supply control circuit region.

According to the first embodiment of the invention, as described above, each of the circuits consuming large currents in operation is configured into cells as an active unit, and has the layout thereof fixed. Therefore, even when the internal circuit structure is to be changed, the design can be easily changed by rearranging the cells, and therefore the power supply circuit layout fitted to the internal array structure can be easily implemented. Further, by utilizing the cellulated active units, these can be applied even to the case where the chip structuring is performed with a module generator. By optimizing the layout of the basic cell, the power supply circuit layout suitable to each array structure can be implemented with the module generator only by entry of the arrangement information of the cells.

In the power supply control circuit portion of the power supply circuit, the relative positions of the internal components are hardly changed so that the stability in noise margin is reliably ensured.

Second Embodiment

FIG. 30 schematically shows a structure of a main portion of a power supply circuit according to a second embodiment of the invention. FIG. 30 shows the structures of VBB generating circuit 2 and VPP generating circuit 4. In VBB generating circuit 2, a by-n-divider 2h is disposed between Vbb pump 2g having a large charge supply capability and fast oscillator 2f. Structures other than the above are the same as those of the VBB generating circuit shown in FIG. 6A. The corresponding portions bear the same reference numerals, and have description thereof not repeated.

In VPP generating circuit 4, a by-n-divider 4h is disposed between fast oscillator 4b and a quad-divider 4d. Structures other than the above are the same as those shown in FIG. 9A, and have description thereof not repeated. These by n-dividers 2h and 4h have dividing ratios determined by metal interconnection lines.

As already described, the VBB generating circuit is required to charge the load capacitance of the P-well of the substrate region of the memory cell array to the predetermined voltage (e.g., −1 V) until the specification time (e.g., 500 $\mu$s) elapses after the power-on. Based on this requirement, the capability (which is proportional to a product of the charge pump capacitance and the frequency of the oscillator) of the VBB generating circuit is determined. The response characteristics of the level detectors 2a and 2d are determined in the similar manner. For reducing the standby current in the level detectors, however, the magnitudes of the currents (i1–i4) are restricted by using intermediate voltage BIASL of about 1 V as already described and shown in FIG. 6B, and the response characteristics of level detectors 2a and 2d are determined by the restricted currents (i1–i4). For satisfying the specification value (e.g., 200 $\mu$A) of the standby current, the current consumption in these level detectors 2a and 2d must be restricted to tens of microamperes or less, and therefore, level detectors 2a and 2d can have response speeds of about 1 $\mu$s at most.

It is now assumed that the size of memory array is reduced to 1/32 times. In this case, the number of row blocks (45) is reduced as already described with reference to FIG. 24 so that the area of P-well decreases to 1/32 times, and the load capacitance driven by VBB generating circuit 2 changes to 1/32 times. Therefore, in the operation of charging the load capacitance to the predetermined voltage level by the VBB generating circuit within 500 $\mu$s, a time in a range from about 15 $\mu$s to about 16 $\mu$s is required until the P-well is stabilized after reaching the predetermined voltage level, because the size of the memory array is reduced to 1/32 times. Accordingly, the voltage on P-well becomes stable within a short time after power-on, if the capability of VBB generating circuit is maintained. In this case, the voltage on P-well may possibly lower to an excessively large extent because the response speeds of level detectors 2a and 2d are slow, and because the charge supply capability of the VBB generating circuit 2 is relatively made large. Description will now be given on the relationship between the array size and the charging time of the VBB generating circuit.

Figure 31A:
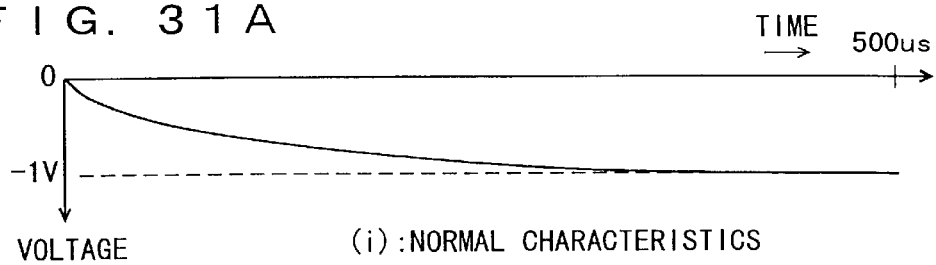
FIGS. 31A–31E are signal waveform diagrams representing an operation of the power supply circuit shown in FIG. 30.

As shown in FIG. 31A, it is now assumed that the VBB generating circuit has a capability of charging the P-well (array substrate region) to the predetermined voltage level of −1.0 V in 500 $\mu$s. In this case, it is also assumed that the array has the storage capacity, e.g., of 32 Mbits.

Figure 31B:
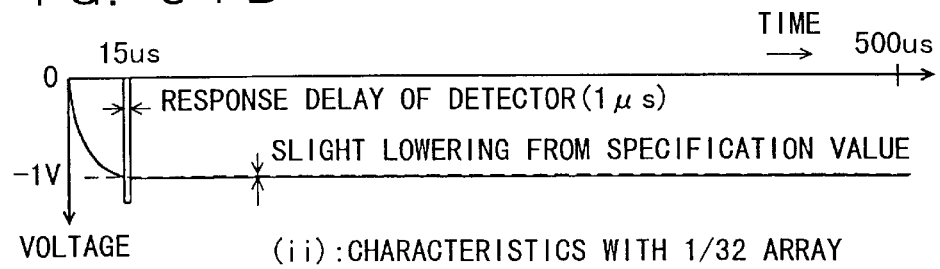

It is now assumed that the storage capacity of the memory array is set to 1 Mbits, and the array area is set to 1/32 times without changing the capability of the VBB generating circuit. In this case, P-well reaches the predetermined voltage of −1 V in about 15 $\mu$s, as shown in FIG. 31B. However, if the level detector has a response delay of about 1 $\mu$s, the voltage level on P-well further lowers from the predetermined voltage (−1 V), and then the pump operation stops in accordance with the output signals of level detectors 2a and 2d after the lowering of the P-well voltage level. Accordingly, the DRAM circuit operates in such a state that the P-well is biased deeper than the predetermined voltage level. When the bias of P-well is deepened, the threshold voltage of the access transistor of the memory cell increases so that problems such as delay in data reading and lowering of the amount of accumulated charges (H-level data) occur.

Figure 31C:
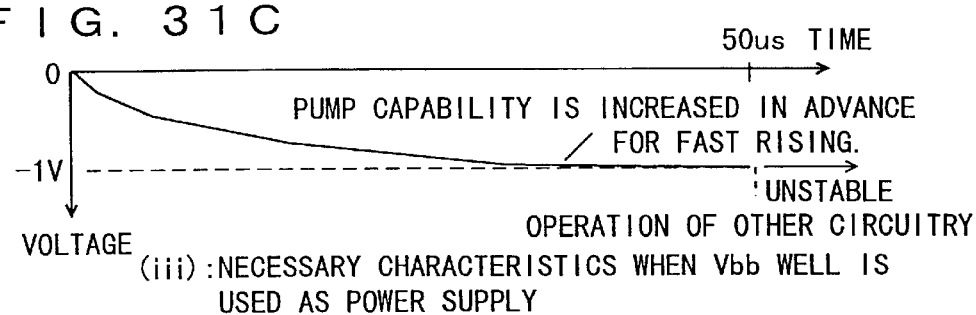

This undershoot amount is not a fatal problem if it is small as shown in FIG. 31B. However, in the case where N-channel MOS transistor forming the power supply circuit receives negative voltage VBB on its back gate (substrate region), the operation characteristics of this N-channel MOS transistor change depending on the negative voltage VBB. Therefore, the power supply circuit except the VBB generating circuit cannot generate a normal voltage until the negative voltage VBB generated from VBB generating circuit attains the stable voltage level. Therefore, in the case where negative voltage VBB is stabilized immediately before or simultaneously with expiration of the specified time (500 $\mu$s), other internal voltage generating circuit cannot stably generate the internal voltages within the specified time (time determined in the specifications: 500 $\mu$s), and therefore the specified value cannot be satisfied Therefore, such a negative voltage generating sequence as shown in FIG. 31C is required in the 32-Mbit structure. According to this sequence, negative voltage VBB is stabilized, e.g., within 50 $\mu$s, and the remaining 450 $\mu$s is used for stabilizing the other internal voltage generating circuits.

Figure 31D:
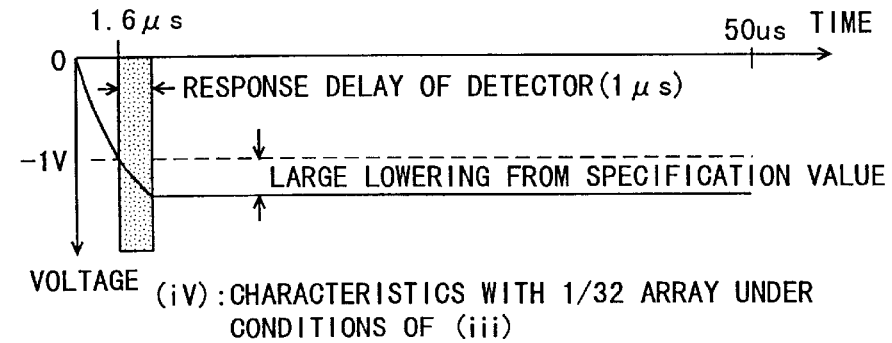

Accordingly, in the case where VBB generating circuit has the capability of supplying negative voltage VBB as shown in FIG. 31C, the VBB generating circuit completes the charging of the P-well within about 1.6 $\mu$s (50/32 $\mu$s) if the array size is reduced to 1/32 times as shown in FIG. 31B. If the response speeds of the level detectors 2a and 2b are not improved, and the level detectors 2a and 2d have the response delays of about 1 ns as shown in FIG. 31D, the voltage level of negative voltage VBB significantly lowers from the set value (−1 V), and the operation characteristics change (the threshold voltage of the MOS transistor changes) due to the response delays of level detectors 2a and 2b because these delays are substantially the same order of the time of 1.6 $\mu$s required for completing the charging operation of the VBB generating circuit.

Figure 31E:
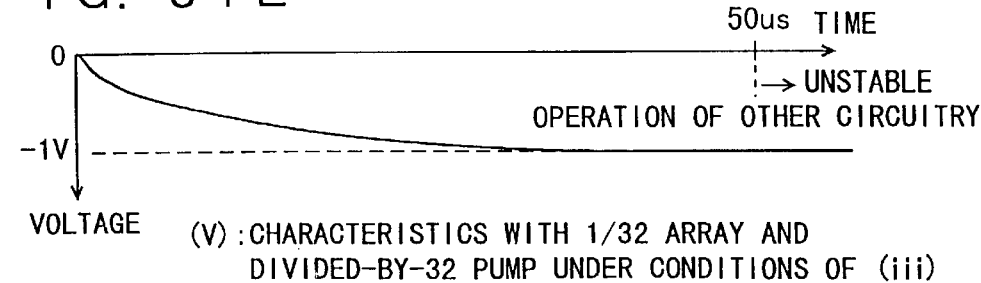

In accordance with the array size, therefore, the dividing factor of by-n-divider 2h shown in FIG. 30 is adjusted so that the output oscillation signal of fast oscillator 2f is frequency-divided for lowering the charge supply capability of Vbb pump 2g having a large charge supply capability. If the array size is reduced to 1/32 times, the output signal of fast oscillator 2f can be frequency-divided by a factor of 32 by-n-divider 2h, whereby the changing characteristics of negative voltage VBB can be completely the same as those in the structure having the maximum size as shown in FIG. 31E. Since the charge supply capability of the Vbb pump is proportional to the frequency of the charge pump operation, the charge supply capability of Vbb pump 2g can be reduced by lowering the charge pump operation frequency.

The same effect can be achieved by the structure, in which pump (Vbb pump 2g) having a large charge supply capability in the VBB generating circuit is configured into the active unit, similarly to the VPP generating circuit, and a required number of such pumps are arranged. However, the current consumption in negative voltage VBB is smaller than that by boosted voltage VPP, and the active pump (Vbb pump 2g) inherently has a small size. In view of these facts, the layout penalty in the maximum structure becomes large if the active pump is further divided into a plurality of units. Accordingly, selection between the structure in which the frequency-divider is utilized and the structure in which the Vbb pump of the large charge supply capability in the VBB generating circuit is configured into the active unit, is performed based on whether the priority is given to prevention of area increase in the maximum size structure or to area reduction in the minimum size structure. When the priority is given to the prevention of the area increase in the maximum size structure, the structure using the frequency-divider is utilized. When the priority is given to the area reduction in the minimum size structure, the active pump (Vbb pump 2g) is configured into the active unit.

Compared with the case of negative voltage VBB, the VPP generating circuit has such a feature that level detectors 4a and 4e have better response speeds of, e.g., tens of nanoseconds (see FIG. 11). Accordingly, the VPP generating circuit does not suffer from a problem related to the charging operation subsequent to the power-on, in contrast to the VBB generating circuit. The VPP generating circuit rather suffers from a problem related to excessive supply of charges in the normal operation. In the VPP generating circuit, each Vpp pump in Vpp pump circuit 4d is cellulated into active units as shown in FIG. 30, and the structure can be adapted to change in memory array structure primarily by changing the number of active units. In the minimum structure, only one active unit is used, four-phase control with frequency-divided signals PCLK0–PCLK3 is stopped, and the active unit is directly driven with one divided signal PCLK generated from quad-divider 4d. Thereby, the charge supply capability of this VPP generating circuit lowers to 1/16 times in accordance with reduction in number of the active unit numbers to 1/16 times. Accordingly, by-n-divider 4h is utilized only when the size of the memory array is reduced. With by-n-divider 4h, the capability of the VPP generating circuit can be reduced to 1/16 or less of the capability of the maximum size structure. Thereby, it is possible to prevent excessive rising of boosted voltage Vpp level due to excessive supply of charges. In particular, the pump capability per active unit can be reduced only to an appropriate extent from the viewpoint of the layout efficiency. Accordingly, it is effective to use additionally the by-n-divider if the array size is small.

Another advantage which can be achieved by addition of by-n-divider 4h to VPP generating circuit 4 is that chips having the same array structure but different applications can be produced. For example, it may be desired to use a chip oriented to a fast operation, as a chip for slow operation and low power consumption. In this case, the following approach may be effective for the chip production in view of the initial cost required for preparing photomasks for producing the chip. The same mask sets are employed for chip manufacturing as far as possible, and different photomasks in a certain metal processing step are used to form a chip into the chip for the low power consumption. In the chip for the low power consumption, the VPP generating circuit can sufficiently operate at a lower frequency than that in the chip for the fast operation (the number of times of word line selection per unit time lowers in the low speed operation), and boosted voltage VPP can be sufficiently and stably generated with a low frequency. Therefore, by-n-divider 4h is arranged in the chip, and the division factor of by-n-divider 4h is changed in the metal step in accordance with an intended operation frequency of the chip.

Figure 32:
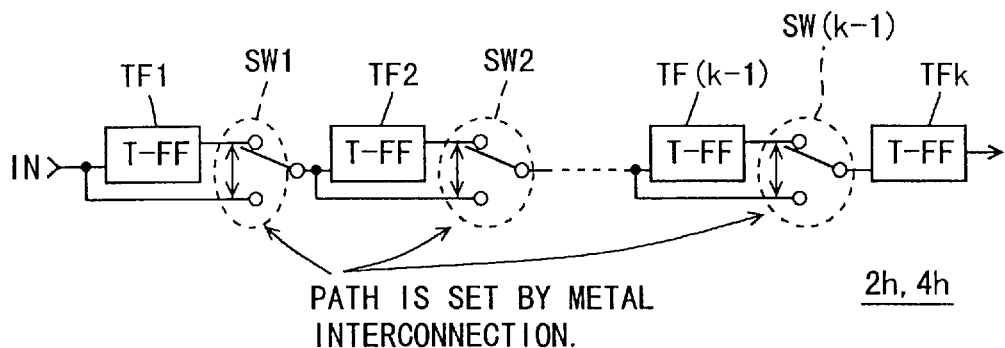
FIG. 32 shows by way of example a structure of a by-n-divider shown in FIG. 30.

FIG. 32 shows by way of example the structures of by-n-dividers 2h and 4h shown in FIG. 30. In FIG. 32, each of n-dividers 2h and 4h includes k T-flip-flops (T-FFs) TF1–TFk as well as switching circuits SW1–SW(k–1) provided at the outputs of T-flip-flops TF–1–TF(k–1) for selecting and transmitting either of the output signals of the corresponding T-flip-flops and the input signals to the T-flip-flops in the next stages, respectively. The selected path in each of switching circuits SW1–SW(k–1) is set by a mask interconnection in the metal step.

Each of T-flip-flops changes its output signal level in response to the rising or falling of input signal IN, and operates as a by-2frequency-divider. Accordingly, by setting the paths of switching circuits SW1–SW(k–1), the number of the T-flip-flops cascaded in each of by-n-dividers 2h and 4h is determined, and thereby the frequency-dividing ratio can be set to a desired value.

According to the second embodiment, as described above, the circuit generating the negative voltage VBB and boosted voltage VPP is provided with a variable frequency-divider disposed in the circuit for driving the active pumps required to supply a large consumption current in operation of an internal circuit. Therefore, the undershoot of negative voltage VBB can be prevented. Also, excessive supply of the charges in boosted voltage VPP can be reduced, and the same chip can be selectively used for a product for fast operation and a product for low current consumption.

Third Embodiment

Figure 33:
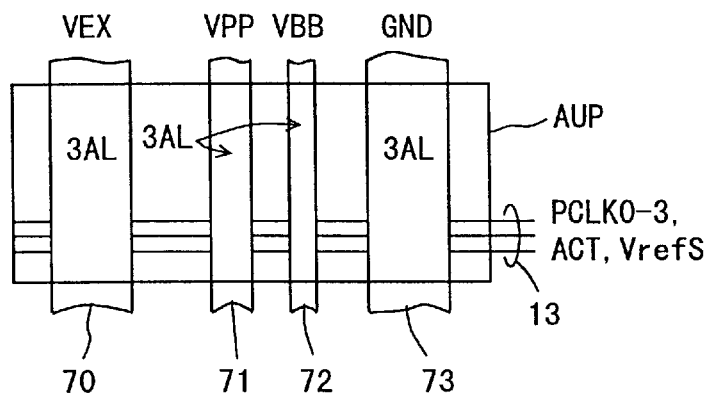
FIG. 33 schematically shows a power supply layout of an active unit of a power supply circuit according to a third embodiment of the invention.

FIG. 33 schematically shows an arrangement of the power supply of active unit AUP of Vpp pump according to a third embodiment of the invention. In FIG. 33, for active unit AUP, a power supply line 70 transmitting external power supply voltage VEX, a boosted voltage transmission line 71 for transmitting boosted voltage VPP, a negative voltage transmission line 72 for transmitting negative voltage VBB and a ground line 73 for transmitting ground potential GND are arranged extending in a vertical direction (column direction) in a third level aluminum interconnection layer (3AL). The second level aluminum interconnection layer is used to provide laterally extending signal line group 13, which transmit frequency-divided signals PCLK0–PCLK3, array activating signal ACT and reference voltage VrefS.

Active unit AUP is not provided with a power supply line for transmitting array voltage VCCS. Since the array power supply line is not necessary, interconnection lines 70–73 can have increased widths so that the interconnection resistances can be reduced, and voltages VEX, VPP, VBB and GND can be transmitted stably.

Figure 34:
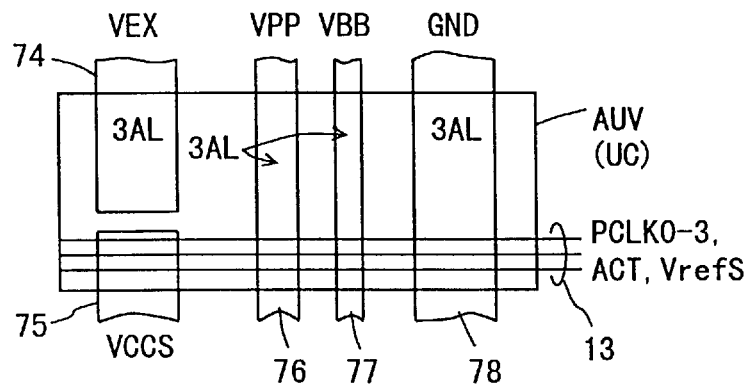
FIG. 34 schematically shows a power supply line layout of the active unit in the third embodiment of the invention.

FIG. 34 schematically shows a power supply arrangement of active unit AUV forming array down converter according to the third embodiment. In FIG. 34, for active unit AUV, in the third level aluminum interconnection layer (3AL), boosted voltage transmission line 76 for transmitting boosted voltage VPP, a negative voltage transmission line 77 for transmitting negative voltage VBB and ground line 78 for transmitting ground voltage GND are arranged extending in the column direction, similarly to active unit AUP.

An external power supply line 74 transmitting external power supply voltage VEX extends in the column direction to an intermediate point in active unit AUV. In the position facing to external power supply line 74, an array power supply line 75 transmitting array voltage VCCS formed of the third level aluminum interconnection layer is arranged. In the lateral direction, signal line group 13 is arranged for transmitting frequency-divided signals PCLK0–PCLK3, array activating signal ACT and reference voltage VrefS. Capacitance unit UC forming the decouple capacitance is provided with a power supply layout, similarly to the foregoing layout for active unit AUV.

In FIG. 34, external power supply line 74 transmitting external power supply voltage VEX is facing to array power supply line 75 transmitting array voltage VCCS. Therefore, the area for disposing the power supply lines can be determined without taking into consideration the line width of array power supply line 75 transmitting array voltage VCCS, and respective interconnection lines 74 and 78 can have increased line widths, as can be done in active unit AUP.

Active unit AUP shown in FIG. 33 and active unit AUV shown in FIG. 34 are configured such that power supply lines 74, 76, 77 and 78 are aligned to interconnection lines 70–73, respectively, when these units are aligned in the longitudinal direction.

Figure 35:
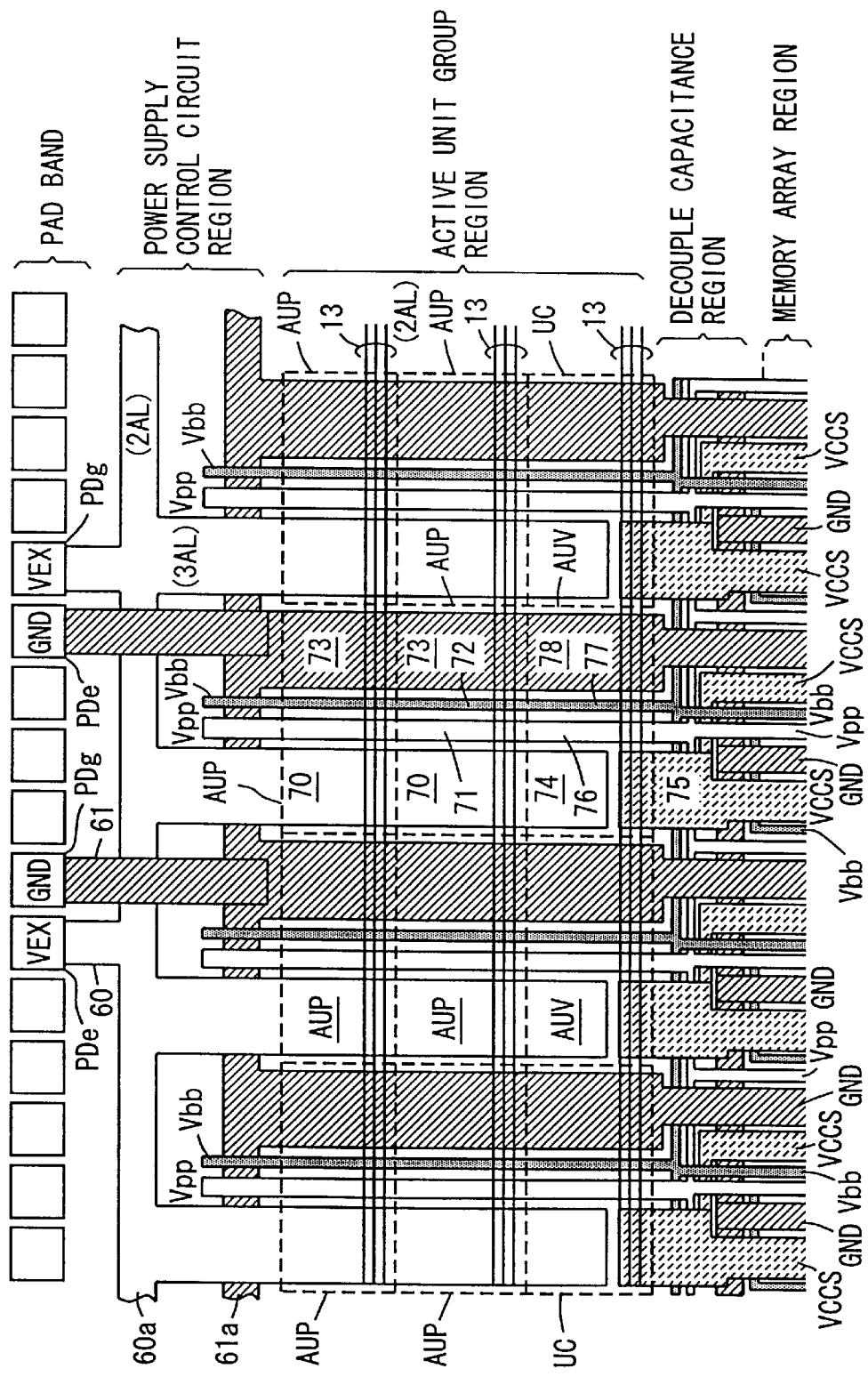
FIG. 35 schematically shows a power supply layout of the power supply circuit according to the third embodiment of the invention.

FIG. 35 shows by way of example the structure of the power supply line arrangement of the power supply circuit according to the third embodiment of the invention. In FIG. 35, eight active units AUV forming Vpp pumps, and two active units AUP forming the array down converters are arranged.

In FIG. 35, the pad band includes power supply pads PDe receiving external power supply voltage VEX and ground pads PDg receiving ground potential GND. Power supply pad PDe and ground pad PDg are coupled to external power supply line 60a and ground line 61a formed of the second level aluminum interconnection layer which in turn extend horizontally (in the row direction) in the power supply control circuit region via power supply line 60 and ground line 61 formed of the third level aluminum interconnection layer, respectively. In the power supply control circuit region, the second level aluminum interconnection layer extends in the horizontal direction (row direction), and the third level aluminum interconnection layer is arranged extending in the vertical direction (column direction).

The region having the active unit group arranged therein contains active units AUP forming the Vpp pumps, active units AUV forming the active down converters and capacitance units UC disposed on the opposite sides of the active units AUV forming the active down converters. The active units AUP and AUV as well as capacitance unit UC employ the same power supply interconnections as those shown in FIGS. 33 and 34. In the active units aligned in the column direction, the power supply line 70 in active unit AUP is aligned to external power supply line 74 in active unit AUV, and external power supply line 74 and array power supply line 75 transmitting the array voltage are aligned to each other facingly in each of active unit AUV and capacitance unit UC.

Likewise, ground line 73, negative voltage transmission line 72 and boosted voltage transmission line 71 in active unit AUP are aligned to ground line 78, negative voltage transmission line 77 and boosted voltage transmission line 76 in active unit AUV or capacitance unit UC, respectively.

These internal voltage transmission lines are coupled to internal power supply line VCCS, ground line GND, negative voltage transmission line Vbb and boosted voltage transmission line Vpp extending over the memory array region via connection lines, which in turn are located in the decouple capacitance arranged region and are formed of the second level aluminum interconnection layer extending horizontally (in the row direction) in the figure, respectively.

According to the structure shown in FIG. 35, the external power supply lines are opposed to the internal power supply lines in the active unit AUV forming the active down converter and capacitance unit UC forming the decouple capacitance, whereby each internal voltage transmission line can have an increased line width and therefore a reduced interconnection resistance so that the voltage at the constant voltage level can be stably supplied to the memory array region without voltage drop and delay in response. Owing to the low interconnection resistance, a voltage can be supplied for rapidly compensating for boosted voltage VPP upon its change, and therefore boosted voltage VPP can be supplied stably.

In the arrangement shown in FIG. 35, active unit AUV forming the active down converter and capacitance unit UC forming the decouple capacitance are merely arranged near the memory array region, and active unit AUP forming the Vpp pump is arranged in the power supply control circuit region and is located near the pad band.

According to the third embodiment, as described above, the unit forming the active down converter and the unit forming the decouple capacitance employ such a power supply line layout that the power supply line transmitting external power supply voltage is arranged facing to the power supply line transmitting the internal power supply voltage. Therefore, each internal voltage transmission line can have an increased line width, and the interconnection resistance can be reduced so that a voltage at the desired voltage level can be stably supplied.

Fourth Embodiment

Figure 36A:
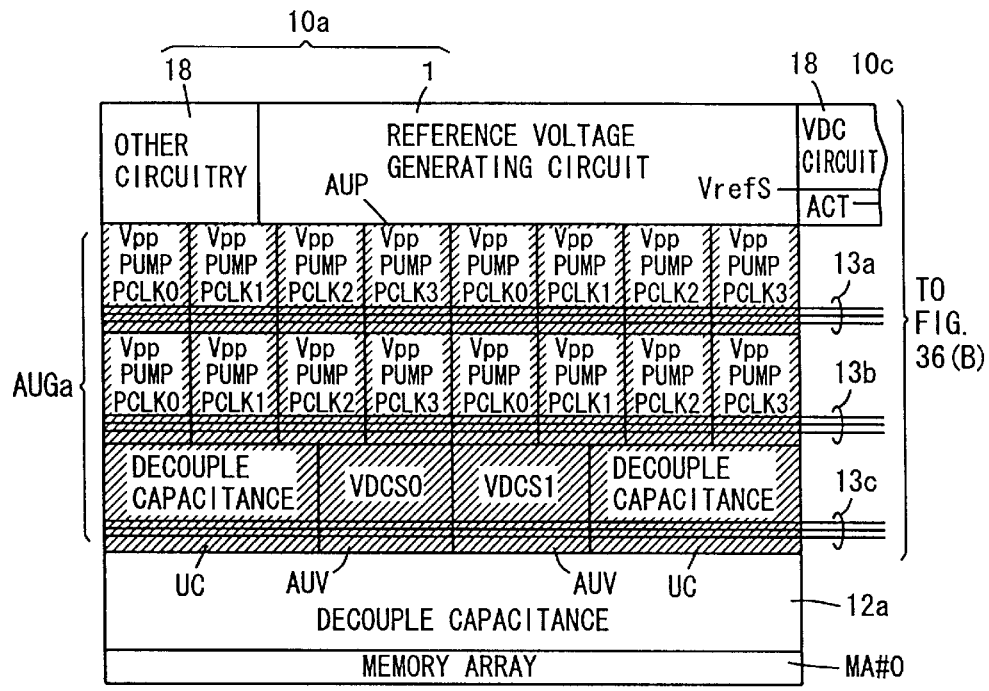
FIGS. 36A and 36B schematically show a structure of a power supply circuit according to a fourth embodiment of the invention.
Figure 36B:
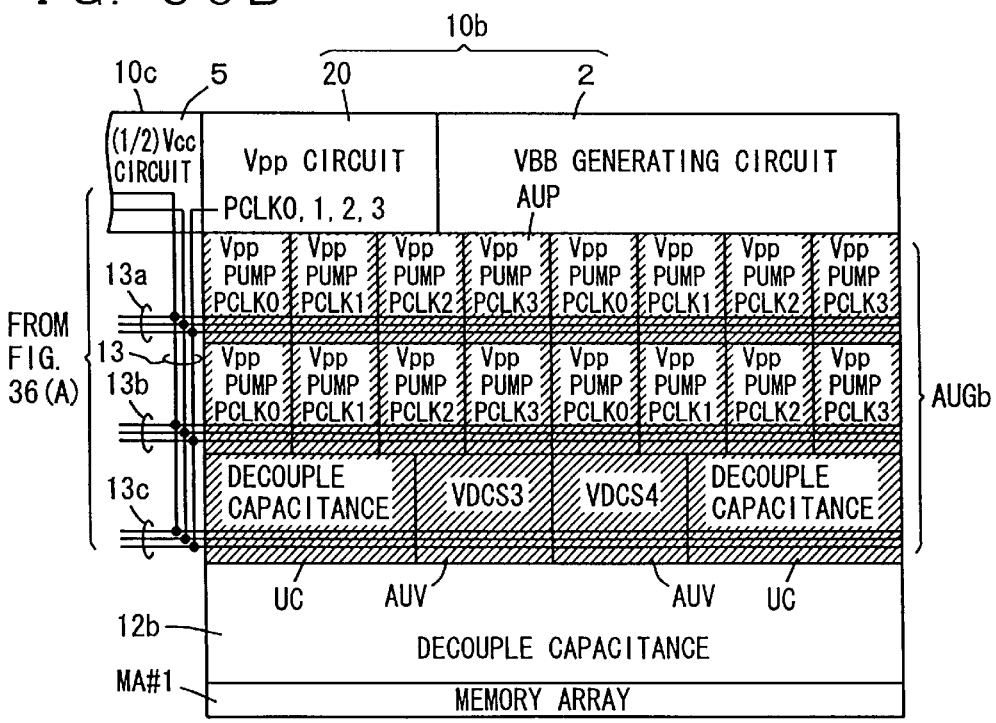

FIGS. 36A and 36B schematically shows a structure of a power supply circuit according to a fourth embodiment of the invention. FIG. 36A shows the structure of the power supply circuit provided for memory array MA#0, and FIG. 36B shows the power supply circuit provided for memory array MA#1. In FIG. 36A, power supply circuit includes power supply control circuit 10a containing reference voltage generating circuit 1 generating reference voltage VrefS and other circuitry 18. Power control circuit 10c including the VDC circuits (the standby down converter and the array activating signal generating circuit) and the intermediate voltage generating circuit are arranged neighboring to power supply control circuit 10a.

An active unit group AUGa and decouple capacitance 12a are aligned to power supply control circuit 10a. Active unit group AUGa includes active units AUP forming the Vpp pumps, respectively, active units AUV forming active down converters VDCS0 and VDSC1, respectively, and capacitance units UC forming the decouple capacitances, respectively. Signal line groups 13a, 13b and 13c extend in the row direction for active units AUP and AUV and unit capacitances UC. Active unit AUP forming the Vpp pumps, active unit AUV forming active down converter VDCS0 or VDSC1, and capacitance unit UC forming the decouple capacitance have different sizes (widths in the row direction), respectively.

In FIG. 36B, power supply control circuit 10b is arranged adjacent to power supply control circuit 10c. Power supply control circuit 10b includes Vpp circuit 20 producing frequency-divided signals PCLK0–PCLK3 for driving the Vpp pumps, and VBB generating circuit 2 generating negative voltage VBB.

Active unit group AUGb and decouple capacitance 12b are arranged aligned to power supply control circuit 10b. Active unit group AUGb likewise includes active units AUP forming the Vpp pumps, respectively, active units AUV forming active down converters VDCS3 and VDSC4, respectively, and capacitance units UC forming the decouple capacitances, respectively. In active unit group AUGb, active unit AUP, active unit AUV and capacitance unit UC have different sizes (widths in the row direction), respectively.

A certain number of capacitance units forming the decouple capacitances are arranged in advance, and the capacitance units may be changed in number in accordance with change in array structure. For the decouple capacitance, however, the capacitance unit must be arranged for achieving a certain capacitance value even in the minimum size array structure. If the capacitance unit has the same size as the other active units, this results in arrangement of the decouple capacitance having an unnecessarily large capacitance value so that the area utilizing efficiency becomes low.

Since a power supply interconnection line cannot be disposed in advance over the active unit (because the power supply line is located at the uppermost layer), the power supply lines (including boosted voltage transmission line and negative voltage transmission line) must be arranged after all the active units are arranged. Depending on the array structure, the layout size might be further reduced.

Figure 37:
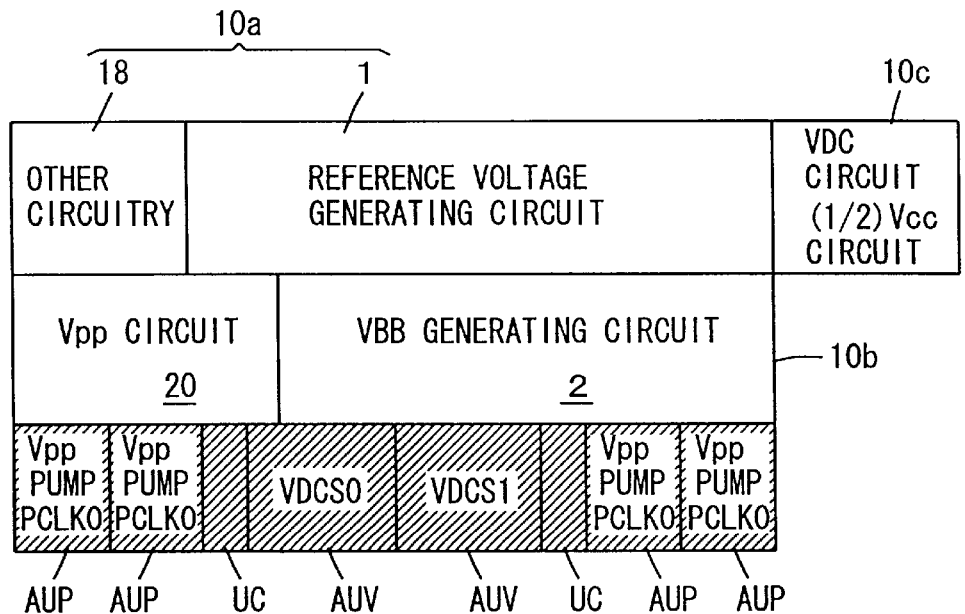
FIG. 37 schematically shows a modification of the power supply circuit according to the fourth embodiment of the invention.

FIG. 37 shows a modification of the array structure. In FIG. 37, the power supply circuit includes power supply control circuits 10a–10c. Power supply control circuit 10a including reference voltage generating circuit 1 and power supply control circuit 10b including VBB generating circuit 2 and Vpp circuit 20 are arranged aligned in the column direction. The active unit band is arranged adjacent to power supply control circuit 10b in the column direction. The active unit band includes active units AUP forming the Vpp pumps, active units AUV forming the active down converters generating the array power supply voltage, and capacitance units UC forming the decouple capacitances, which are arranged aligned in one row.

In the structure shown in FIG. 37, four Vpp pumps and two active down converters are utilized to provide the array structure having a nearly minimum storage capacity. In this case, capacitance unit UC, active unit AUP and active unit AUV may have different sizes, respectively, whereby these active units and the capacitance units can be aligned so that the layout area of the power supply circuit can be reduced. The flexibility in layout of the power supply lines may be slightly reduced, but the structure in which the active units and the capacitance units have different sizes is advantageous for reducing the layout area.

In the structure of the power supply circuit shown in FIG. 37, active unit AUV may have a charge supply capability different from ¼ of that for the maximum size structure. Likewise, active unit AUP may have a charge supply capability different from 1/16 of that for the maximum size structure. Each of active units AUP and AUV is required merely to have a predetermined basic capability.

According to the fourth embodiment of the invention, as described above, the respective kinds of active units have different layout sizes, so that the power supply circuit can have a reduced layout size.

Fifth Embodiment

Figure 38:
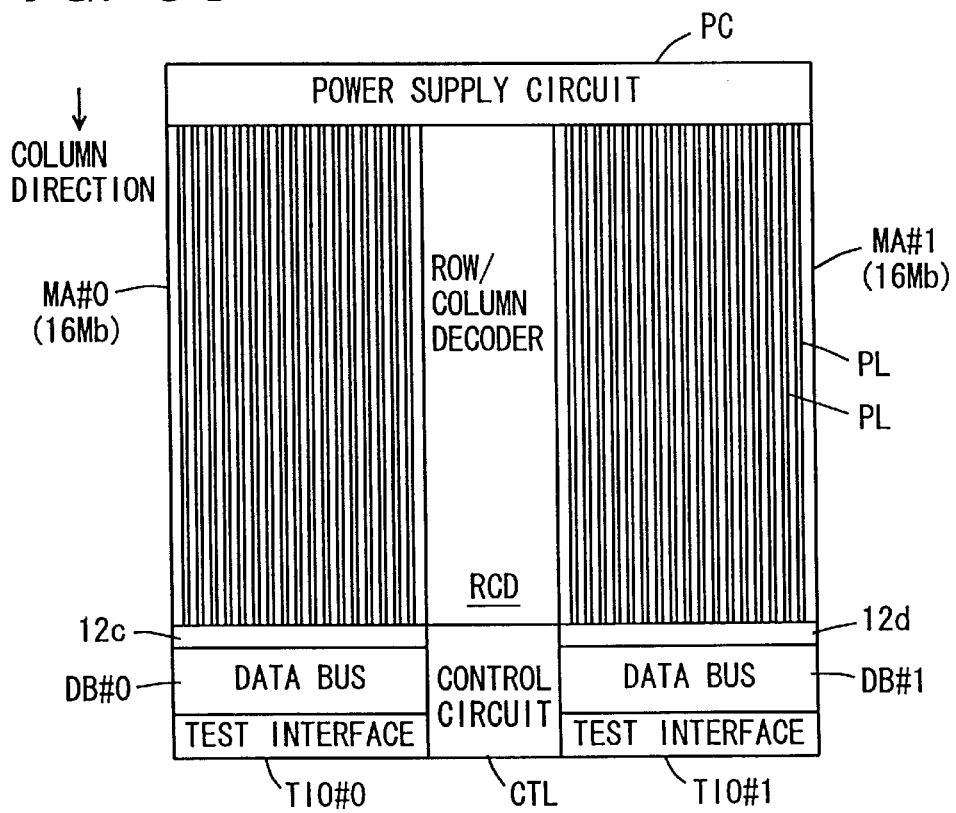
FIG. 38 schematically shows a structure of a semiconductor memory device (DRAM macro) according to a fifth embodiment of the invention.

FIG. 38 schematically shows a whole structure of a semiconductor integrated circuit device according to a fifth embodiment of the invention. In FIG. 38, power supply circuit PC is arranged on one side in the column direction of memory arrays MA#0 and MA#1. Row/column decoder RCD including a row decoder and a column decoder is arranged between memory arrays MA#0 and MA#1. Each of memory arrays MA#0 and MA#1 has a storage capacity of 16 Mbits. Power supply lines PL transmitting the internal voltage from power supply circuit PC extends in the column direction over memory arrays MA#0 and MA#1. These power supply lines PL include power supply lines transmitting array voltage VCCS and ground voltage GND, respectively, and further include voltage transmission lines transmitting boosted voltage VPP and negative voltage VBB, respectively.

Data buses DB#0 and DB#1 as well as test interfaces TIO#0 and TIO#1 are arranged on the side of memory arrays MA#0 and MA#1 remote from power supply circuit PC. Control circuit CTL is arranged in a region between data buses DB#0 and DB#1.

Further, decouple capacitances 12c and 12d for stabilizing the voltages on power supply lines PL are arranged in regions between data bus DB#0 and memory array MA#0 and between data bus DB#1 and memory array MA#1. The internal voltage supplied from power supply circuit PC is transmitted via power supply lines PL over memory arrays MA#0 and MA#1. Therefore, the interconnection resistance of power supply lines PL lowers the voltage level of the internal voltage (or raises the voltage levels of ground voltage GND and negative voltage VBB). For suppressing this voltage level change, decouple capacitances 12c and 12d are arranged in the regions opposed to power supply circuit PC with respect to memory arrays MA#0 and MA#1 for accumulating the charges in these regions. Since decouple capacitances 12c and 12d stably maintain the internal voltage level, the power supply lines PL are supplied with charges from the opposite sides, and thereby have the changes in voltage level thereon due to the interconnection resistance of the internal power supply line PL reliably compensated for.

First Modification

Figure 39:
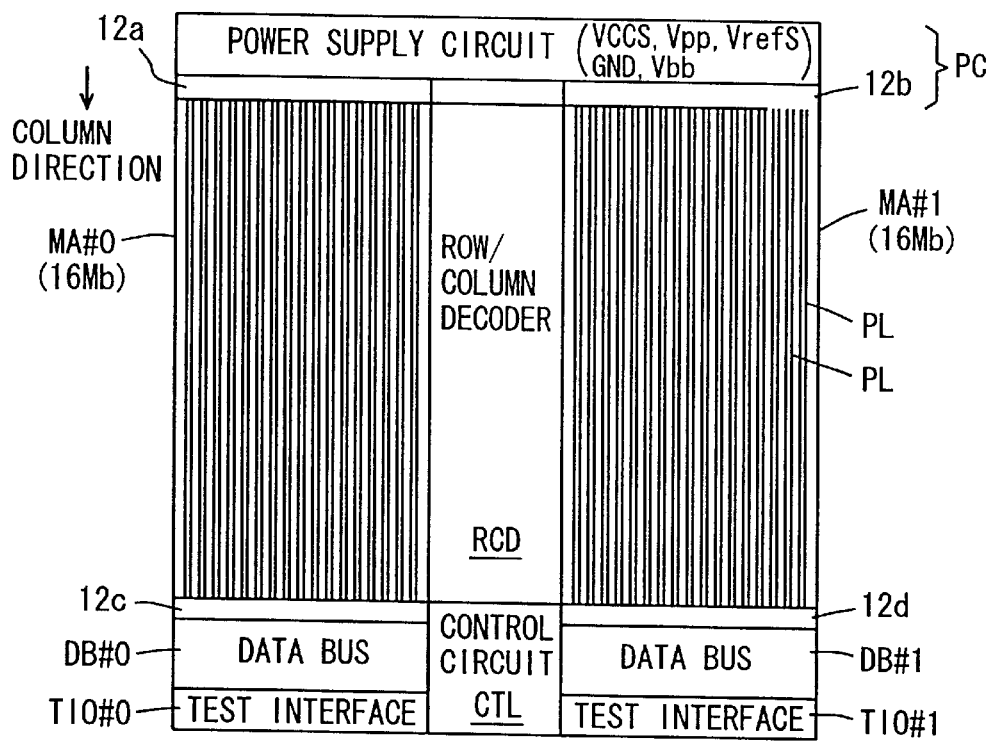
FIG. 39 schematically shows a structure of a modification of the fifth embodiment of the invention.

FIG. 39 schematically shows a structure of a modification of the fifth embodiment of the invention. In the structure shown in FIG. 39, decouple capacitances are arranged on the opposite sides of each of memory arrays MA#0 and MA#1. More specifically, power supply circuit PC is provided with decouple capacitances 12a and 12b arranged corresponding to memory arrays MA#0 and MA#1, respectively, and decouple capacitances 12c and 12d corresponding to memory arrays MA#0 and MA#1, respectively, and arranged opposed to decouple capacitances 12a and 12b, respectively. The combined capacitance value of decouple capacitances 12a and 12c and the combined capacitance capacitance value of decouple capacitances 12b are determined and 12d dependent on the sizes of memory arrays MA#0 and MA#1, respectively.

As shown in FIG. 39, decouple capacitances 12a–12d are arranged on the opposite sides, in the column direction, of memory arrays MA#0 and MA#1. Thereby, the voltages on the opposite ends of power supply lines PL can be made stable, and it is possible to suppress voltage-drop (level change) on power supply lines PL extending in the column direction over memory arrays MA#0 and MA#1.

Accordingly, the internal voltages can be stably maintained at the predetermined voltage levels.

According to the fifth embodiment, since the decouple capacitance is arranged opposed to the power supply circuit with respect to the memory arrays, as described above, it is possible to suppress the level change of the internal voltages caused by the interconnection resistance of the power supply lines (internal voltage transmission lines) extending in the column direction over the memory arrays, and thereby the internal voltages can be stably maintained at the desired voltage levels.

Sixth Embodiment

Figure 40:
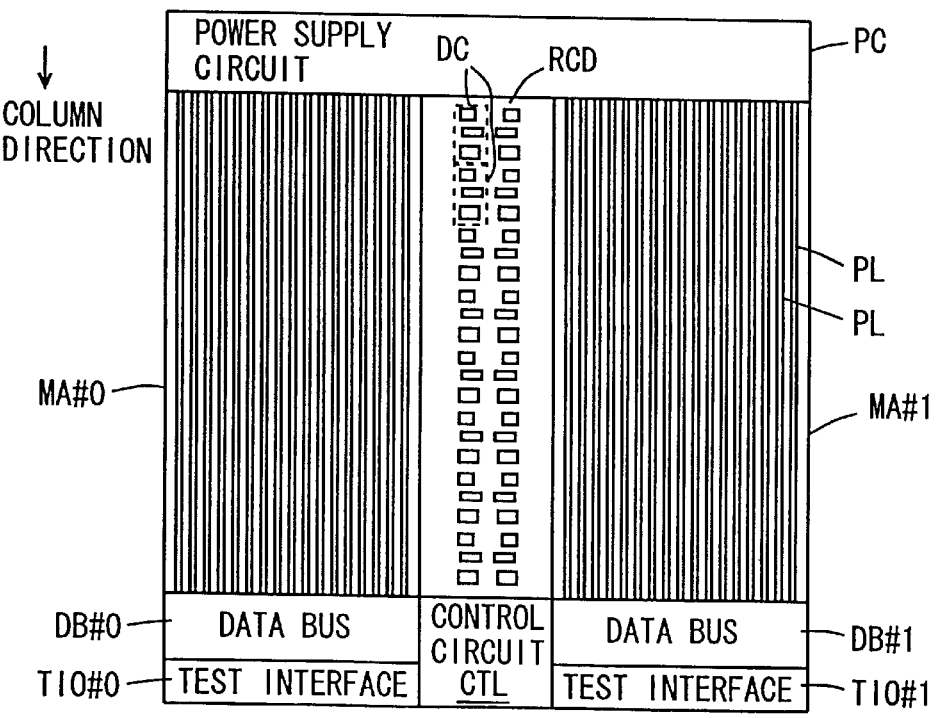
FIG. 40 schematically shows a structure of a DRAM macro according to a sixth embodiment of the invention.

FIG. 40 schematically shows a whole structure of a semiconductor integrated circuit device according to a sixth embodiment of the invention. In the structure shown in FIG. 40, decouple capacitance elements DC utilizig MOS transistors as components are arranged in a dispersed fashion on a region of row/column decoder RCD between memory arrays MA#0 and MA#1. Decouple capacitance elements DC may be used for stabilizing boosted voltage VPP, or may be coupled via internal voltage transmission lines extending in the row direction to power supply lines PL extending in the column direction over memory arrays MA#0 and MA#1 for stabilizing a voltage on power supply lines PL. Decouple capacitance elements DC are disposed utilizing an empty region under the metal interconnection layer within the region of row/column decoder RCD. Power supply circuit PC, data buses DB#0 and DB#1, and test interface TIO#0 and TIO#1 have the same structures as those shown in FIG. 1, the corresponding portions bear the same reference numerals, and have the description thereof not repeated.

First Modification

Figure 41:
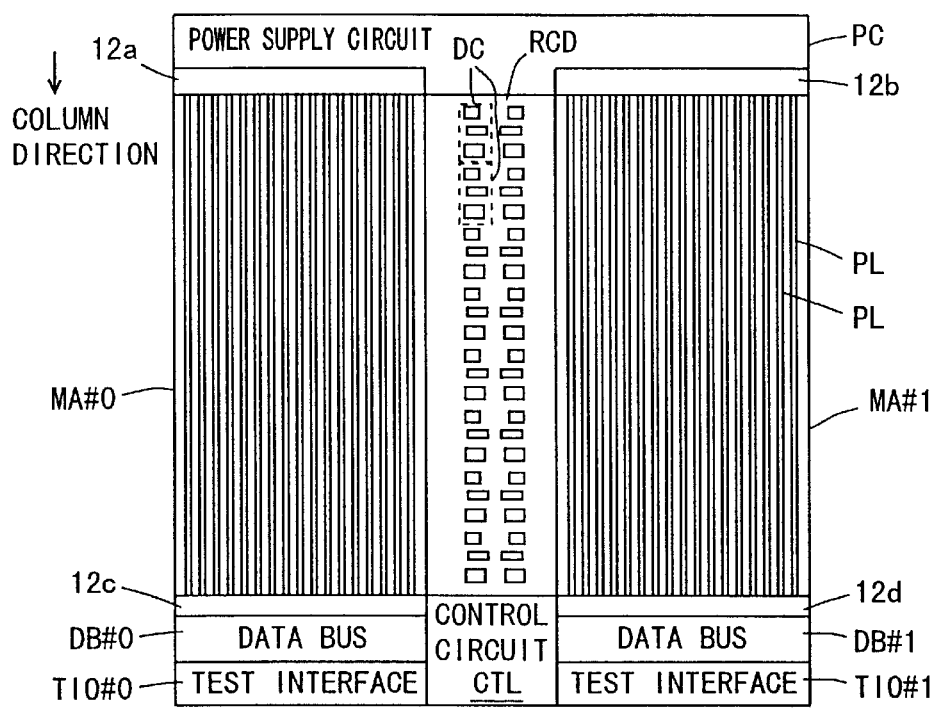
FIG. 41 schematically shows a structure of a modification of the sixth embodiment of the invention.

FIG. 41 schematically shows a structure of a modification of the sixth embodiment of the invention. In the structure shown in FIG. 41, decouple capacitances 12a and 12c are arranged on the opposite sides, in the column direction, of memory array MA#0, and decouple capacitances 12b and 12d are arranged on the opposite sides, in the column direction, of memory array MA#1. Structures other than the above are the same as those shown in FIG. 40. In this structure, the decouple capacitances are arranged on the opposite sides of memory arrays MA#0 and MA#1, and decouple capacitances DC are dispersed on the region of row/column decoder RCD, whereby the voltages on power supply lines PL can be stabilized more efficiently.

Figure 42:
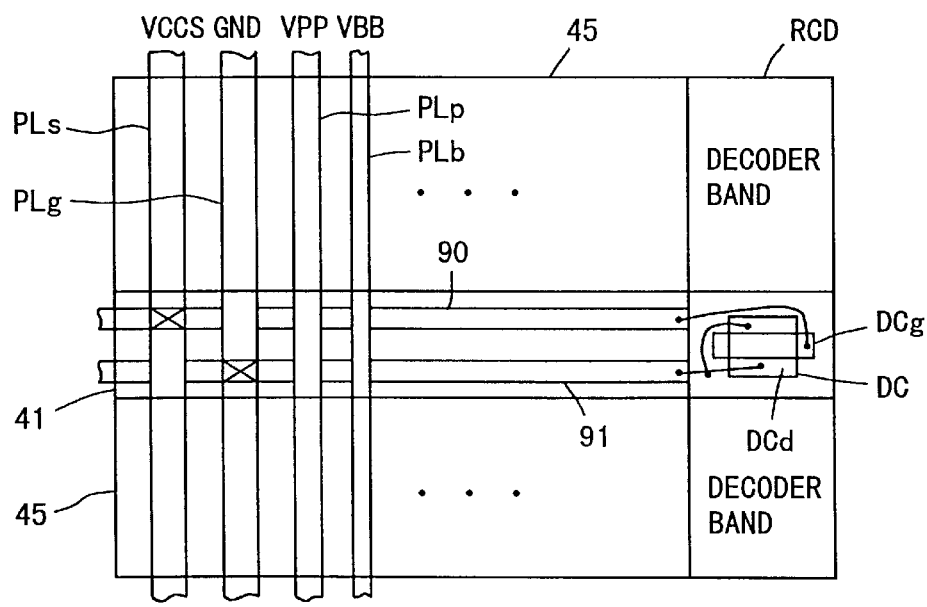
FIG. 42 schematically shows connection between a decouple capacitance element and a power supply line in the sixth embodiment of the invention.

FIG. 42 shows a specific example of arrangement of decouple capacitance element DC in the sixth embodiment of the invention. In FIG. 42, voltage transmission lines PLs, PLg PLp and PLb transmitting array voltage VCCS, ground voltage GND, boosted voltage VPP and negative voltage VBB, respectively, are formed of, e.g., the third level aluminum interconnection layer, extending in the column direction over row blocks 45.

Sense amplifier band 41 is arranged between row blocks 45, and includes sense amplifier circuits corresponding to the respective columns of row blocks 45.

In sense amplifier band 41, sense power supply lines 90 and 91 formed of, e.g., the first level aluminum interconnection layer are arranged extending in the row direction. Sense power supply lines 90 and 91 are coupled to array voltage transmission line PLs and ground voltage transmission line PLg, respectively. Decouple capacitance element DC is arranged in the region of row/column decoder RCD. Decouple capacitance element DC is formed of a MOS transistor, and has a gate electrode layer DCg connected to sense power supply line 90 and a diffusion layer DCd connected to a sense ground line 91. Sense power supply lines 90 and 91 supply the power supply voltages to the sense amplifier circuits included in sense amplifier band 41, and have low resistances. Accordingly, by coupling decouple capacitance elements DC, which are arbitrary in number, to sense amplifier power supply lines 90 and 91, the sense power supply voltages can be stabilized. In particular, sense power supply lines 90 and 91 have low resistances, and decouple capacitance elements DC can rapidly supply charges when the voltage changes. Thus, the voltages on sense power supply lines 90 and 91 can be reliably stabilized.

In the sixth embodiment, if decouple capacitance elements DC are dispersed in the region of row/column decoder RCD, boosted voltage VPP and negative voltage VBB may be handled as the voltages to be stabilized. If boosted voltage VPP is supplied along the sub-word driver band (see FIG. 24), decouple capacitance elements DC for stabilizing boosted voltage VPP may be arranged in the region between sub-word driver bands.

In such a case that memory arrays MA#0 and MA#1 are provided with the internal voltage transmission lines extending in the row and column directions and the internal voltage transmission lines in the row direction have a low impedance connection of the dispersedly arranged decouple capacitance elements DC would stabilize the voltage on the internal voltage transmission lines in the row direction (if the resistance is high, the resistance causes change in voltage level upon supplying the charges, so that the voltage can be stabilized only at the vicinity of the decouple capacitance element).

According to the sixth embodiment of the invention, as described above, the decouple capacitance elements are arranged dispersedly on the region of row/column decoder RCD so that the internal voltage transmission lines connected between the decouple capacitance elements can be short so that the voltages on the internal voltage transmission line can be further stabilized.

Seventh Embodiment

Figure 43:
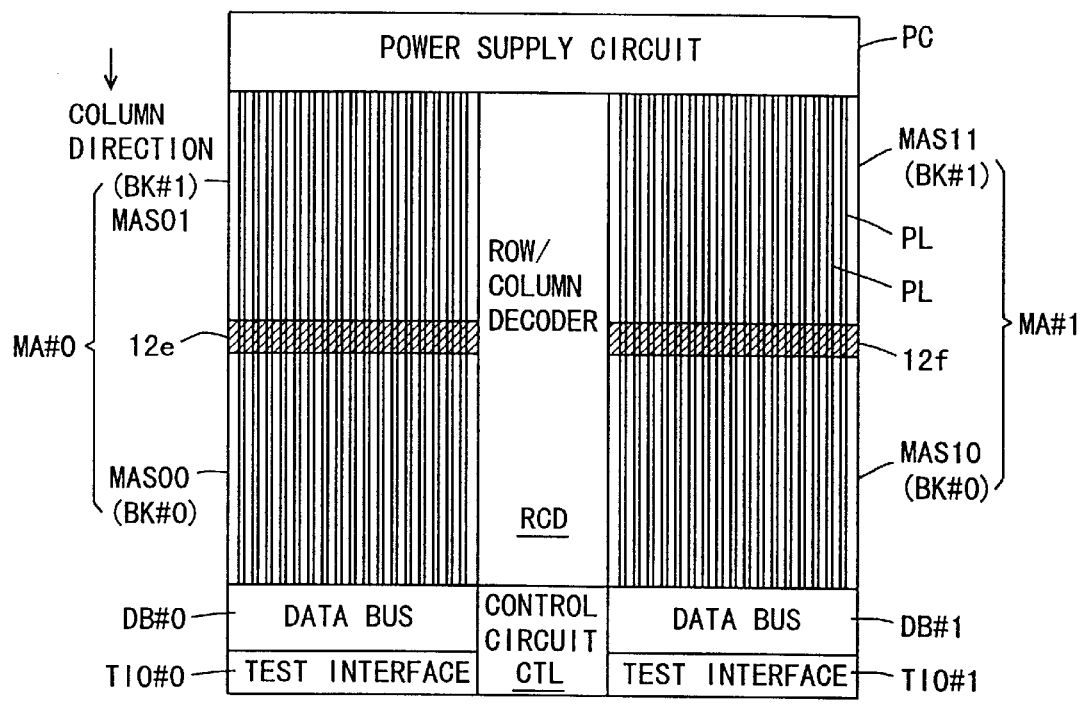
FIG. 43 schematically shows a whole structure of a DRAM macro according to a seventh embodiment of the invention.

FIG. 43 schematically shows a whole structure of a semiconductor integrated circuit device according to a seventh embodiment of the invention. In the structure shown in FIG. 43, memory array MA#0 is divided into two memory sub-arrays MAS01 and MAS00, and memory array MA#1 is likewise divided into two memory sub-arrays MAS11 and MAS10. Memory sub-arrays MAS01 and MAS11 form a bank BK#1, and memory sub-arrays MAS00 and MSA10 form a bank BK#0. Decouple capacitances 12e and 12f are disposed in the boundary region between banks BK#0 and BK#1. Structures other than the above are the same as those shown in FIG. 1, the corresponding portions bear the same reference characters and have the description thereof not repeated.

In the structure of the bank structure shown in FIG. 43, internal voltage transmission lines PL transmitting the internal voltages from power supply circuit PC extend in the column direction over memory arrays MA#0 and MA#1. The bank boundary regions are located at substantially central regions, in the column direction, of memory arrays MA#0 and MA#1, and decouple capacitances 12e and 12f are disposed in the central regions.

Figure 44:
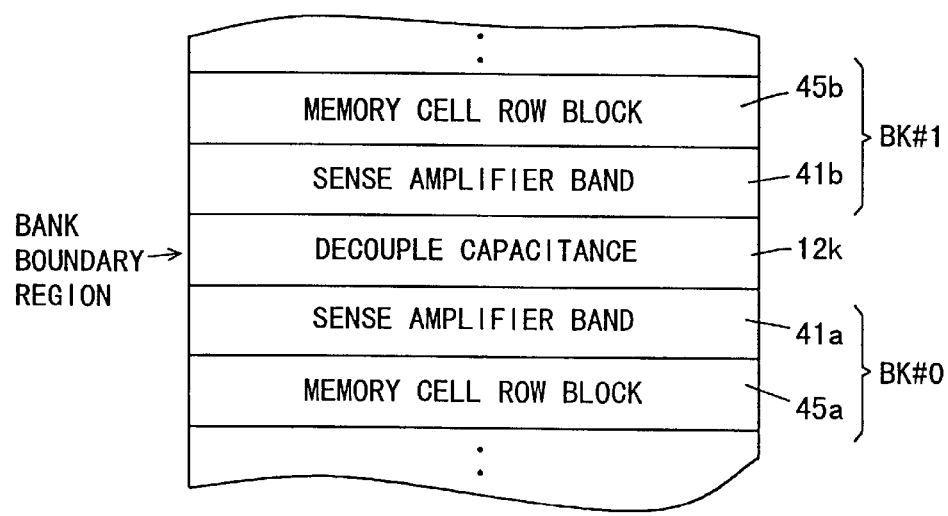
FIG. 44 schematically shows a structure near a bank boundary region of the DRAM macro shown in FIG. 43.

FIG. 44 schematically shows a structure of the bank boundary region. Bank BK#1 includes a sense amplifier band 41*b* and a memory cell array (row block) 45*b* adjacent to sense amplifier band 41*b*. Bank BK#0 includes a sense amplifier band 41*a* and a memory cell array (row block) 45*a* adjacent to sense amplifier band 41*a*. Banks BK#0 and BK#1 can have memory cell rows driven to the selected state independently of each other. Therefore, for independent driving of sense amplifier bands 41*b* and 41*a*, sense amplifier bands 41*b* and 41*a* are individually provided for memory cell row blocks 45*b* and 45*a* included in banks BK#1 and BK#0, respectively. Decouple capacitance 12*k* (12*e*, 12*f*) is disposed in the bank boundary region between sense amplifier bands 41*b* and 41*a*. Since the decouple capacitance for stabilization is disposed in substantially central region, in the column direction, of the internal voltage transmission lines (power supply lines) PL, the voltage change on internal voltage transmission lines PL can be suppressed.

Modification

Figure 45:
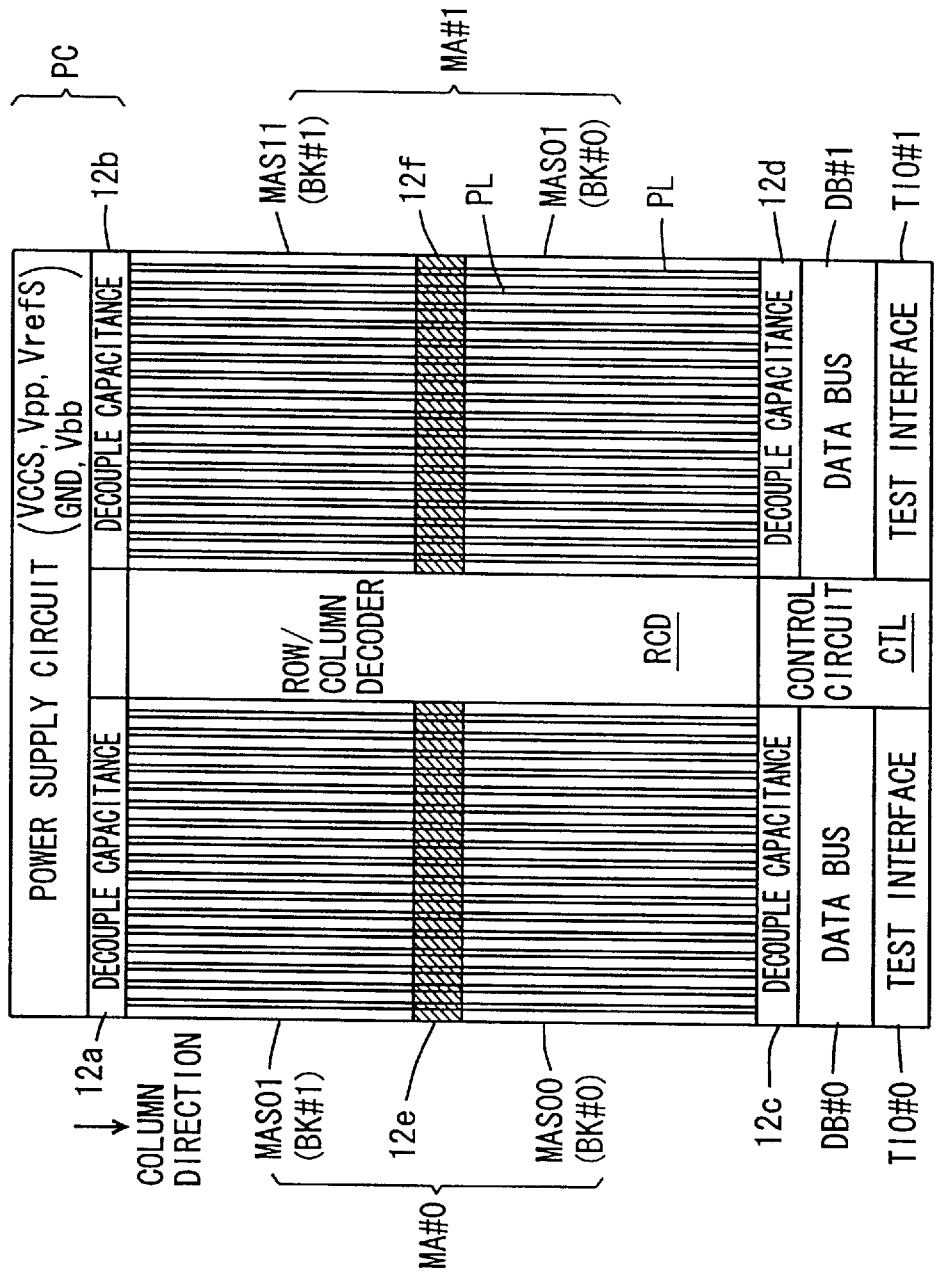
FIG. 45 schematically shows a structure of a modification of the seventh embodiment of the invention.

FIG. 45 schematically shows a structure of a modification of the seventh embodiment of the invention. In the structure shown in FIG. 45, decouple capacitances 12*a* and 12*c* are arranged on the opposite sides, in the column direction, of memory array MA#0. Memory array MA#0 is divided into memory sub-arrays MAS01 and MAS00 to form banks BK#1 and BK#0, respectively. Decouple capacitance 12*e* is disposed in the boundary region between banks BK#0 and BK#1.

Likewise, decouple capacitances 12*b* and 12*d* are arranged on the opposite sides, in the column direction, of memory array MA#1. Memory array MA#1 is divided into memory sub-arrays MAS11 and MAS01 to form banks BK#1 and BK#0, respectively. Decouple capacitance 12*f* for memory array MA#1 is disposed in the boundary region between banks BK#0 and BK#1.

According to the structure shown in FIG. 45, since the decouple capacitances are arranged on the opposite ends and the central portion of internal voltage transmission line PL, the internal voltage transmitted through internal voltage transmission line PL can be stabilized more effectively. In this case, the total capacitance value of decouple capacitances 12*a*, 12*e* and 12*c* as well as the total capacitance value of decouple capacitances 12*b*, 12*f* and 12*d* are set to be equal to the capacitance values of the decouple capacitances required in accordance with the memory array structure, respectively. Even if the decouple capacitances have the same capacitance value, the decouple capacitances are disposed in the dispersed positions, i.e., on the opposite ends and the central portion of the internal voltage transmission line so that voltage change on the internal voltage transmission line can be reliably suppressed, and the internal voltage at a desired voltage level can be stably transmitted.

According to the seventh embodiment of the invention, as described above, in the bank structure the decouple capacitances are disposed in the bank boundary region. Therefore, the internal voltage transmission line between the power supply circuit and the decouple capacitance can be short so that the voltage level change on the internal voltage transmission line can be suppressed, and the internal voltage at a desired voltage level can be stably transmitted.

Eighth Embodiment

Figure 46:
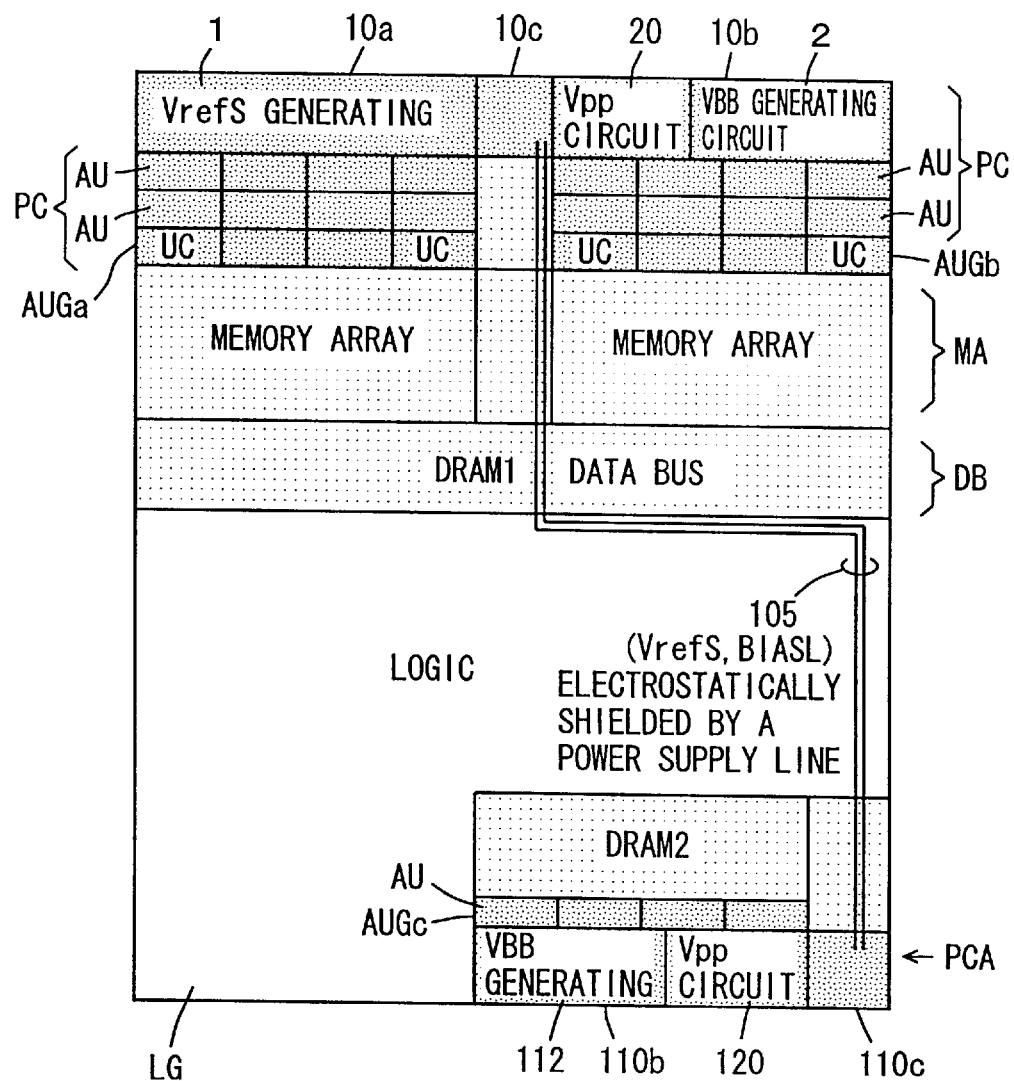
FIG. 46 schematically shows a structure of a power supply circuit according to an eighth embodiment of the invention.
Figure 47:
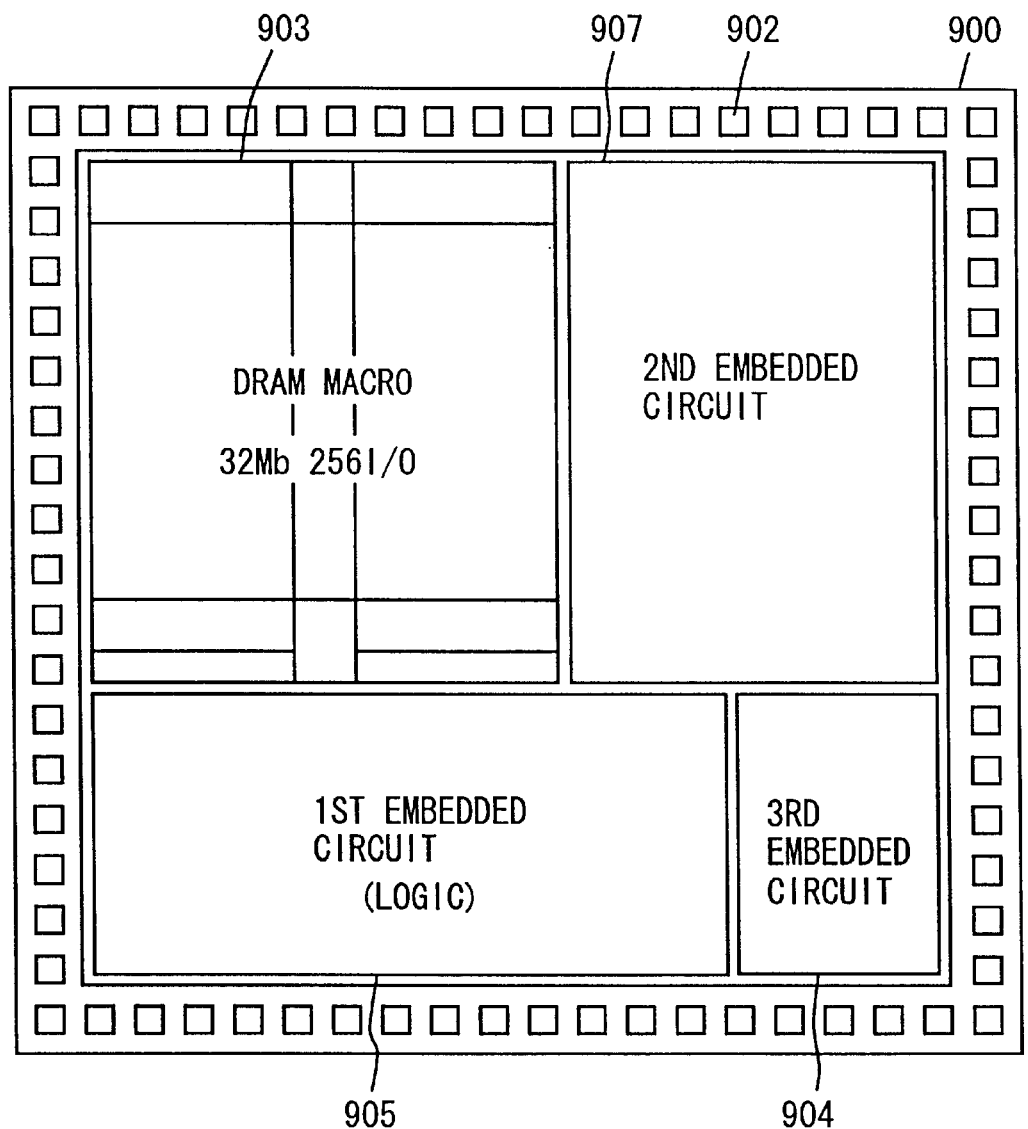
FIG. 47 schematically shows a whole structure of a semiconductor integrated circuit device in the prior art.
Figure 48:
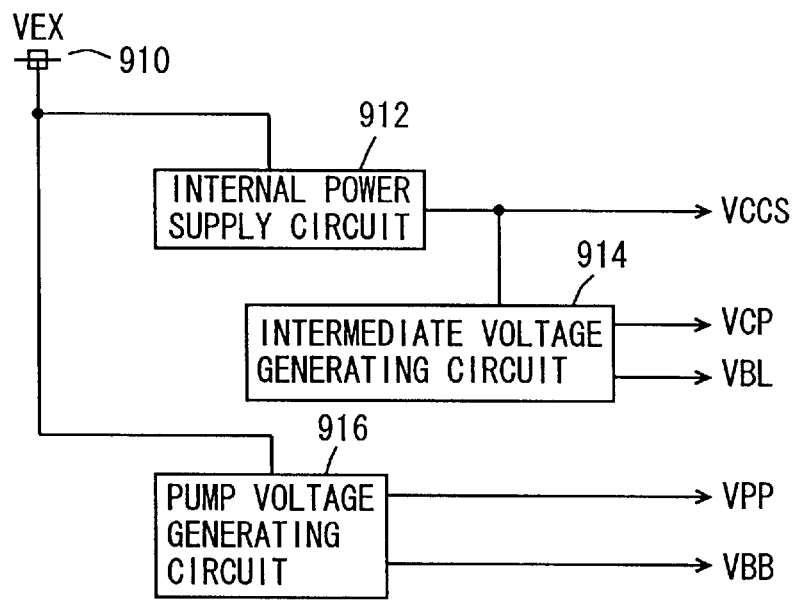
FIG. 48 schematically shows a structure of an internal voltage generating portion of a DRAM macro shown in FIG. 47.
Figure 49:
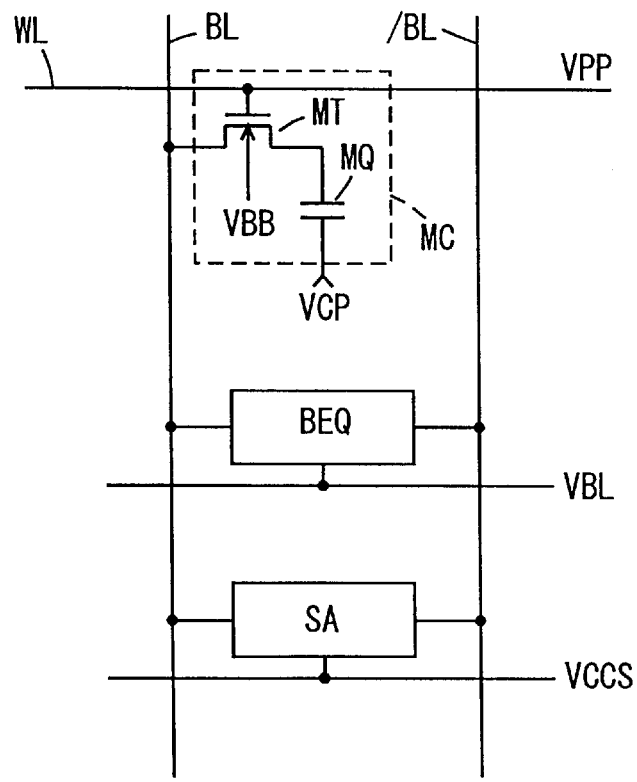
FIG. 49 schematically shows a structure of a portion receiving an internal voltage shown in FIG. 48.

FIG. 46 schematically shows a whole structure of a semiconductor integrated circuit device according to an eighth embodiment of the invention. In FIG. 46, the semiconductor integrated circuit device has two memories DRAM1 and DRAM2 as well as a logic LG transmitting data to and from memories DRAM1 and DRAM2, provided on a single chip.

Power supply circuit PC is arranged for memory DRAM1, and power supply circuit PCA is arranged for memory DRAM2. Power supply circuit PC of memory DRAM1 includes power supply control circuits 10*a*, 10*b* and 10*c*. First power supply control circuit 10*a* includes reference voltage generating circuit (VrefS generating circuit) 1 generating reference voltage VrefS and bias voltage BIASL. Second power supply control circuit 10*b* includes VBB generating circuit 2 generating negative voltage VBB, and Vpp circuit 20 generating frequency-divided signals for driving the pump circuit producing boosted voltage VPP during standby and the Vpp pump of the active unit. Power supply control circuit 10*c* includes a DVC circuit including the circuit generating the array activating signal and the standby down converter, and also includes an intermediate voltage generating circuit (VCC/2 generating circuit) generating intermediate voltages VBL and VCP. The structures of these power supply control circuits are the same as those already described in connection with the first embodiment.

Power supply circuit PC further includes active unit groups AUGa and AUGb including active units AU. Active unit groups AUGa and AUGb also include capacitance units UC. These active unit groups AUGa and AUGb employ the same structure as that of any one of the first to fourth embodiments already described. Accordingly, different kinds of active units AU may have different layout sizes, or may have the same layout size. Memory DRAM1 includes memory array MA and data bus DB.

The power supply circuit PCA of memory DRAM2 includes a power supply control circuit 110*b* corresponding to second power supply control circuit 10*b*, a power supply control circuit 110*c* corresponding to third power supply control circuit 10*c* and an active unit group AUGc. Active unit group AUGc includes active units for the Vpp pumps, active down converters and decouple capacitances, respectively. These active units in active unit group AUGc may have different sizes depending on the kinds, or may have the same size regardless of the kinds. In this active unit group AUGc, the decouple capacitances each having the fixed form of unit (cell) are arranged.

Power supply control circuit 110*b* includes a VBB generating circuit 112 generating negative voltage VBB, and a Vpp circuit 120 including a Vpp pump generating boosted voltage VPP and a circuit generating a clock signal for driving the Vpp pump.

Power supply control circuit 110*c* includes a circuit generating intermediate voltages VBL and VCP, a circuit generating the array activating signal, and a standby down converter for generating array power supply voltage VCCS during standby.

Power supply circuit PC of DRAM1 transmits reference voltage VrefS and bias voltage BIASL to power supply circuit PCA of memory DRAM2 via a reference voltage transmission line 105. Thus, memories DRAM1 and DRAM2 commonly use the reference voltage generating circuit generating reference voltage VrefS and bias voltage BIASL.

In semiconductor integrated circuit device such as a system LSI, a plurality of memories (DRAMs) having different array capacities may be disposed. Each of DRAMs in such a structure has a small storage capacity in many cases in view of a restriction on the total chip size. Even with the storage capacities of the memories reduced, the power supply circuit, particularly the power supply control circuit cannot be reduced at all. This forms a cause of impeding reduction in area of the DRAM macro. This is because the power supply control circuit is configured fixedly into a unit (cell) regardless of the magnitude of storage capacity of the memory (see first embodiment).

Accordingly, a plurality of memories share the circuits which in turn operate in response to power-on and thereafter always operate without being controlled by internal or external signals. Thus, reference voltage generating circuit 1 continues to operate for generating reference voltage VrefS and bias voltage BIASL after power-on. Accordingly, the output voltage of reference voltage generating circuit 1 is commonly used by memories DRAM1 and DRAM2.

Reference voltage transmission line 105 transmitting reference voltage VrefS and bias voltage BIASL extend in a long distance over the chip. Therefore, it must be electrostatically shielded for against noise protection by arranging stable power supply lines such as ground lines on both sides of reference voltage transmission line 105.

According to the eighth embodiment of the invention, as described above, the semiconductor integrated circuit device including a plurality of memories arranged on the same chip is configured to share a continuously operating circuit in the power supply circuit commonly by the plurality of memories. Therefore, the area of the power supply circuit can be reduced.

Other Examples of Application

In the above description, the DRAM macro is assembled together with a logic in a mixed fashion. However, the invention can be applied also to the structure, in which DRAM (Dynamic Random Access Memory) is solely used.

The invention can be applied to various kinds of memories, provided that the memory includes a power supply circuit generating internal down-converted and/or boosted voltage.

According to the invention, as described above, the circuit supplying a large current is configured into an active unit in the form of cell, and the power supply line and the signal line required for this active unit are arranged in advance. Therefore, by changing only the arrangement of the active units or changing the number of employed active units, power supply circuits having various capabilities can be easily implemented. Even when the floor plan is changed in accordance with the storage capacity of a memory, no change is required for the power supply control circuits having small noise resistances because the power supply control circuits are standardized. Therefore, the power supply structure which is stable and optimum in view of the storage capacity or operation characteristics can be easily implemented within a short period only by adjusting the active units.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   internal circuitry for performing a predetermined function; and
   power supply circuitry having a capability of supplying, to said internal circuitry, a current consumed by said internal circuitry when said internal circuitry is active, and supplying at least one kind of a predetermined voltage to said internal circuit, said power supply circuitry including an individual voltage supplying circuitry for supplying said one kind of a predetermined voltage constructed of active units of a number corresponding to the current consumption capability of said internal circuitry, each of the active units having a layout made to have a predetermined current supply capability and configured into a cell in advance.

2. The semiconductor integrated circuit device according to claim 1, wherein
   said internal circuitry includes a plurality of memory cells each storing information; and
   said power supply circuitry further includes a substrate bias generating circuit set and configured to have a fixed charge supply capability regardless of change in structure of said internal circuitry, for applying a bias voltage to a substrate region for forming said plurality of memory cells thereon.

3. The semiconductor integrated circuit device according to claim 1, wherein
   said internal circuitry includes a plurality of memory cells arranged in rows and columns with each memory cell storing information, and a row select circuit for driving an addressed memory cell row to a selected state; and
   said power supply circuitry generates a voltage transmitted by said row select circuit to the addressed memory cell row.

4. The semiconductor integrated circuit device according to claim 1, wherein
   said active units are arranged in a first region; and
   said power supply circuitry further includes a control circuit arranged in a region other than said first region for controlling an operation of said active units.

5. The semiconductor integrated circuit device according to claim 4, wherein
   said first region extends in a first direction; and
   said semiconductor integrated circuit device further comprises a control signal line for transmitting at least a control signal from said control circuit, said control signal line including a first interconnection portion arranged outside said first region, and a second interconnection portion arranged extending in said first direction on said first region.

6. The semiconductor integrated circuit device according to claim 1, wherein
   said power supply circuit includes:
   an oscillator for generating an oscillation signal of a predetermined period;
   a frequency-divider having a variable frequency-division ratio for frequency-dividing the oscillation signal from said oscillator by a set frequency-division ratio; and
   a charge pump circuit for producing said predetermined voltage through charge pump operation in accordance with an output signal of said frequency-divider.

7. The semiconductor integrated circuit device according to claim 6, wherein
   said charge pump circuit is configured into a cell as the active unit.

8. The semiconductor integrated circuit device according to claim 1, further comprising a pad band including a plurality of pads arranged aligned to each other, wherein
   said internal circuitry includes a memory array having a plurality of memory cells, and said power supply circuitry is arranged between said memory array and said pad band.

9. The semiconductor integrated circuit device according to claim 1, wherein
said power supply circuitry includes multiple kinds of active units generating voltages for different applications as said active units, and said multiple kinds of active units have a common power supply interconnection layout.

10. The semiconductor integrated circuit device according to claim 1, wherein
said power supply circuitry includes multiple kinds of active units producing, as said predetermined voltage, voltages for different applications, and
different kinds of active units among said multiple kinds of active units have different power supply interconnection layouts.

11. The semiconductor integrated circuit device according to claim 1, wherein
said power supply circuitry further includes a unit forming a decouple capacitance for stabilizing said predetermined voltage.

12. The semiconductor integrated circuit device according to claim 1, wherein
said power supply circuitry includes multiple kinds of active units as said active units, each of said multiple kinds of active units includes at least an input signal line for operation control, and each of said multiple kinds of active units has a made-common layout with respect to said input signal line.

13. The semiconductor integrated circuit device according to claim 1, wherein
said power supply circuitry includes multiple kinds of active units generating voltages for different applications as said active units, and said multiple kinds of active units have a same layout size.

14. The semiconductor integrated circuit device according to claim 1, wherein
said active units include multiple kinds of active units having different layout sizes and generating voltages for different applications.

15. The semiconductor integrated circuit device according to claim 1, wherein
said power supply circuitry includes, as said active units, an internal down converting circuit for lowering an external power supply voltage to produce an internal power supply voltage; and
an active unit of said internal down converting includes an external power supply line coupled to a pad receiving said external power supply voltage, and extending in one direction for transmitting said external power supply voltage, and an internal power supply line facing to said external power supply line and extending in said one direction for transmitting said internal power supply voltage.

16. The semiconductor integrated circuit device according to claim 1, further comprising:
a decouple capacitance disposed between said internal circuitry and said power supply circuitry for stabilizing said predetermined voltage.

17. The semiconductor integrated circuit device according to claim 16, wherein
a predetermined voltage line transmitting the predetermined voltage supplied from said power supply circuitry is coupled, in a region for arranging of said decouple capacitance to an internal voltage line for transmitting said predetermined voltage to said internal circuitry.

18. The semiconductor integrated circuit device according to claim 1, further comprising:
a decouple capacitance arranged opposed to said power supply circuitry with respect to said internal circuitry for stabilizing said predetermined voltage, said predetermined voltage being transmitted via a voltage line extending over said internal circuitry.

19. The semiconductor integrated circuit device according to claim 1, wherein
said internal circuitry includes first and second circuits arranged spaced from each other; and
said semiconductor integrated circuit device further comprises a decouple capacitance arranged in a region between said first and second circuits for stabilizing said predetermined voltage.

20. The semiconductor integrated circuit device according to claim 1, wherein
said internal circuitry has a plurality of function circuits operating independently of each other and arranged spaced from each other; and
said power supply circuitry includes:
a reference voltage generating circuit arranged near a specific function circuit among said plurality of function circuits, for generating a reference voltage, and
circuits arranged corresponding to said plurality of function circuits and located near corresponding function circuits, respectively, for generating said predetermined voltage by utilizing the reference voltage generated from said reference voltage generating circuit, said predetermined voltage generating circuit including the active unit.

* * * * *

UNITED STATES PATENT AND TRADEMARK OFFICE
CERTIFICATE OF CORRECTION

PATENT NO.    : 6,519,191 B1
DATED         : February 11, 2003
INVENTOR(S)   : Fukashi Morishita It is certified that error appears in the above-identified patent and that said Letters Patent is hereby corrected as shown below:

<u>Title page, Item [54] and Column 1, line 3,</u>
Change the word "GENERATION" to -- GENERATING --

Signed and Sealed this

First Day of July, 2003

JAMES E. ROGAN
*Director of the United States Patent and Trademark Office*